US009171851B2

(12) United States Patent
Matichuk et al.

(10) Patent No.: US 9,171,851 B2
(45) Date of Patent: Oct. 27, 2015

(54) ONE CLICK WEB RECORDS

(75) Inventors: Chris E Matichuk, San Jose, CA (US); Scott A Rosenberg, Somerville, MA (US)

(73) Assignee: The DIRECTV Group, Inc., El Segundo, CA (US)

( * ) Notice: Subject to any disclaimer, the term of this patent is extended or adjusted under 35 U.S.C. 154(b) by 3090 days.

(21) Appl. No.: 09/972,424

(22) Filed: Oct. 4, 2001

(65) Prior Publication Data

US 2002/0087661 A1  Jul. 4, 2002

Related U.S. Application Data

(63) Continuation-in-part of application No. 09/925,120, filed on Aug. 8, 2001, now Pat. No. 8,949,374, and a continuation-in-part of application No. 09/925,109, filed on Aug. 8, 2001, now Pat. No. 7,917,602, and a continuation-in-part of application No. 09/925,121, filed on Aug. 8, 2001, now abandoned.

(60) Provisional application No. 60/223,856, filed on Aug. 8, 2000, provisional application No. 60/248,313, filed on Nov. 14, 2000, provisional application No. 60/258,937, filed on Dec. 29, 2000, provisional application No. 60/258,940, filed on Dec. 29, 2000, provisional application No. 60/258,749, filed on Dec. 29, 2000.

(51) Int. Cl.
*G06F 15/16* (2006.01)
*H04N 5/765* (2006.01)
(Continued)

(52) U.S. Cl.
CPC ............ *H01L 27/11521* (2013.01); *B60P 3/34* (2013.01); *G11B 19/02* (2013.01); *H01L 27/115* (2013.01); *H04N 5/44543* (2013.01); *H04N 5/76* (2013.01); *H04N 5/781* (2013.01); *H04N 5/782* (2013.01); *H04N 7/162* (2013.01); *H04N 7/173* (2013.01); *H04N 21/00* (2013.01); *H04N 21/2547* (2013.01); *H04N 21/25875* (2013.01); *H04N 21/40* (2013.01); *H04N 21/4147* (2013.01); *H04N 21/4227* (2013.01); *H04N 21/4334* (2013.01); *H04N 21/4345* (2013.01); *H04N 21/4431* (2013.01);
(Continued)

(58) Field of Classification Search
USPC ............................................. 709/218
See application file for complete search history.

(56) References Cited

U.S. PATENT DOCUMENTS

| 4,485,219 A | 11/1984 | Falk et al. |
| 5,333,091 A | 7/1994 | Iggulden et al. ............. 360/14.1 |

(Continued)

FOREIGN PATENT DOCUMENTS

| AU | 694568 | 3/1996 | ............... H04N 5/76 |
| EP | 0 838 768 A2 | 4/1998 | |

(Continued)

OTHER PUBLICATIONS

J. Morris, J. Taylor, ZDNET Reviews, Online!, "Hits & Hype", Aug. 7, 2000, XP002197808 [online], [retrieved on Apr. 29, 2002], Retrieved from the Internet: <URL:http://www.zdnet.com>.
Gotuit Video Slide Show, http://www.gotuit.com/slides/slide1.htm., printed Jun. 13, 2002.

(Continued)

*Primary Examiner* — Azizul Choudhury
(74) *Attorney, Agent, or Firm* — McDonnell Boehnen Hulbert & Berghoff LLP

(57) ABSTRACT

A method, system, computer medium, and other embodiments for integrating unrelated web services with stand-alone media-based devices are provided. Users can access and control the media-based device conveniently with a web-browser through various portals on the Internet. In an embodiment directed to a single web session, users program the media-based device by clicking on one or more hyperlinks or hypertexts in the form of advertisements of upcoming broadcasts. The advertisements may be web-hosted or sponsored by web portals.

44 Claims, 39 Drawing Sheets

(51) Int. Cl.

| | | |
|---|---|---|
| H04N 5/935 | (2006.01) | |
| H04N 5/932 | (2006.01) | |
| H04N 5/76 | (2006.01) | |
| H01L 27/115 | (2006.01) | |
| H04N 21/40 | (2011.01) | |
| G11B 19/02 | (2006.01) | |
| H04N 21/00 | (2011.01) | |
| H04N 5/781 | (2006.01) | |
| B60P 3/34 | (2006.01) | |
| H04N 5/445 | (2011.01) | |
| H04N 5/782 | (2006.01) | |
| H04N 7/16 | (2011.01) | |
| H04N 7/173 | (2011.01) | |
| H04N 21/2547 | (2011.01) | |
| H04N 21/258 | (2011.01) | |
| H04N 21/4147 | (2011.01) | |
| H04N 21/4227 | (2011.01) | |
| H04N 21/433 | (2011.01) | |
| H04N 21/434 | (2011.01) | |
| H04N 21/443 | (2011.01) | |
| H04N 21/462 | (2011.01) | |
| H04N 21/472 | (2011.01) | |
| H04N 21/475 | (2011.01) | |
| H04N 21/4782 | (2011.01) | |
| H04N 21/61 | (2011.01) | |
| H04N 21/81 | (2011.01) | |
| H04N 21/84 | (2011.01) | |
| H04N 21/858 | (2011.01) | |
| H04N 5/44 | (2011.01) | |

(52) U.S. Cl.
CPC ...... *H04N 21/4622* (2013.01); *H04N 21/4753* (2013.01); *H04N 21/4782* (2013.01); *H04N 21/47214* (2013.01); *H04N 21/6125* (2013.01); *H04N 21/812* (2013.01); *H04N 21/84* (2013.01); *H04N 21/8583* (2013.01); *H04N 21/8586* (2013.01); *H04N 5/4401* (2013.01)

(56) References Cited

U.S. PATENT DOCUMENTS

| | | | |
|---|---|---|---|
| 5,455,630 A | 10/1995 | McFarland et al. | 348/476 |
| 5,485,219 A | 1/1996 | Woo | |
| 5,532,735 A | 7/1996 | Blahut et al. | |
| 5,692,093 A | 11/1997 | Iggulden et al. | 386/46 |
| 5,696,866 A | 12/1997 | Iggulden et al. | 386/46 |
| 5,724,472 A | 3/1998 | Abecassis | |
| 5,749,072 A | 5/1998 | Mazurkiewicz et al. | |
| 5,793,866 A | 8/1998 | Brown et al. | |
| 5,892,536 A | 4/1999 | Logan et al. | |
| 5,940,073 A * | 8/1999 | Klosterman et al. | 715/721 |
| 5,956,487 A | 9/1999 | Venkatraman et al. | |
| 5,986,692 A | 11/1999 | Logan et al. | |
| 5,987,210 A | 11/1999 | Iggulden et al. | 386/46 |
| 5,999,688 A | 12/1999 | Iggulden et al. | 386/46 |
| 6,011,537 A * | 1/2000 | Slotznick | 715/733 |
| 6,085,227 A | 7/2000 | Edlund et al. | |
| 6,145,001 A | 11/2000 | Scholl et al. | |
| 6,154,771 A * | 11/2000 | Rangan et al. | 709/217 |
| 6,163,316 A * | 12/2000 | Killian | 715/721 |
| 6,166,730 A * | 12/2000 | Goode et al. | 715/716 |
| 6,177,931 B1 * | 1/2001 | Alexander et al. | 725/52 |
| 6,215,526 B1 | 4/2001 | Barton et al. | 348/473 |
| 6,226,444 B1 | 5/2001 | Goldschmidt Iki et al. | |
| 6,233,389 B1 | 5/2001 | Barton et al. | 386/46 |
| 6,268,849 B1 * | 7/2001 | Boyer et al. | 725/40 |
| 6,308,205 B1 | 10/2001 | Carcerano et al. | |
| 6,310,886 B1 | 10/2001 | Barton | 370/462 |
| 6,327,418 B1 | 12/2001 | Barton | 386/46 |
| 6,338,094 B1 * | 1/2002 | Scott et al. | 709/245 |
| 6,381,637 B1 * | 4/2002 | Kamada | 709/218 |
| 6,434,447 B1 | 8/2002 | Shteyn | |
| 6,442,328 B1 * | 8/2002 | Elliott et al. | 386/230 |
| 6,587,125 B1 | 7/2003 | Paroz | |
| 6,611,654 B1 | 8/2003 | Shteyn | |
| 6,618,764 B1 | 9/2003 | Shteyn | |
| 6,732,158 B1 | 5/2004 | Hesselink et al. | |
| 6,785,716 B1 | 8/2004 | Nobakht | |
| 6,813,639 B2 | 11/2004 | Nobakht et al. | |
| 6,871,318 B1 | 3/2005 | Wynblatt et al. | |
| 6,898,709 B1 | 5/2005 | Teppler | |
| 6,912,691 B1 | 6/2005 | Dodrill et al. | |
| 6,925,469 B2 | 8/2005 | Headings et al. | |
| 6,944,584 B1 | 9/2005 | Tenney et al. | |
| 6,968,364 B1 | 11/2005 | Wong et al. | |
| 7,031,596 B2 * | 4/2006 | Sai et al. | 386/241 |
| 7,043,433 B2 * | 5/2006 | Hejna, Jr. | 704/270 |
| 7,046,161 B2 | 5/2006 | Hayes | |
| 7,055,148 B2 | 5/2006 | Marsh et al. | |
| 7,065,250 B1 | 6/2006 | Lennon | |
| 7,124,356 B1 | 10/2006 | Alsafadi et al. | |
| 7,143,353 B2 | 11/2006 | McGee et al. | |
| 7,386,599 B1 | 6/2008 | Piersol et al. | |
| 7,634,787 B1 | 12/2009 | Gebhardt et al. | |
| 7,636,511 B2 | 12/2009 | Ng | |
| 7,673,315 B1 | 3/2010 | Wong et al. | |
| 7,706,838 B2 | 4/2010 | Atsmon et al. | |
| 8,116,611 B2 * | 2/2012 | Bumgardner et al. | 386/292 |
| 2001/0001160 A1 | 5/2001 | Shoff et al. | |
| 2001/0014891 A1 | 8/2001 | Hoffert et al. | |
| 2001/0031997 A1 | 10/2001 | Lee | |
| 2001/0038392 A1 | 11/2001 | Humpleman et al. | |
| 2001/0046366 A1 | 11/2001 | Susskind | |
| 2002/0040475 A1 * | 4/2002 | Yap et al. | 725/39 |
| 2002/0046083 A1 | 4/2002 | Ondeck | |
| 2002/0046407 A1 * | 4/2002 | Franco | 725/110 |
| 2002/0054068 A1 * | 5/2002 | Ellis et al. | 345/716 |
| 2002/0060750 A1 | 5/2002 | Istvan et al. | |
| 2002/0065678 A1 | 5/2002 | Peliotis et al. | |
| 2002/0104086 A1 | 8/2002 | Tomsen et al. | |
| 2002/0143886 A1 | 10/2002 | Camens | |
| 2002/0152311 A1 | 10/2002 | Veltman et al. | |
| 2003/0001883 A1 | 1/2003 | Wang | |
| 2003/0093790 A1 | 5/2003 | Logan et al. | |
| 2003/0095791 A1 | 5/2003 | Barton et al. | |
| 2003/0126598 A1 | 7/2003 | Agnihotri et al. | |
| 2003/0167473 A1 | 9/2003 | Klosterman et al. | |
| 2003/0217360 A1 | 11/2003 | Gordon et al. | |
| 2004/0006620 A1 | 1/2004 | Howard et al. | |
| 2004/0031856 A1 | 2/2004 | Atsmon et al. | |
| 2004/0045020 A1 | 3/2004 | Witt et al. | |
| 2004/0117831 A1 | 6/2004 | Ellis et al. | |
| 2006/0020783 A1 | 1/2006 | Fisher | |
| 2006/0064716 A1 | 3/2006 | Sull | |
| 2006/0277314 A1 | 12/2006 | Hesselink | |
| 2007/0240181 A1 | 10/2007 | Eldering et al. | |
| 2010/0064227 A1 | 3/2010 | Humpleman et al. | |
| 2011/0126258 A1 * | 5/2011 | Emerson et al. | 725/133 |
| 2011/0158610 A1 * | 6/2011 | Paul et al. | 386/297 |
| 2011/0162009 A1 * | 6/2011 | Adimatyam et al. | 725/40 |

FOREIGN PATENT DOCUMENTS

| | | | |
|---|---|---|---|
| EP | 0 854 645 A2 | 7/1998 | |
| EP | 0 693 215 B1 | 11/1998 | G11B 27/02 |
| WO | WO 97/13368 | 4/1997 | |
| WO | WO 98/10589 | 3/1998 | |
| WO | 99/52279 A1 | 10/1999 | H04N 5/775 |
| WO | 00/07368 A1 | 2/2000 | H04N 5/775 |
| WO | 00/18108 A2 | 3/2000 | |
| WO | 00/18108 A3 | 3/2000 | H04L 12/64 |
| WO | 00/28736 A1 | 5/2000 | H04N 7/025 |
| WO | WO 00/28733 | 5/2000 | |
| WO | 00/58833 A1 | 10/2000 | G06F 11/14 |
| WO | 00/58834 A1 | 10/2000 | G06F 11/14 |
| WO | 00/58967 A1 | 10/2000 | G11B 27/10 |
| WO | 00/59214 A1 | 10/2000 | H04N 5/445 |
| WO | 00/62298 A1 | 10/2000 | G11B 27/10 |
| WO | 00/62299 A1 | 10/2000 | G11B 27/34 |

(56) References Cited

FOREIGN PATENT DOCUMENTS

| WO | 00/62533 | A1 | 10/2000 | ............ H04N 5/445 |
|---|---|---|---|---|
| WO | 00/67475 | A1 | 11/2000 | ............ H04N 5/445 |
| WO | 01/06370 | A1 | 1/2001 | ............ G06F 11/267 |
| WO | 01/22729 | A1 | 3/2001 | ............... H04N 5/92 |
| WO | 01/46843 | A2 | 6/2001 | ............ G06F 17/00 |
| WO | 01/47238 | A2 | 6/2001 | |
| WO | 01/47249 | A2 | 6/2001 | ............... H04N 5/00 |
| WO | 01/47279 | A2 | 6/2001 | ............... H04N 7/26 |
| WO | 01/65762 | A2 | 9/2001 | ............ H04L 9/00 |
| WO | 01/65862 | A2 | 9/2001 | ............ H04N 71/73 |
| WO | 01/89203 | A2 | 11/2001 | ............... H04N 5/00 |
| WO | 02/13526 | | 2/2002 | |
| WO | 02/13527 | | 2/2002 | |
| WO | 02/13528 | | 2/2002 | |

OTHER PUBLICATIONS

International Search Report, PCT/US04/08632, dated May 15, 2007.
International Search Report and Written Opinion, PCT/US04/08891, dated Jul. 25, 2008.
J. Davis, "Replay, Amazon Team on Digital Video Recorder," Nov. 2, 1999, CNET News.com, 3 pages.
International Search Report for PCT/US01/24883, mailed May 15, 2002.
International Search Report for PCT/US01/24895, mailed May 15, 2002.
International Search Report for PCT/US01/24930, mailed May 15, 2002.
S. Miles, "TiVo Files for IPO, Teams with Sony," Sep. 8, 1999, CNET News.com, 2 pages.

* cited by examiner

| API Routine | Function |
|---|---|
| CreateAccount | Creates an account for a new user based on the information received |
| Login | Tries to authenticate a user based on the input username and password combination |
| GetProfile | Returns the profile of the user and his units based on his userid |
| AddRequest | Adds a request to the unit's list of pending requests based on a set of request parameters, and returns the full status of the unit and of the pending requests, including those for recording specific show(s) and deleting recorded show(s) |
| DeleteRequest | Delete a request from the user list of pending requests |
| GetReplayGuide | Returns the Replay Guide of the unit as saved in the appropriate database for the specified unit |
| GetChannelLineUp | Returns the channel lineup of the unit based on the unit's settings |
| ChangePassword | Lets the user change his password |
| GetEPG | Returns the current electronic program guide for the unit based on the settings of the unit |
| ShowGuide | Returns detailed information about a specified show or search show details for particular shows based on criteria given as parameters |

FIG. 14

| API Routine | Input Parameters | Output Files (Corresponding XML Elements) |
|---|---|---|
| CreateAccount | firstname, lastname, address1, address2, city, state, zipcode, serial number, login, password, creator | ACCOUNT.XML<br>REPLAYERROR.XML |
| Login | login, password | ACCOUNT.XML<br>REPLAYERROR.XML |
| GetProfile | userid | PROFILE.XML (USERINFO, UNITINFO-l)<br>REPLAYERROR.XML |
| AddRequest | userid, unitid, reqtype(none, show, theme, update)<br>reqtype=show: showtime(single, repeat, manual single, manual repeat), headendid, tmsid, device, starttimegmt, name, durationinminutes, inputsource, quality, guaranteedrecord, numepisodes, weekdayflags, earlystartminutes, showguarminutes<br>reqtyp=theme: searchterm, searchflags, suzukiid, durationinminutes, quality, guaranteedrecord<br>reqtype=update: updatetype(deleteshow, preserveshow, deletechannel), channelid, showid | UNITSTATUS.XML (UNITINFO, REQUESTSTATUS-l)<br>REPLAYERROR.XML<br>*Note: REQUESTSTATUS Result:=(PENDING, SENT, SUCCESS, GENERAL FAILURE, SCHEDULEFAILURE, ROOMFAILURE) |
| DeleteRequest | userid, unitid, requestid | DELETERESULT.XML, REPLAYERROR.XML |
| GetReplayGuide | userid, unitid | GUIDE.XML (REPLAYCHANNEL-l), REPLAYERROR.XML<br>*Note: REPLAYCHANNEL Type:=(SINGLE, SINGLEMANUAL, REPEAT, REPEATMANUAL, THEME, THEMEEXACT, ZONE) |
| GetChannelLineUp | userid, unitid | CHANNELLINEUP.XML (CHANNEL-l), REPLAYERROR.XML |
| ChangePassword | userid, currentpassword, newpassword | ACCOUNT.XML, REPLAYERROR.XML |
| GetEPG | userid, unitid, starttimegmt, durationinminutes, startchannel, channelcount | XML file based on tvguide.dtd & tvprograms.dtd<br>REPLAYERROR.XML |
| ShowGuide | userid, unitid, query, start, count, levelofdetail<br>*Note: query keywords include actor, advisory, desc, mpaarating, title, etc. | XML file based on tvguide.dtd & tvprograms.dtd<br>REPLAYERROR.XML |

FIG. 15 my (r) replaytv®

[Preferences] [Help] [Logout]

Replay Guide — 350

| Channel Guide | Replay Guide | Find Shows | Manual Record |

Replay Shows | Replay Channels

Review and edit your one time and recurring ReplayTV requests

[Delete Selected Channels]

| Channel | Details | Status | Request Date |
|---|---|---|---|
| ☐ A Fistful of Dollars | This single record Replay channel was scheduled to record A Fistful of Dollars from Channel 21 (TBS) on Sun, 02/18 at or around 7:00AM - 9:00AM. Guaranteed at EXTENDED quality. Nothing else is scheduled to record. | | 02/18 |
| ☐ Blown Away | This single record Replay channel was scheduled to record Blown Away from Channel 42 (USAP) on Tue, 01/16 at or around 9:00PM - 11:30PM. Guaranteed at EXTENDED quality. Nothing else is scheduled to record. | | 01/16 |
| ☐ Cantonese News | This show-based Replay channel will continuously record the 1 most current episode(s) of Cantonese News occurring every (Sun, Mon, Tue, Wed, Thu, Fri, Sat) on Channel 8 (KTSF) at or around 8:00PM - 9:00PM. Guaranteed at EXTENDED quality. | | 02/28 |
| ☐ Captain January | This single record Replay channel was scheduled to record Captain January from Channel 49 (AMC) on Tue, 01/09 at or around 3:30AM - 5:00AM. Guaranteed at EXTENDED quality. Nothing else is scheduled to record. | | 01/09 |

FIG. 19A my ⓡ replaytv®

| Channel Guide | Replay Guide | Find Shows | Preferences | Help | Logout |

Find Shows | Manual Record

Find: [            ]

*Enter the word or phrase that you wish to find.*

In these categories:
- ☑ Show Titles  ☐ Actors
- ☑ Descriptions  ☐ Directors

[ Find Shows ]

Copyright Policy | Terms And Conditions | Privacy Policy | FAQ

FIG. 22

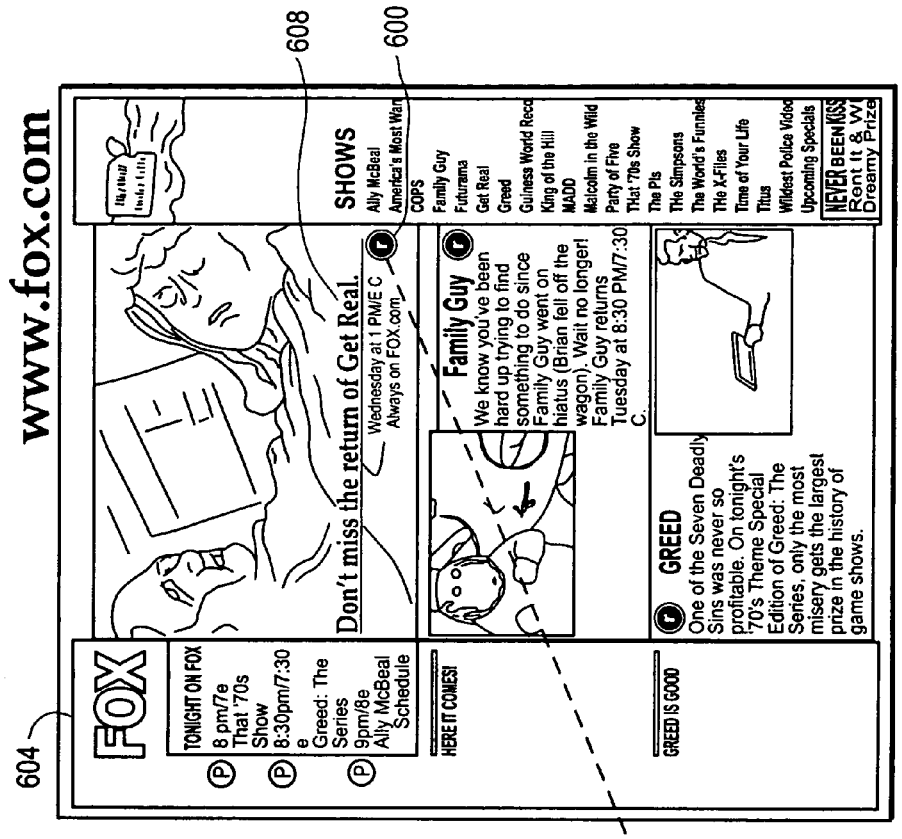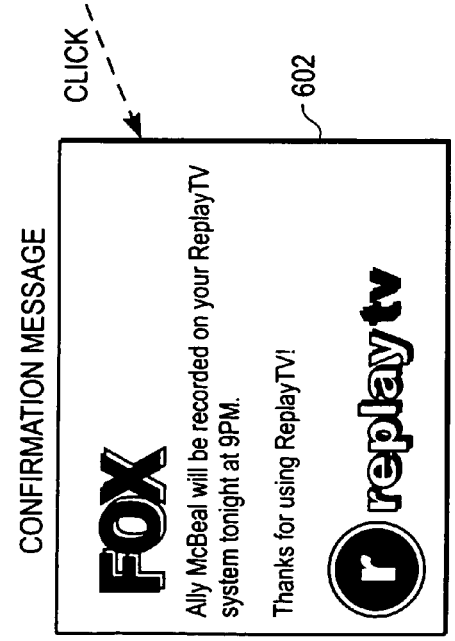
FIG. 32

ONE CLICK WEB RECORDS

CROSS-REFERENCE TO RELATED APPLICATIONS

This application claims priority under 35 U.S.C. §119(e) to U.S. Provisional Patent Application No. 60/258,749, entitled "One-Click Web Records," filed Dec. 29, 2000, by Scott Rosenberg, the subject matter of which is incorporated by reference in its entirety herein.

This application is a continuation in part of co-pending non-provisional U.S. patent application Ser. No. 09/925,120, by Millard E. Sweatt, III, et al., entitled "Method and System for Remote Television Replay Control," filed on Aug. 8, 2001, which claims priority under 35 U.S.C. §119(e) to: (1) U.S. Provisional Application No. 60/223,856, filed on Aug. 8, 2000 by Jeff Hastings, et al., entitled "Method and System for Remote Television Replay Control"; (2) U.S. Provisional Application No. 60/248,313, filed on Nov. 14, 2000, by Jeff Hastings, et al., entitled "Method and System for Remote Television Replay Control"; (3) U.S. Provisional Application No. 60/258,937, filed on Dec. 29, 2000, by Phillipe Pignon, entitled "Method and System for Remote Television Replay Control"; and (4) U.S. Provisional Application No. 60/258,940, filed on Dec. 29, 2000, by Millard E. Sweatt, III, entitled "Recording Television Programming via Remote Control". The subject matter of U.S. patent application Ser. No. 09/925,120, by Millard E. Sweatt, III, et al., entitled "Method and System for Remote Television Replay Control," is hereby incorporated by reference in its entirety. Also, the subject matter of U.S. Provisional Patent Application Nos. 60/223,856, 60/280,313, 60/258,937, and 60/258,940 are hereby incorporated by reference in their entirety.

This application is a continuation in part of co-pending non-provisional U.S. patent application Ser. No. 09/925,109, by Millard E. Sweatt, III, et al., entitled "Method and System for Remote Television Replay Control," filed on Aug. 8, 2001, which claims priority under 35 U.S.C. §119(e) to: (1) U.S. Provisional Application No. 60/223,856, filed on Aug. 8, 2000 by Jeff Hastings, et al., entitled "Method and System for Remote Television Replay Control"; (2) U.S. Provisional Application No. 60/248,313, filed on Nov. 14, 2000, by Jeff Hastings, et al., entitled "Method and System for Remote Television Replay Control"; (3) U.S. Provisional Application No. 60/258,937, filed on Dec. 29, 2000, by Philippe Pignon, entitled "Method and System for Remote Television Replay Control"; and (4) U.S. Provisional Application No. 60/258,940, filed on Dec. 29, 2000, by Millard E. Sweatt, III, entitled "Recording Television Programming via Remote Control". The subject matter of U.S. patent application Ser. No. 09/925,109, by Millard E. Sweatt, III, et al., entitled "Method and System for Remote Television Replay Control," is hereby incorporated by reference in its entirety.

This application is a continuation in part of co-pending non-provisional U.S. patent application Ser. No. 09/925,121, by Millard E. Sweatt, III, et al., entitled "Method and System for Remote Television Replay Control," filed on Aug. 8, 2001, which claims priority under 35 U.S.C. §119(e) to: (1) U.S. Provisional Application No. 60/223,856, filed on Aug. 8, 2000 by Jeff Hastings, et al., entitled "Method and System for Remote Television Replay Control"; (2) U.S. Provisional Application No. 60/248,313, filed on Nov. 14, 2000, by Jeff Hastings, et al., entitled "Method and System for Remote Television Replay Control"; (3) U.S. Provisional Application No. 60/258,937, filed on Dec. 29, 2000, by Phillipe Pignon, entitled "Method and System for Remote Television Replay Control"; and (4) U.S. Provisional Application No. 60/258,940, filed on Dec. 29, 2000, by Millard E. Sweatt, III, entitled "Recording Television Programming via Remote Control". The subject matter of U.S. patent application Ser. No. 09/925,121, by Millard E. Sweatt, III, et al., entitled "Method and System for Remote Television Replay Control," is hereby incorporated by reference in its entirety.

TECHNICAL FIELD

The present invention relates generally to enabling web users easy access and control of media-based devices and appliances over computer networks, and more specifically, to a method, system and computer medium for remote control of a digital video recorder from a client user interface both in communication with the Internet.

BACKGROUND OF THE INVENTION

Conventional techniques provide for control input of a media-based device or appliance either directly or with a short-ranged remote controller. For example, typically the media-based device may be directly programmed using the control panel disposed on the device itself or with a remote controller (i.e., typically handheld) in communication with the media-based device. The hand-held remote controller provides control input from short-ranged distances about the device usually by direct hardwired extension cable, or by some wireless medium, such as for example, infrared and radio frequency. While these conventional techniques work well for those situations where the user is physically located within the vicinity (e.g., typically in the same room as the media-based) of the device, they do not address the situation where the user is at a different physical location and is thereby unable to access the device at such short-ranges. Recent developments have been made to overcome the drawbacks associated with these conventional approaches by enabling the programming and control of media-based devices or appliances over a network, like the Internet. Access to the media-based devices and appliances over the Internet is beneficial because it is convenient and can scale easily to large numbers of media-based devices. However, the technology remains mutually exclusive with respect to those value-added services provided by ancillary parties to promote the content received by the media-based device. For example, one type of value-added service comprises television and cable programming advertisement for upcoming programs to be aired. The broadcast of such advertisements (ads) have traditionally remained under the control of the broadcasters of the content (e.g., cable programming broadcasters, television broadcasters). Advertisers would benefit if they could operate outside of the confines of the broadcasters, such as on the Internet, thereby generating increased reach to targeted audiences.

Advertisers have conventionally strived to ensure that the targeted audience is watching their advertisements. Television advertisers spend large amounts of money airing advertisements for upcoming television and cable broadcasts. With the popularity of the Internet increasing, advertisers have pursued the Internet as a medium in which to target their ads for the promotion of upcoming to-be-aired broadcasts, thereby expanding the traditional mediums of advertisement beyond paper program guides and on-air advertising. With the Internet, for example, when viewing a web page, a user enters a URL of the web page or clicks on a link to the web page. The web page itself is fetched from the web server, and the ad appears as content on the web page announcing the upcoming programming to be broadcast. To be effective, consumers who see these ads must take note and watch the upcoming broadcast. Those consumers who want to record the upcoming broadcast must either manually program their media-based device like a digital video recorder (i.e., personal video recorders) either directly or remotely online. The logistics of doing so are problematic because it is cumbersome for the consumer to have to recall the ad for the upcoming program to be aired and then take several steps to program the digital video recorder. It would be desirable if the ad on the website were associated with the consumer's digital video recorder, so that the user could automatically program the digital video recorder at the same time as of viewing the ad on the Internet.

Furthermore, the parties associated with facilitating the online advertisements of television programming and the online access and control of a digital video recorders are typically separate entities having revenue deriving models that conventionally are not well-integrated with each other. Television advertisers derive revenue from the subscriptions for advertisements promoting the upcoming programs to be broadcast. On the other hand, providers of services for accessing and controlling a digital video recorder on the Internet derive revenue through business models that measure the use of the online access or that apply a fixed fee for using the online services. It would be ideal if the two service providers could partner together to leverage revenue from Internet advertisements of television and cable programming and the online access to controlling a digital video recorder. It would be desirable if such partnering could generate ancillary revenue streams.

SUMMARY OF DESCRIBED EMBODIMENTS

The described embodiments of the present invention utilize the world wide web to overcome the limitations of the current state of the art concerning access and control of stand-alone media-based devices. Web users, content providers of the subject-matter being utilized with the media-based device, and web-hosted service providers who typically provide ancillary services, system administration and system maintenance of the media-based devices may benefit from the described embodiments of the present invention, which enables the integration of online Internet television advertising with the recording and programming of a user's digital video recorder. To this end, the described embodiments of the present invention are beneficial in creating a web application which may be offered to providers of Internet television advertising and to providers of online access and control of digital video recorders for enabling such existing services to be more effective to a consumer.

The described embodiments of the present invention comprise a method, system, computer medium, and other embodiments for integrating television and cable program advertising with the automatic programming of a digital video recorder in the same web session for which a user views the advertisement. The advertisements may be placed on a variety of portals on the Internet, wherein the advertisements include a hyperlink to the service provider for the online Internet access and control of the digital video recorder.

One technical aspect of the present invention enables users to program their digital video recorder in the same session when viewing an Internet ad for upcoming programs to be broadcasted. In a preferred embodiment, the programming of the digital video recorder is accomplished with one click of the advertisement hyperlink, a manner which is seamless and convenient to the user. For convenience, this aspect of the present invention shall be interchangeably referred to as the "one click web records" feature.

Another aspect of the present invention derives revenue through the one click web records feature for both service providers of the advertisements and of the online access of the digital video recorder.

According to yet another aspect of the present invention, information, that concern television programming advertisement and online access to control a digital video recorder, and that are provided from unrelated online sources, can be combined into an integrated presentation and presented to a user through a single web session. With the present invention, users can access and view the combined information through one web presentation, and select and manipulate particular information of interest. These otherwise unrelated and disparately-located sources of advertisements include, but are not limited to, hosted and online services concerning television, satellite-based, pay-per-view and cable-based television guide advertisements.

The described embodiments are implemented with a client/server architecture embodied in a computer-based communication system. By enabling access and control of the media-based device and appliance over the Internet, the described embodiments of the present invention provide users with a convenient and efficient manner for programming the media-based device and appliance. In one embodiment, the media-based device and appliance comprises an interactive television device in the nature of a digital video recorder (DVR), also known as a personal video recorder (PVR). By selecting an advertisement embodied as hyperlink or hypertext on a web page, a user can conveniently program the DVR with one click of a control input device (e.g., mouse, trackball). The world-wide appeal of the Internet coupled with the web application to control the DVR allow a scalable solution without the intensive high-end costs for tooling and manufacturing.

One technical advantage of the present invention is that it includes a computer-based communication system that is capable of: (1) extracting information from the stand-alone media-based device and appliance through a back end client-server subsystem; (2) extracting information from online and unrelated web hosted services through yet another server subsystem; (3) combining the extracted information from the various sources mentioned; (4) maintaining a local representation of the combined data on a database; (5) creating an integrated presentation based on combining the information extracted to simulate the operation of the media-based device in either a virtual or real-time manner; (6) allowing multiple portals to make requests to a front end subsystem and to receive the integrated presentation via an API (Application Program Interface); (7) transferring the integrated presentation to a client user interface; (8) accepting instructions from the client user interface in response to receiving the presentation in order to update the database and the media-based device and appliance; (9) combining the instructions received with further information obtained from the online and web-hosted services; and (10) updating the media-based device and appliance with the instructions and further information combined.

One aspect of the computer-based communication system of the present invention enables the communication between a network computing system, a network/media-based data integration system, and a media-based computing system. In order for the network computing system to communicate with the media-based computing system through the data integration system, a set of processes embodied in an API is provided. In one embodiment, the network computing system includes web-hosted services provided over the Internet, the web-hosted services being external to the data integration system. In the same embodiment, the standalone DVR is connected to a network in the media-based computing system. The API provided in the data integration system enables a flexible approach to allow various external web portals in the network computing system to communicate with the DVRs in the media-based computing system. Furthermore, the API enables clients on the network computing system to request and to obtain the integrated presentation at the client user interfaces in unique arrangements distinctive to the local environment of the web portal. Accordingly, the API exposes the integrated presentation to be utilized by a wide range of websites for millions of users in a simple and easily accessible manner. The API encapsulates a variety of functions that facilitate creating a user account, user login, user preferences, adding a request, obtaining programming guide information, finding television programs of interest, and others to be described more specifically herein.

In yet another technical aspect of the present invention, the media-based computing system enables the communication of requests, data and other control input information across various networks from a DVR. The DVR is also enabled to receive commands and to send out data and status information based on commands and data received across the various networks. In particular, the DVR is enabled to be programmed from an external source (e.g., preferably through a computer-based communication system having multiple web servers) in a uniform manner. That is, instead of a conventional hand-held remote controller and the control panel disposed on the DVR being the mechanisms used to program the DVR, an external source may be used to facilitate the programming.

The features and advantages described in this summary and the following detailed description are not all-inclusive, and particularly, many additional features and advantages will be apparent to one of ordinary skill in the art in view of the drawings, specification and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

BRIEF DESCRIPTION OF THE DRAWINGS

The teachings of the present invention can be readily understood by considering the following detailed description in conjunction with the accompanying drawings.

FIG. 14 is a chart listing the functions implemented on one embodiment of the API and the corresponding functions in accordance with the present invention.

FIG. 15 is a chart listing the functions implemented on one embodiment of the API and the corresponding input parameters and output files.

FIG. 19A is an exemplary graphical representation of a user interface for indicating the Replay Guide information organized by Replay Channels.

FIG. 22 is an exemplary graphical representation of a user interface for performing a search on the Find Shows page.

FIG. 32 is an exemplary graphical representation of a user interface for implementing the one click web records function in accordance with the present invention.

Figure 1A:
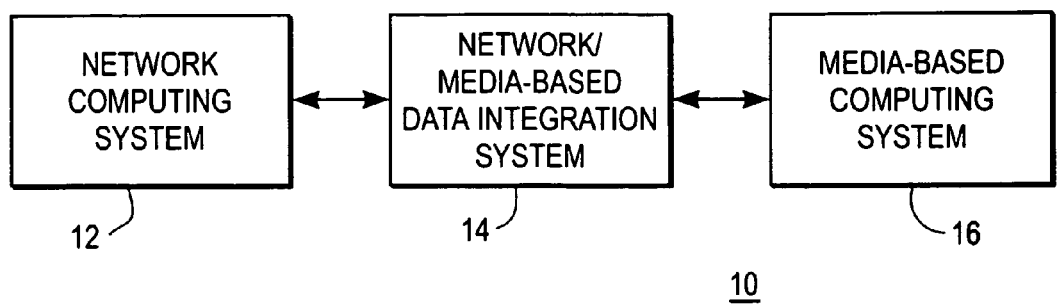
FIG. 1A is a high-level block diagram of a computer-based communications system that enables the remote control of media-based devices and appliances over a communication network in accordance with the present invention.

The figures depict a preferred embodiment of the present invention for purposes of illustration only. One skilled in the art will readily recognize from the following discussion that alternative embodiments of the structures and methods illustrated herein may be employed without departing from the principles of the invention described herein.

DETAILED DESCRIPTION OF EMBODIMENTS

Introduction

A system, method, computer medium and other embodiments for accessing, reviewing and providing selective control input over a computer-based communications system to media-based devices and appliances from client user interfaces are described. In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention with unnecessary details.

Reference in the specification to "one embodiment" or to "an embodiment" means that a particular feature, structure, or characteristic described in connection with the embodiments is included in at least one embodiment of the invention. The appearances of the phrase "in one embodiment" in various places in the specification are not necessarily all referring to the same embodiment.

Some portions of the detailed description that follows are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps (instructions) leading to a desired result. The steps are those requiring physical manipulations of physical quantities. Usually, though not necessarily, these quantities take the form of electrical, magnetic or optical signals capable of being stored, transferred, combined, compared and otherwise manipulated. It has proven convenient at times, principally for reasons of common usage, to refer to these signals as bits, values, elements, symbols, characters, terms, numbers, or the like. Furthermore, it has also proven convenient at times, to refer to certain arrangements of steps requiring physical manipulations of physical quantities as (modules) code devices, without loss of generality.

It should be borne in mind, however, that all of these and similar terms are to be associated with the appropriate physical quantities and are merely convenient labels applied to these quantities. Unless specifically stated and otherwise as apparent from the following discussion, it is appreciated that throughout the description, discussions utilizing terms such as "processing" or "computing" or "calculating" or determining" or "displaying" or the like, refer to the action and processes of a computer system, or similar electronic computing device, that manipulates and transforms data represented as physical (electronic) quantities within the computer system memories or registers or other such information storage, transmission or display devices.

One aspect of the present invention includes an embodiment of the process steps and instructions described herein in the form of a computer program. Alternatively, the process steps and instructions of the present invention could be embodied in firmware or hardware, and when embodied in software, could be downloaded to reside on and be operated from different platforms used by real time network operating systems and applications.

The present invention also relates to an apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each coupled to a computer system bus. Furthermore, the computers referred to in the specification may include a single processor or may be architectures employing multiple processor designs for increased computing capability.

The algorithms and displays presented herein are not inherently related to any particular computer or other apparatus. Various general-purpose systems may also be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the present invention as described herein, and any references below to specific languages are provided for disclosure of enablement and best mode of the present invention.

Moreover, the present invention is claimed below as operating on or working in conjunction with an information system. Such an information system as claimed may be the entire information system for providing remote control of a digital video recorder and other media-based devices and/or appliances from browser and user interface applications in communication with a network as detailed below in the described embodiments or only portions of such a system. For example, the present invention can operate with an information system that need only be a communications network in the simplest sense to facilitate the review of program data and selections existing at the media-based devices and appliances. At the other extreme, the present invention can operate with an information system that locates, extracts and stores data from a variety of unrelated data sources and integrates such data with user control input to program and update the media-based devices and appliances as detailed below in the described embodiments or only portions of such a system. Thus, the present invention is capable of operating with any information system from those with minimal functionality, to those providing all of the functionality disclosed herein.

System Overview

Reference will now be made in detail to several embodiments of the present invention, examples of which are illustrated in the accompanying drawings. Wherever practicable, the same reference numbers will be used throughout the drawings to refer to the same or like parts.

One aspect of the present invention addresses the situation where the media-based devices and appliances may not always be continuously connected to a network. To address this situation, all of the information, that is necessary for the replication of what a user would experience as if the media-based device acting as a stand-alone unit, is stored in a database. This information stored on the database, along with other sources of related information, allows the construction of an integrated presentation to be sent to a client user interface, like a browser, to simulate the operation of the media-based device functioning as if it were in a "live" (i.e., stand-alone) mode, that is, for viewing and control input. Accordingly, the present invention enables access to and control of the media-based device and/or appliance from a remote location and over a network whether or not the media-based device is participating in a communication session with a network in a peer-to-peer or periodic mode.

In one embodiment discussed below, when the media-based device and/or appliance periodically establishes a connection with a network and database, information is pushed and pulled between the client, database and media-based device in a "batched" processing mode. In this embodiment, the replication of data necessary to simulate using the media-based device at a client can be analogized to virtualizing the media-based device over a network.

With another embodiment discussed below, where the media based device establishes a peer-to-peer communication session with the client, the control input and update of the media-based device and/or appliance from a client is executed "on-the-fly", that is, in real time enabling near instantaneous results.

1. An Embodiment for Remote Control of Media-Based Devices and Appliances Through Batched Processing Referring now to the block diagram of FIG. 1A, there is shown an example of a computer-based communications system 10 that enables the remote control of media-based devices and appliances over a communication network in accordance with the present invention. In the example of FIG. 1A, communications system 10 includes a network computing system 12 coupled to a network/media-based data integration system 14 (henceforth "integration system 14"), which in turn, is communicatively coupled to a media-based computing system 16. The network computing system 12 enables multiple users to communicate over a communications system 10 in order to access and control the media-based devices and appliances of media-based computing system 16 from a remote location. Media-based computing system 16 enables the media-based devices and appliances to be accessed through a network system, thereby further enhancing stand-alone capabilities of the devices and appliances. Integration system 14 provides the interface between the different networks where users and media-based devices may be in communication, and additionally provides a centralized repository for capturing, combining and integrating data from multiple sources of data and for providing the data captured to the client user interfaces and the media-based devices.

Figure 2:
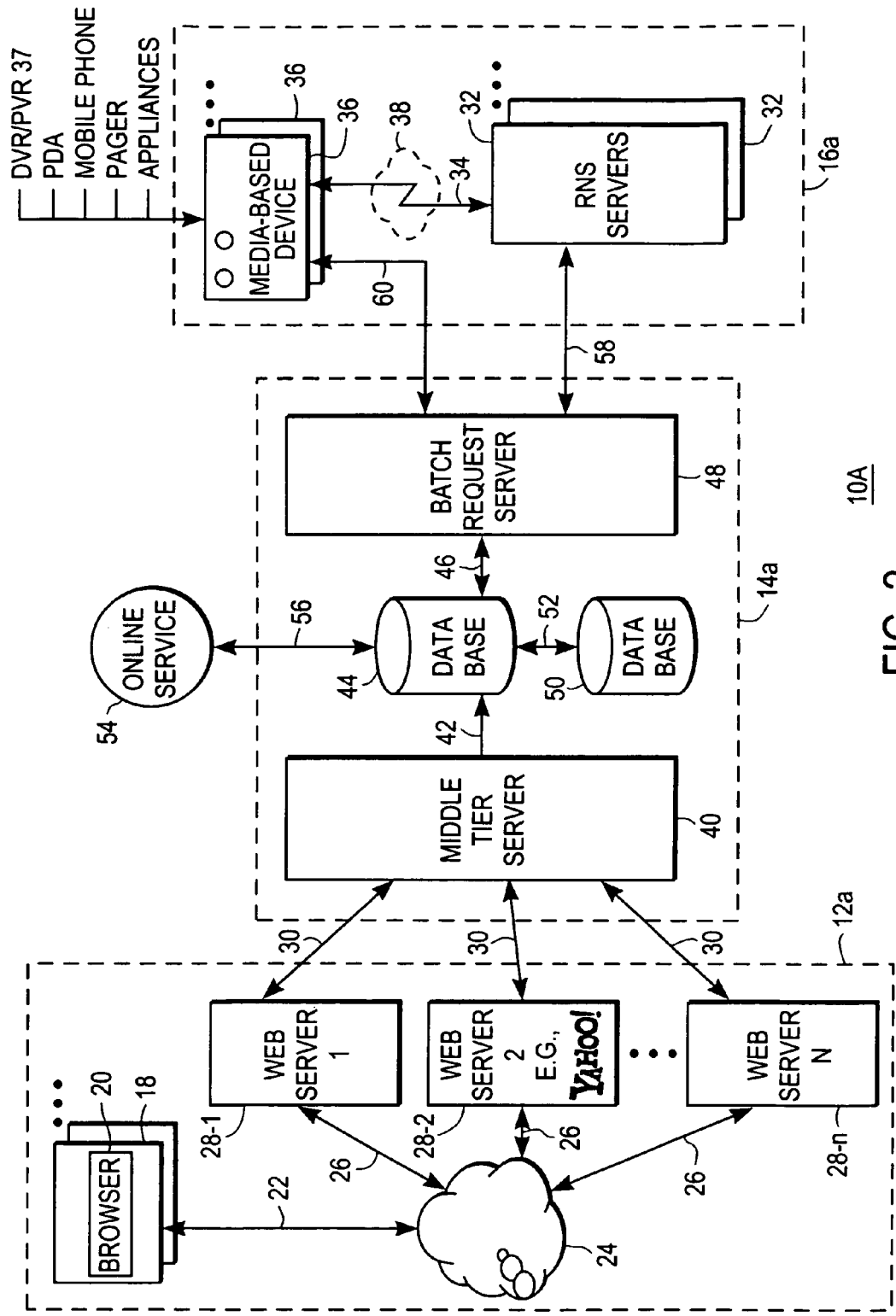
FIG. 2 is a block diagram showing a first embodiment of the computer-based communications system of FIG. 1A in accordance with the present invention.

FIG. 2 shows a block diagram of one embodiment of a communications system 10A having further details of the communications system 10 of FIG. 1A. In the embodiment shown in FIG. 2, communications system 10A includes a network computing system 12a coupled to a network/media-based data integration system 14a, which in turn is communicatively coupled to a media-based computing system 16a. In particular, and by way of example, network computing system 12a is based on a client-server computer model which enables users to access supplying-computer devices from requesting-computer devices through requests made from a user interface provided at the requesting-computer devices. As shown in FIG. 2, one embodiment of the client-server computer model that is well-suited for network computing system 12a comprises one or more client computers 18 (used interchangeably with "client applications 18" and "clients 18") each having a user interface, e.g., like a browser 20, to communicate 22 with network 24. Network 24 is, in turn, communicatively coupled 26 to one or more server computers 28-1 to 28-$n$ (referred to interchangeably as servers 28-1, 28-2, ..., 28-$n$). For convenience in describing the present invention, reference to "server computers" will be used interchangeably with "servers." In turn, servers 28-1, 28-2, ..., 28-$n$ are communicatively coupled to integration system 14a, as indicated by data lines 30.

Also shown in the embodiment of FIG. 2, media-based computing system 16a is similarly based upon a client-server computer model. For convenience and ease of understanding the present invention, the media-based computing system 16a will be referenced interchangeably herein as the "back end sub-system 16a," and "back end 16a." As seen in the embodiment of FIG. 2, the back end sub-system 16a includes a plurality of RNS servers 32 coupled 34 to a plurality of media-based devices and appliances 36. For ease of understanding the invention and convenience, reference to "media-based devices and appliances 36" will interchangeably be made to "media-based devices 36." As will be described more specifically later, media-based devices 36 additionally include functionality to perform communication tasks similar to client computers, and RNS servers 32 are additionally designed to operate similarly to the server computers in the client-server computer model. As will be described subsequently in further detail, the RNS servers 32 may communicate with the media-based devices 36 over network 38.

In between the network computing system 12a and the back end sub-system 16a, the network/media-based data integration system 14a provides a centralized interface therebetween. For convenience and ease of understanding the present invention, system 14a will be referenced interchangeably as the "front end sub-system 14a," and "front end 14a", relative to the back end sub-system 16a. Collectively, the front end 14a and the back end 16a comprise the "My Replay TV" (MRTV) system in accordance with the present invention. In general, front end 14a extracts, captures, stores, and integrates information from a variety of disparate data sources and transmits the information assembled to the client user interfaces, like at browser 20, and to the media-based devices 36. Additionally, front end 14a enables data from a variety of sources to be shared across systems 12a and 16a, and in doing so, facilitates user control input for media-based devices 68 over communications system 10A. In the embodiment of FIG. 2, the front end 14a includes a middle tier server 40 coupled 42 to a database 44 and to servers 28-1, ..., 28-n, over data lines 30. The database 44 is communicatively coupled 46 to a batch request server 48, and other online sources of data, such as database 50 over data line 52 and an online service 54 over data line 56, by way of example. Batch request server 48 is capable of communication with RNS server 32 over data line 58, and directly over line 60 with media-based devices 36.

One embodiment of network 24 in accordance with the present invention includes the Internet. However, it will be appreciated by those skilled in the art that the present invention works suitably-well with a wide variety of computer networks over numerous topologies, so long as network 24 connects the distributed clients 18 to servers 28-1 to 28-n. For convenience and ease of understanding the present invention, at times, reference will be made to network 24 as the Internet 24. However, it is noted that the present invention is not limited by the type of network described. Thus, to the extent the discussion herein identifies a particular type of network, such description is purely illustrative and is not intended to limit the applicability of the present invention to a specific type of network. For example, other public or private communication networks that can be used for network 24 include Local Area Networks (LANs), Wide Area Networks (WANs), intranets, extranets, Virtual Private Networks (VPNs), and wireless networks (i.e., with the appropriate wireless interfaces as known in the industry substituted for the hard-wired communication links). Generally, these types of communication networks can in turn be communicatively coupled to other networks comprising storage devices, server computers, databases, and client computers that are communicatively coupled to other computers and storage devices.

Clients 18, servers 28-1 to 28-n, servers 32, 40 and 48 and media-based devices 36 may beneficially utilize the present invention, and may contain an embodiment of the process steps and modules of the present invention in the form of a computer program. Alternatively, the process steps and modules of the present invention could be embodied in firmware, or hardware, and when embodied in software, could be downloaded to reside on and be operated from different platforms used by real time network operating systems and applications.

A. Exemplary Embodiment for Clients

Each user at client 18 works with communications system 10A to seamlessly access one or more of servers 28-1 through 28-n through network 24. Referring now to the block diagram of FIG. 3, one embodiment for the client computer 18 is shown. The client computer 18 comprises a control unit 62 coupled to a display device 64, a keyboard 66, a control input device 68, a network controller 70, and an Input/Output (I/O) device 72 by a bus 74.

Figure 3:
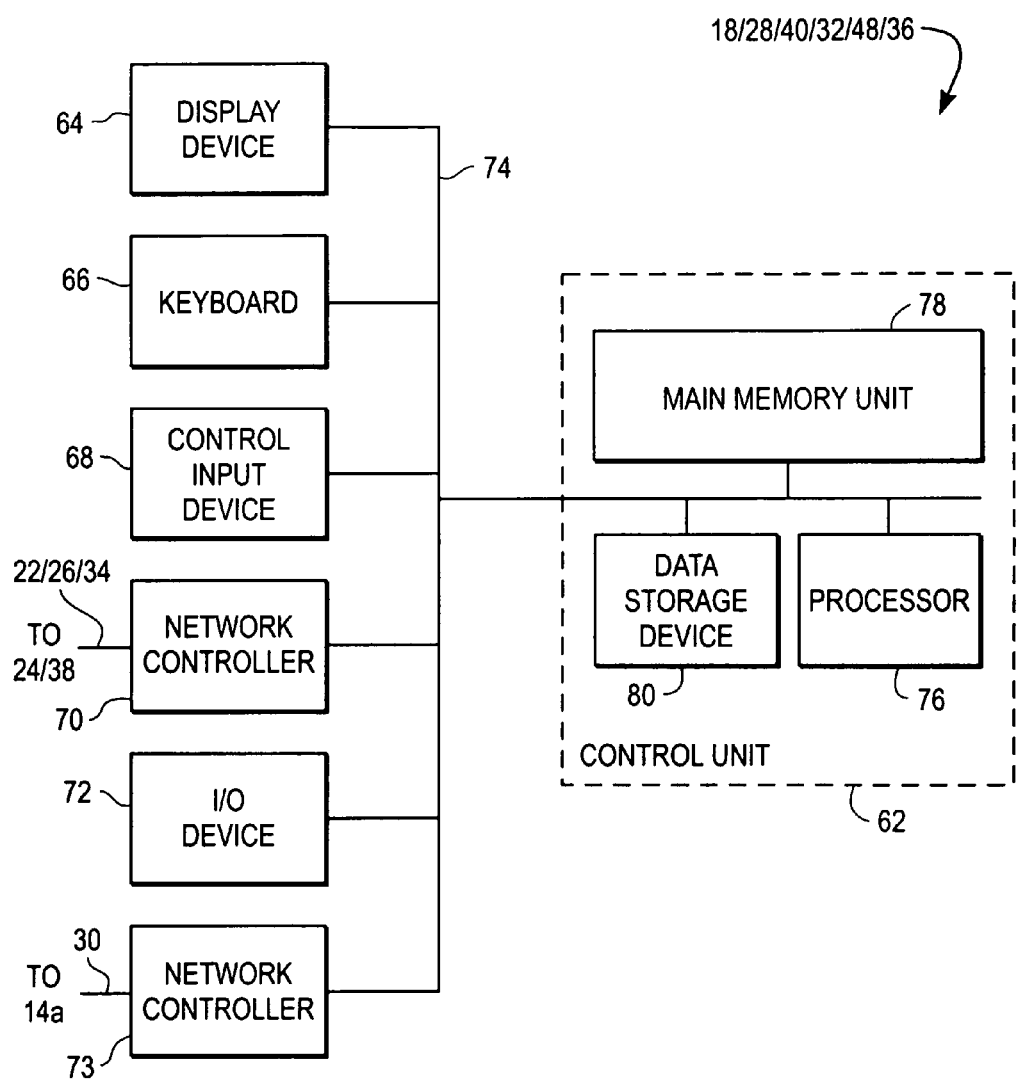
FIG. 3 is block diagram of an embodiment of hardware for the client-based computer, servers, and media-based devices in accordance with the present invention.

Control unit 62 may comprise an arithmetic logic unit, a microprocessor, a general purpose computer, a personal digital assistant or some other information appliance equipped to provide electronic display signals to display device 64. In one embodiment, control unit 62 comprises a general purpose computer having a graphical user interface, which may be generated, for example, by a program written in the Java language running on top of an operating system like the WINDOWS® or UNIX® based operating systems. In the embodiment of FIG. 3, one or more applications, electronic mail applications, spreadsheet applications, database applications, and web browser applications, generate the displays, store information, and retrieve information as part of communications system 10A (and 10B as will be described in detail subsequently). The control unit 62 also has other conventional connections to other systems such as a network for the distribution of files (e.g., media objects) using standard network protocols such as TCP/IP, HTTP, LDAP and SMTP as will be understood by those skilled in art.

It should be apparent to those skilled in the art that control unit 62 may include more or less components than those shown in FIG. 3, without departing from the spirit and scope of the present invention. For example, control unit 62 may include additional memory, such as, for example, a first or second level cache, or one or more application specific integrated circuits (ASICs). Similarly, additional components may be coupled to control unit 62 including, for example, image scanning devices, digital still or video cameras, or other devices that may or may not be equipped to capture and/or download electronic data to control unit 62.

Also shown in the embodiment of FIG. 3, the control unit 62 includes a central processing unit (CPU) 76 (otherwise referred to interchangeably as a processor 76), a main memory unit 78, and a data storage device 80, all of which are communicatively coupled to a system bus 74.

CPU 76 processes data signals and may comprise various computing architectures including a complex instruction set computer (CISC) architecture, a reduced instruction set computer (RISC) architecture, or an architecture implementing a combination of instruction sets. Although only a single CPU is shown in FIG. 3, multiple CPUs may be included.

Figure 4A:
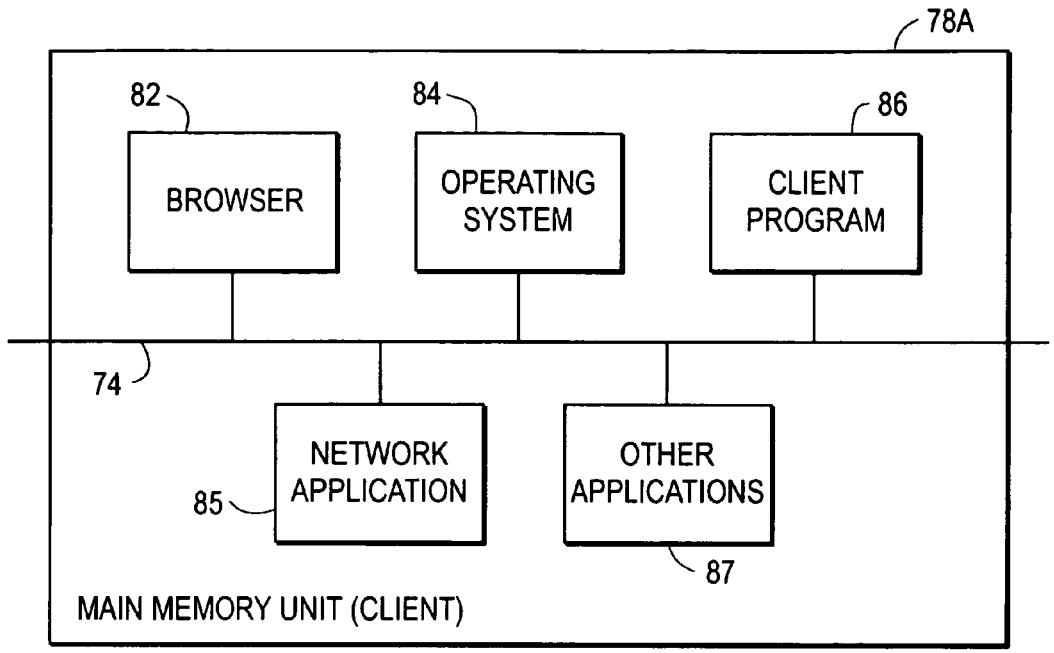
FIG. 4A is a block diagram of the main memory unit of a client computer.

Main memory unit 78 can generally store instructions and data that may be executed by CPU 76. Generally, main memory unit 78 may be a dynamic random access memory (DRAM) device, a static random access memory (SRAM) device, or some other memory device known in the art, by way of example. FIG. 4A shows further details of a particular embodiment of a main memory unit 78A for a client computer 18, by way of example. In the embodiment of FIG. 4A, the memory unit 78A preferably includes an Internet (web) browser application 82 (20) being of conventional type that provides access to the Internet and processes HTML, DHTML, XML, XSL, or other mark-up language to generate images on the display device 64. As is known in the art, a web browser facilitates the viewing of a web page on the Internet, wherein a user enters a Uniform Resource Locator (URL) of the web page or clicks on a hyperlink to the web page. By doing so, the web page itself is fetched from the appropriate web server. Several examples of web browser applications 82 include the Netscape Navigator or Microsoft Internet Explorer browser. The main memory unit 78A also includes a network application program 85 and optionally a client program 86 to enable communication between the client computer 18 and the servers 28-1 to 28-n. Network application 85 functions with network controller 70 to establish communication between client 18 and network 24. Client program 86 may function with browser 82 for creating, editing, moving, adding, searching, removing and/or viewing information related to the media-based devices 36 (unless browser 82 includes such functionality) described in accordance with the present invention. The memory unit 78A may also include one or more application programs 87, including without limitation, word processing applications, electronic mail applications, and spreadsheet applications. Also, main memory unit 78A includes an Operating System (OS) 84. For example, OS 84 may be of conventional type such as WINDOWS® 98/2000 based operating systems. In other embodiments, the present invention may additionally be used in conjunction with any computer network operating system (NOS), which is an operating system used to manage network resources. A NOS may manage multiple inputs or requests concurrently and may provide the security necessary in a multi-user environment. An example of an NOS that is completely self-contained includes WINDOWS® NT manufactured by the Microsoft Corporation of Redmond, Wash. Those skilled in the art will recognize that, in general, main memory unit 78A may include other features than those illustrated. The instructions and data may comprise code devices for performing any and all of the techniques described herein.

Referring back to FIG. 3, data storage device 80 stores data and instructions for CPU 76 and may comprise one or more devices including a hard disk drive, a floppy disk drive, a CD-ROM device, a DVD-ROM device, a DVD-RAM device, a DVD-RW device, a flash memory device, or some other mass storage device known in the art.

System bus 74 represents a shared bus for communicating information and data through control unit 62. System bus 74 may represent one or more buses including an industry standard architecture (ISA) bus, a peripheral component interconnect (PCI) bus, a universal serial bus (USB), or some other bus known in the art to provide similar functionality.

Additional components coupled to control unit 62 through system bus 74 will now be described, and which include display device 64, a keyboard 66, a control input device 68, a network controller 70, and an I/O device 72. Display device 64 represents any device equipped to display electronic images and data as described herein. Display device 64 may be a cathode ray tube (CRT), a liquid crystal display (LCD), or any other similarly equipped display device, screen or monitor. Alternatively, other embodiments of display device 64 corresponding to the alternative embodiments of client 18, can include by way of example, the touch panel Liquid Crystal Display (LCD) of a Personal Digital Assistant (PDA), and the display screen of a cellular phone.

Keyboard 66 represents an alpha-numeric input device coupled to control unit 62 to communicate information and command selections to CPU 76. Control input device 68 represents a user input device equipped to communicate positional data as well as command selections to CPU 76. Control input device 68 may include a mouse, a trackball, a stylus, a pen, a touch screen, cursor direction keys, joystick, touchpad, or other mechanisms to cause movement of a cursor. Network controller 70 links control unit 62 to network 24 and may include network I/O adapters for enabling connection to multiple processing systems. The network of processing systems may comprise a LAN, WAN, and any other interconnected data path across which multiple devices may communicate.

One or more input/output devices 72 are coupled to system bus 74. For example, I/O device 72 could be an audio device equipped to receive audio input and transmit audio output. Audio input may be received through various devices including a microphone within I/O device 72 and network controller 70. Similarly, audio output may originate from various devices including CPU 76 and network controller 70. In one embodiment, I/O device 72 is a general purpose audio add-in expansion card designed for use within a general purpose computer. Optionally, I/O device 72 may contain one or more analog-to-digital or digital-to-analog converters, and/or one or more digital signal processors to facilitate audio processing.

Having described one embodiment for the hardware of client computer 18, it will be appreciated by those skilled in the art that alternative embodiments exist for client 18, besides the computer hardware shown in FIG. 3. Such alternative embodiments that may be substituted for client 18 can include portable hand held devices that are processor-based, as will be recognized by those skilled in the art. By way of example, several portable hand held devices that may be substituted for client 18 include PDAs, two-way pagers, email terminals, Global Positioning Systems (GPS), and mobile/cellular phones. When such alternative embodiments are utilized with the present invention, it will be recognized by those skilled in the art that the user interface, communication medium and protocol adapters described for the embodiment of FIG. 3 should be modified to comply with the corresponding media-enabled portable wireless devices. For example, the present invention also has described embodiments for a set of protocol adapters that interface to a variety of Internet protocols, including but not limited to, HTML, DHTML, POP3, SMTP, SNMP, FTP, NFS, IMAP, NNTP, and WAP. It will be recognized by those skilled in the art that web browsers 20, 82 may be modified to be used on media-enabled portable wireless devices in connection with the corresponding communication protocol. Further, it will be apparent that data flow lines 22 would correspondingly represent a wireless communication medium (e.g., radio frequency signals, infrared signals) as appropriate for wireless transmission of signals.

B. Exemplary Embodiment for Server Computers

Referring now to the block diagrams of FIGS. 3 and 4B, the servers 28-1 through 28-n included in the embodiment of network computing system 12a will be described in more detail. For convenience and ease of understanding the invention, reference will interchangeably be made to "servers 28" to generically describe features of servers 28-1 through 28-n. Also for convenience, like reference numerals have been used for similar components used in both the client computer 18, and the servers 28. Servers 28 are generally responsible for presenting the front end 14a of computer system 10A to a user at the client 18. In one embodiment, servers 28 may be web portals, which is defined to mean a web "supersite" that provides a variety of online services. Alternatively, servers 28 may be web-sites provided by and/or web-hosted by unrelated entities and system administrators. These particular embodiments are well-suited for the situation when network 24 is the Internet.

In the embodiment of FIG. 3, server 28 preferably includes a display 64, a keyboard 66, a control input device 68, a first network controller and interface (I/F) 70, an I/O device 72, and a second network controller and interface (I/F) 73, coupled together via bus 74. Server 28 further includes a control unit 62 having a processor 76, memory unit 78, and a data storage device 80 also coupled to bus 74. As shown in FIG. 3, the first network controller and I/F 70 is communicatively coupled via 26 to the network 24, and ultimately to client 18. The second network controller and I/F 73 is communicatively coupled to the front end 14a, and as shown in FIG. 2, by data line 30. The processing unit 76 processes data signals and may comprise various computing architectures including CISC or RISC architecture, or an architecture implementing a combination of instruction sets. In one embodiment, server 28 includes a multiple processor system having a main memory unit 78B, as will be described in FIG. 4B. As an example, a WINDOWS® NT/2000 server can be used for server 28, while other multiple processor systems may work suitably well with the present invention, including the Dell 1800 made and sold by Dell Computer Corporation.

Figure 4B:
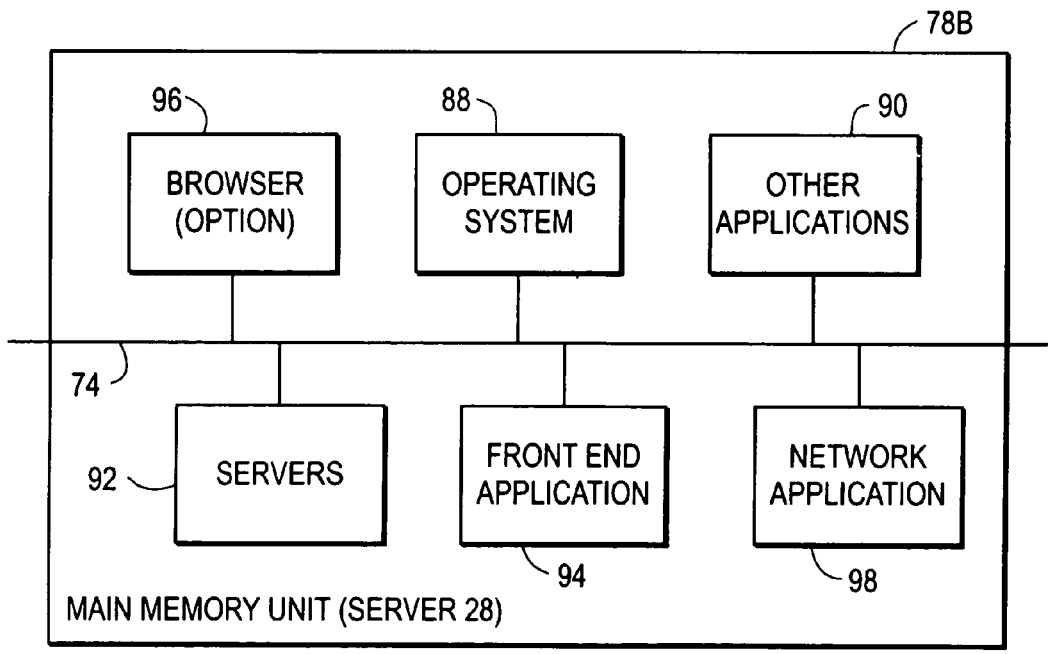
FIG. 4B is a block diagram of the main memory unit of a server.

Referring now to FIG. 4B, further details of a particular embodiment of a main memory unit 78B for a server 28 are shown, by way of example. In the embodiment of FIG. 4B, the memory unit 78B preferably comprises an operating system 88, other applications 90, server application programs 92 ("servers 92"), and a "front end" server application 94, all communicatively coupled together via system bus 74. Server 92 may be any conventionally known server application, like for example, an Apache HTTP server. Front end server application 94 is an interface for establishing communication with the middle tier server 40 by sending and receiving requests and data to the API, which will be described subsequently. In general, servers 28 may host front end 14a and are typically external websites relative to systems 14a and 16a. Because servers 28 can represent a variety of general purpose websites, some functioning as a "supersite" that provide various online services, while others being for more limited purposes, for convenience and to avoid obscuring the invention with unnecessary details, reference to servers 28 will interchangeably be made herein to "web portals 280." The memory unit 78B may also include one or more other application programs 90 including, without limitation, word processing applications, electronic mail applications, and spreadsheet applications. A network application module 98 is part of network controller 70 which enables server 28 to communicate with network 24 over lines 26. Optionally, a browser 96 may be included. As noted above, the memory unit 78B stores instructions and/or data that may be executed by processing unit 76. The instructions and/or data may comprise code for performing any and/or all of the techniques described herein. These modules 88, 90, 92, 94, and 96 in addition to others not specifically shown, are coupled by system bus 74 to the processing unit 76 for communication and cooperation to provide the functionality of the server 28. Those skilled in the art will recognize that while the present invention will now be described as modules or portions of the memory unit 78B of a computer system, the module or portions may also be stored in other media such as permanent data storage and may be distributed across a network having a plurality of different computers such as in a client/server environment.

Referring back to FIG. 2, in accordance with the present invention, network 24 enables the communication between multiple components of servers 28 and clients 18, as well as other devices, which may or may not be co-located, but may be distributed for convenience, security or other reasons. To facilitate the communication between client 18 and server 28, a client-server computer network operating system (NOS) may be used for operating system 88 in memory unit 78B of FIG. 4B to manage network resources. An NOS can manage multiple inputs or requests concurrently and may provide the security necessary in a multi-user environment. Operating system 88 can include, for example, a NOS of conventional type such as a WINDOWS® NT/2000, and UNIX® used with the Microsystem SOLARIS® computing environment. Another conventional type of operating system that may be used with the present invention includes LINUX® based operating systems.

C. Exemplary Embodiment for the Front End

Still referring to the block diagram of FIG. 2, more details about an embodiment of the front end 14a will now be discussed. Front end 14a includes a middle tier server 40, to which servers 28 communicate with. Front end 14a further includes a database 44 coupled 42 to the middle tier server 40, which in turn, is coupled 46 to a server 48 for providing information from the front end 14a to the back end 16a in "batches," (i.e., periodically). Various other databases 50 and online data sources 54 are in communication (52 and 56, respectively) with database 44.

Prior to describing other aspects of the present invention in detail, several definitions will now be introduced in the context of a particular embodiment of the present invention, where the media-based devices 36 are DVRs 37. By way of example, in a particular implementation where media-based devices 36 are DVRs 37, database 44 stores at least: 1) for every DVR 37, a list of configured channels; and 2) Electronic Program Guide (EPG) data for all channels by national broadcasters. Although the particular embodiment of DVR 37 will be discussed in more detail subsequently with reference to FIG. 10, the following definitions are now provided by way of illustration and for ease of understanding the invention.

Figure 19B:
FIG. 19B is an exemplary graphical representation of a user interface for indicating the Replay Guide information organized by Recorded Shows.

The Electronic Program Guide (EPG) is defined to mean television (TV) guide data represented in electronic form, and provided from an online data source, like for example, Tribune Media Services (TMS), as will be discussed subsequently with respect to the TMS FTP server 112 of FIG. 5. As conventionally known, FTP is defined to mean File Transfer Protocol. In general, the EPG includes a broadcast schedule of television, cable, and pay-per-view shows offered by national broadcasters. An exemplary representation of the EPG data is the Replay Guide that is shown in FIGS. 19A-B.

Figure 12A:
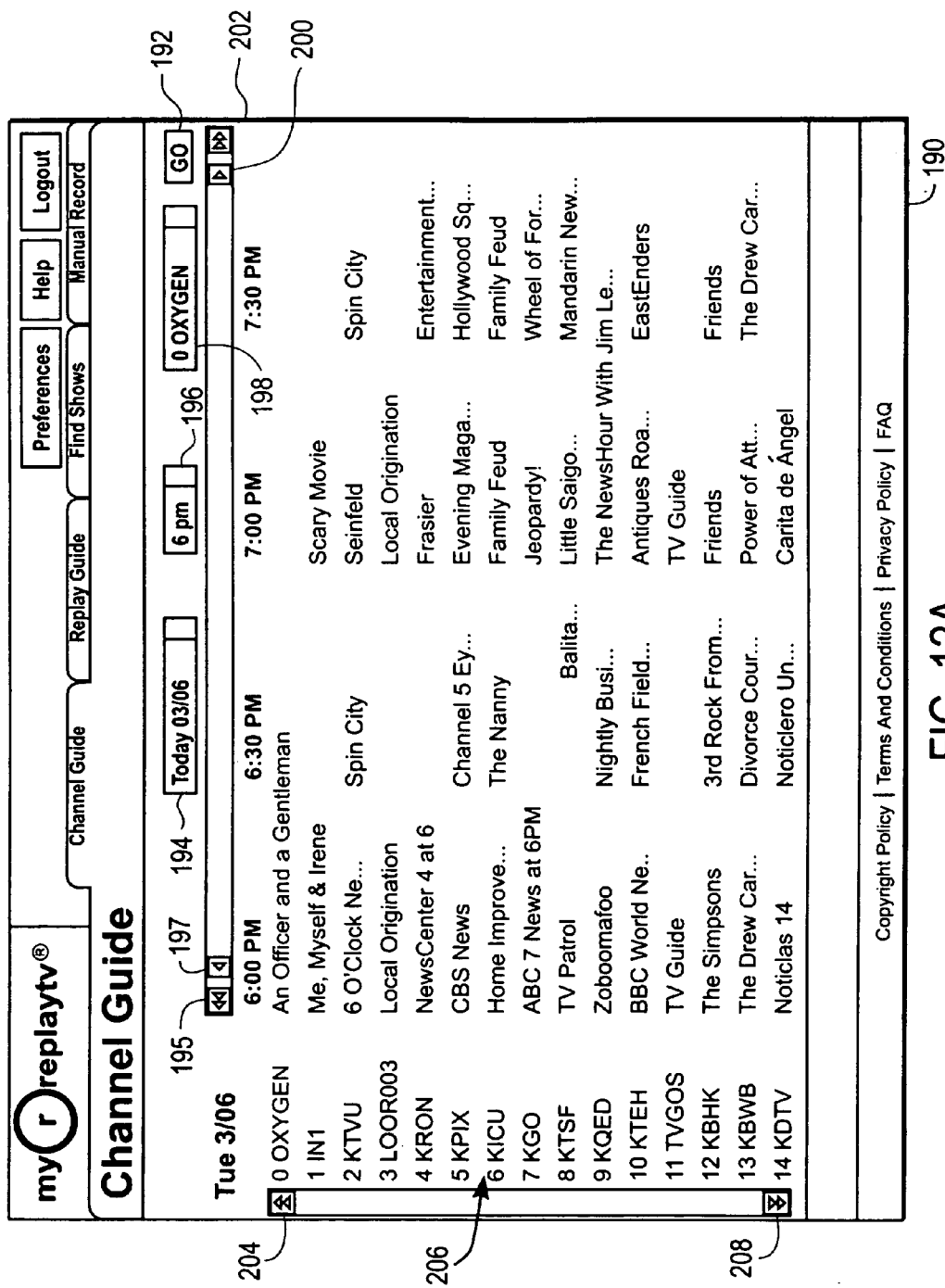
FIG. 12A is an exemplary graphical representation of a user interface for indicating the channel guide information.

The Channel Guide is defined to mean a listing of all shows assembled from the EPG that will be broadcast, as will be discussed in further detail subsequently with reference to FIG. 12A, showing one exemplary list of configured channels includes the Channel Guide 190. The Channel Guide contains a list of channel lineup indicating the actual channels to be selected by the user to appear in the Replay Guide. In general, the Channel Guide is an interactive on-screen program guide that lists upcoming and past programs broadcast.

The Replay Guide is defined to mean those shows that have been selected by the user to be recorded as they are broadcast, and that are either stored or to be stored in memory, as will be further described with reference to FIG. 19B. In general, the Replay Guide includes user-created record channels and current recorded shows. Replay Show is defined to mean a particular view of the Replay Guide, wherein for each program to be recorded, a distinct Replay Channel is assigned, as will be further described with reference to FIG. 19A.

Replay Channel is defined to mean a particular view of the Replay Guide, indicating descriptions associated with pending and completed program recording requests invoked according to either a search-based criteria or the Channel Guide criteria, as will be further described with reference to FIG. 12A. A Replay Channel may include a collection of Replay Shows.

The Replay Zone is defined to mean television and video programming organized by categories selected by the user.

1. Middle Tier Server

Referring back to FIG. 2, the middle tier server 40 is communicatively coupled to least one database 44, as indicated by data line 42. Furthermore, middle tier server 40 is communicatively coupled to servers 28 as indicated by data lines 30. User requests originated by clients 18 and communicated through servers 28 are received at the middle tier server 40. The requests are processed by server 40 according to a set of functions preferably embodied in an API 264, as will be discussed with respect to FIG. 16B. For convenience and to provide further clarification in distinguishing between multiple sets of APIs used throughout system 10A, reference to the API residing on the middle tier server 40 will interchangeably be made to the MyReplayTV (MRTV) API 264. In general, the API 264 can be accessed by servers 28 through HTTP calls that are received by the middle tier server 40. As will be described in more detail subsequently, the API 264 includes the: (1) procedural and functional calls, parameters, and formatting specifications to enable data transfers amongst the interactive media-based devices 36 and 37 and the web portals 28 through the front end subsystem 14a; and (2) the software used on the middle tier server 40 to create a virtual representation of an operational DVR 68B in an integrated presentation to be presented to a client 18. The API 264 also enables the external devices in the network computing system 12a to access information throughout the front end 14a and to communicate with the back end 16a.

More details of the particular implementation of the middle tier server 40 shown in FIG. 2 are illustrated in FIG. 3. The middle tier server 40 may have the general hardware structure described with respect to client 18 and server 28 as seen in FIG. 3. It will become apparent to those skilled in the art that like reference numerals are used in FIG. 3 for describing the general hardware of the middle tier server 40 primarily for convenience and so as not to obscure the invention with unnecessary details. To this end, server 40 includes a control unit 62 having a processor 76, main memory 78, and data storage device 80. Control unit 62 is coupled via bus 74 to a display device 64, keyboard 66, control input device 68, one or more network controllers 70 and 73, and I/O device 72.

Figure 4C:
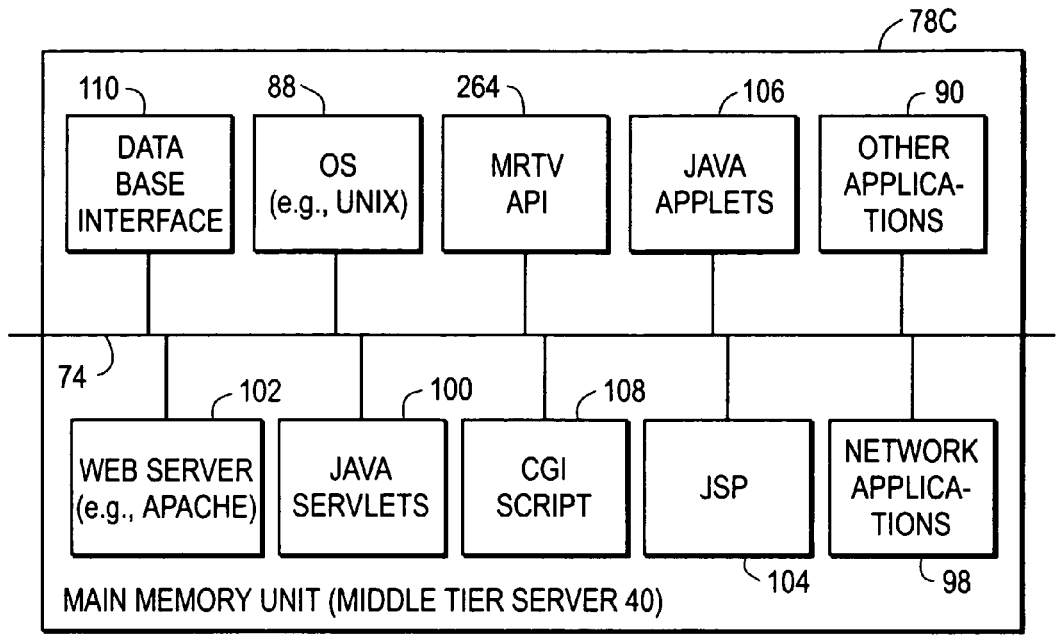
FIG. 4C is a block diagram of the main memory unit of the middle tier server.

A particular embodiment of main memory unit 78C is shown in FIG. 4C for the middle tier server 40. Main memory 78C includes an operating system 88 as already described, and includes server tools, such as, Java servlets 100 running on an Apache web server 102 with a Tomcat (servlet) server. Tomcat, is a reference implementation combining the Java servlet 100 and JavaServer Pages™ (JSP) 104 specifications which can run in standalone mode or be integrated into the Apache web server 102. By using Tomcat, an operational definition for the Enterprise Java™ JSP 104 and servlet 100 drives the Application Programming Interface (API) 264 provided in accordance with the present invention. Java servlets 100 can be written to run on middle tier server 40 that accept requests via HTTP format and to transmit data in XML format to and from database 44. These Java servlets 100 provide functionality for converting the XML files into data that can be stored in database 44, and for extracting data from database 44, converting the extracted data into XML before sending the converted data to an external client 18 via web servers 28. It is preferable that the Java servlets 100, incorporating the functions of database interactions and the conversion of data format to XML, be shared between the Java applications that run on the RNS servers 32 and the Java servlets 100 that run on the middle tier server 40. The memory unit 78C for the middle tier server 40 can further include applications in the nature of Java applets 106, CGI scripts 108, database interface applications 110 and other applications 90 (as previously described). Generally, the API 264 executes under the control of the Java servlets 100. The Apache web server 102 is capable of generating an HTTP page having a virtual representation of the control-input interface of DVR 37 and for display on browser 20 and 82.

The database interface applications 110 are one or more programs that include functionality for accessing, storing, and extracting data from a wide variety of relational computing systems such as databases, and which may be implemented by conventionally known techniques. For example, the database interface applications module 110 can be embodied as a program for extracting and defining schema from any relational data sources that can be reached using Object Linking and Embedding DataBase (OLE DB), Open DataBase Connectivity (ODBC), and/or Java DataBase Connectivity (JDBC) software drivers.

It should be apparent to one skilled in the art that memory unit 78C may include more or less components than those shown in FIG. 4C without departing from the spirit and scope of the present invention.

2. Online Services and Databases

The database 44 in FIG. 2 will now be described more specifically. Database 44 represents any relational database system, table or view. Preferably, any OLE DB, ODBC, or JDBC compliant database is well-suited to work with the present invention. Although a single database 44 is shown in FIG. 2, multiple heterogeneous databases may be included. Examples of such databases include: Microsoft SQL server, Oracle, Informix, DB2, Sybase and Microsoft Access. Both the middle tier server 40 and the batch request server 48 may store and extract data from database 44. For example, one manner of extracting information as indicated by data flow line 42 is using JDBC to access user profile information from the database 44.

Database 44 stores information received from various sources, like for example, an online service 54 coupled thereto by line 56. One particular online service is provided by Tribune Media Services (TMS), and is shown in the embodiment of FIG. 5, where a TMS FTP server 112 provides a feed to the MPREG module 114 of electronic programming guide (EPG) data into database 44, as will be described in more detail subsequently. A Cruncher module 116 may be provided to load selected EPG data into the DVR 37 via RNS server 32. Optionally, other databases may be coupled to database 44 to provide specific types of information to database 44, as indicated by data line 52. For example, a user authentication database 50 may be included in front end 14a to authenticate users against a collection of personal profile information. One particular proprietary user authentication database 50 that may work suitably well with the present invention is a Silknet™ database. It will become apparent to those skilled in the art that additional online sources of data, including third-party search engines and other online content-providers, may provide additional information (e.g., content, broadcast, show and movie clips, chat rooms, etc.) to database 44 for integration with existing information, functions, features and services. As shown in FIGS. 2 and 5, database 44 is coupled to a batch request server 48 as shown by line 46. It will be appreciated that numerous configurations of databases may work suitably well with the present invention, in addition to the particular implementation shown in FIGS. 2 and 5, where database 44 is configured as a hub that is communicatively coupled to other sources of information for receiving information to be combined with other data stored therein.

3. Batch Request Server

Figure 5:
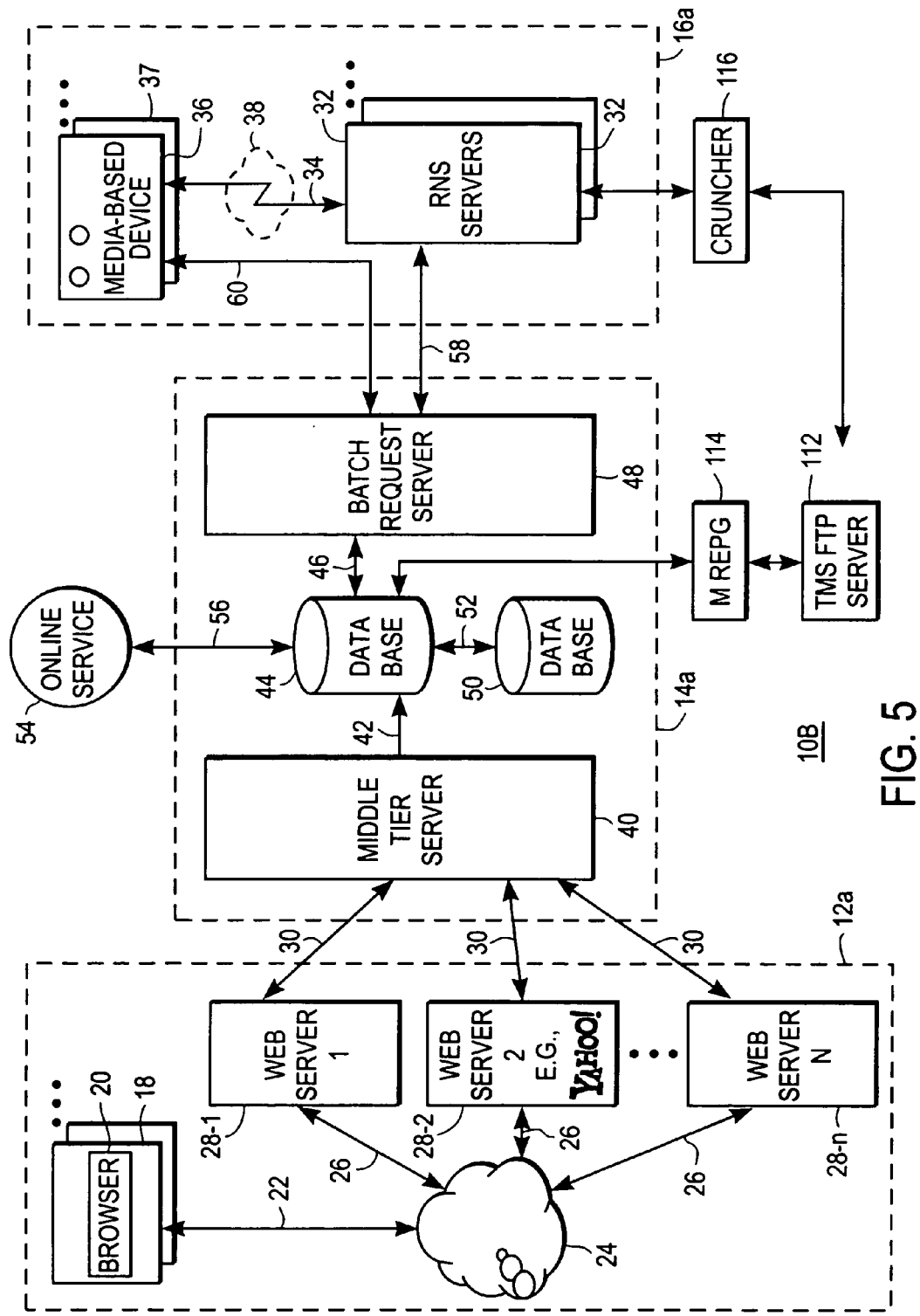
FIG. 5 is an alternate embodiment of the computer-based communication system of FIG. 1A.

Referring to FIGS. 2 and 5, server 48 will now be discussed in detail, with occasional reference made to FIGS. 13A-B. For convenience and ease of understanding the invention, server 48 will be referenced interchangeably with the "batch request server 48." Server 48 is provided for "batching" requests, meaning that periodically a communication session is established between database 44 and server 48 to pull data from the database 44 to the server 48 and/or to push data from server 48 to database 44. Additionally, periodic sessions are established between batch request server 48 and the RNS servers 32 to exchange data there between. As will be recognized by those skilled in the art, the particular embodiment of server 48 in FIGS. 2 and 5 provides "batched" communications between the front end 14a and the back end 16a, rather than a continuous real-time communication session directly between media-based devices 36 and the database 44 in a load-balanced distributed communication system as will be described in another embodiment subsequently.

One aspect of providing "batch" communications with server 48 is to minimize the possibility of impacting the reliability of the RNS servers 32 as the number of media-based devices 36 scales upward. It is noted that there are a variety of ways to preserve the reliability of the RNS servers 32. As will become apparent to those skilled in the art, batch request server 48 can include similar components in FIG. 3, a description of which has already been described.

Figure 6:
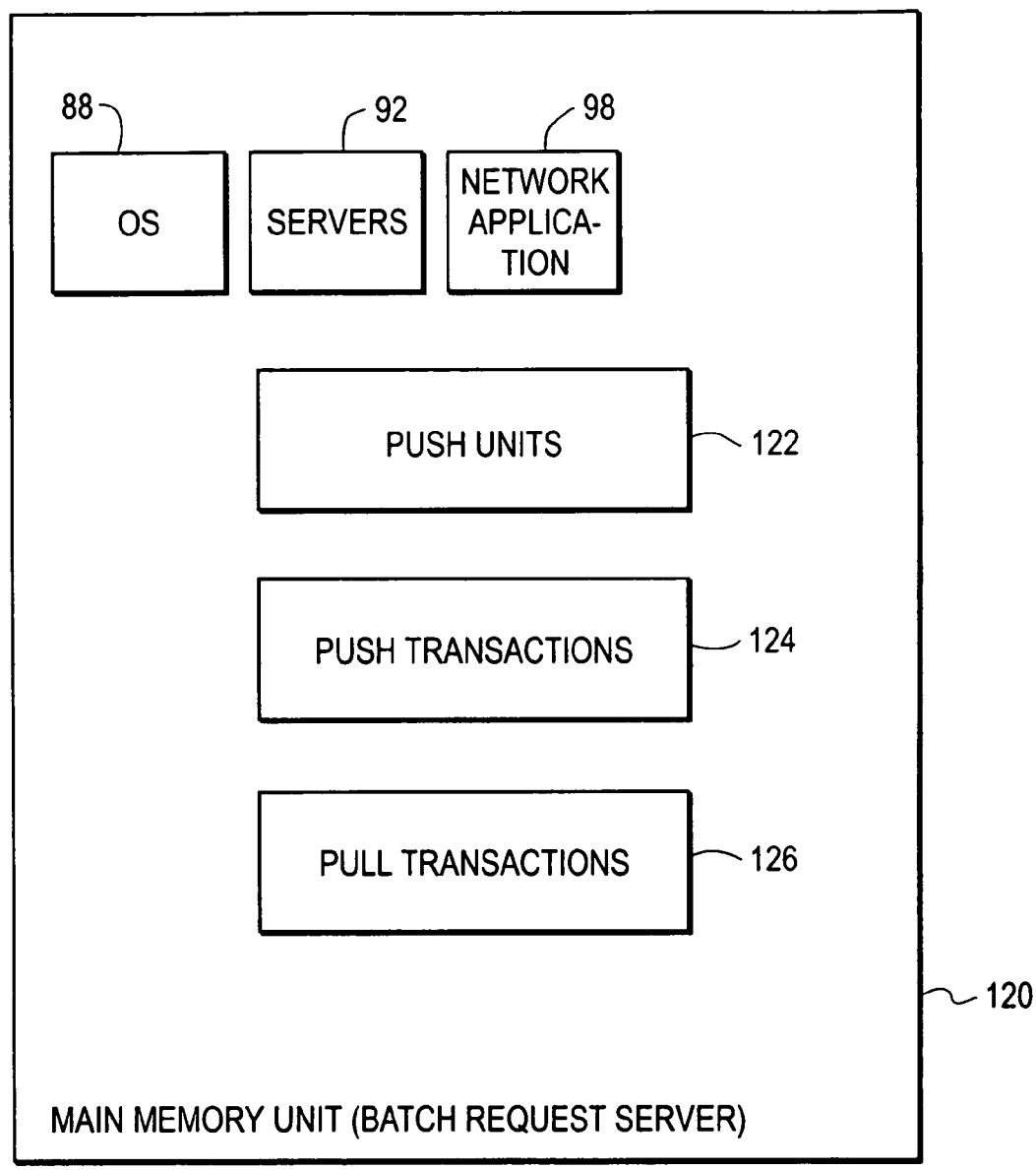
FIG. 6 is a block diagram of the main memory unit of the batch request server.
Figure 7:
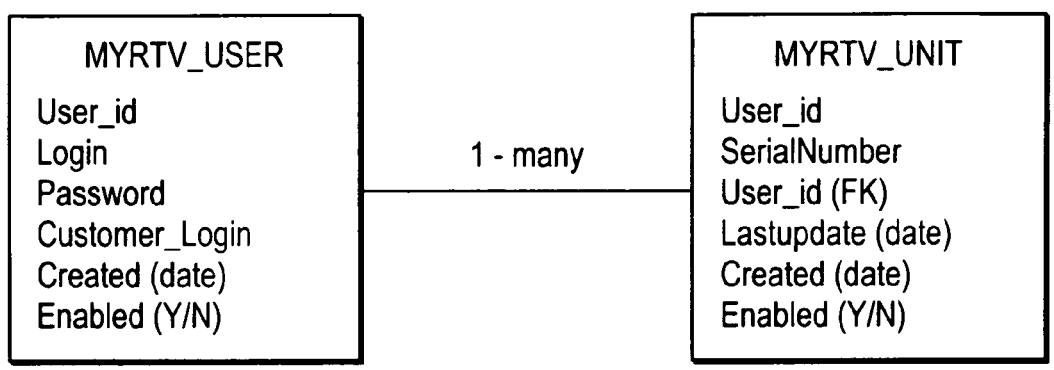
FIG. 7 is an exemplary class diagram of related information pertaining to a client user and a DVR.

One particular implementation of batch request server 48 will now be discussed, by way of example, with reference to FIG. 6. In FIG. 6, a block diagram of a main memory unit 120 is shown of a batch request server 48 having software modules therein that facilitate the "batch" processing functions described herein. As seen in FIG. 6, main memory unit 120 includes a first module 122 for "pushing" data to the media-based devices 36 through the RNS servers 32. In order to accomplish this function, module 122 can be designed to query 243 the database 44 in order to extract 245 data in the nature of all of the media-based devices 36 that have been registered to use systems 10A and 10B. A convenient parameter for discerning the registration data extracted is by way of tracking serial numbers associated with each device 36. Other parameters that may be useful for querying the database 44 include those shown in the class diagram of FIG. 7, by way of example.

To provide further illustration, an implementation of module 122 will now be discussed. Module 122 may be embodied as a script and invoked as a CRON job, resulting with the extracted data placed into a BereklyDB file. More specifically, with this particular example, the CRON job can run a Java program: that periodically queries database 44 for transaction information concerning the devices 36 that converts each transaction into an XML snippet; and that constructs a single-indexed BerkelyDB file containing all transactions since the last query arranged by serial number of the media-based devices 36. The BerkelyDB file preferably includes the transactions for all devices 36 formatted in XML. Once the data has been extracted, module 122 pushes 247 the BereklyDB file to all RNS servers 32 using the RSYNC command and as described further during a discussion regarding Load Sharing Servers.

Referring back to FIG. 6, batch request server 46 may further include a second module 124 for pushing transactions to the RNS servers 32. Second module 124 can be designed to query database 44 for a list of pending transactions for all of the media-based devices 36. Similar to module 122, module 124 can be embodied as a script and invoked as a CRON job, having the extracted data being placed in a BerkelyDB file. The file can then be pushed to all of the RNS servers 32.

Main memory unit 120 can include a third module 126 that functions to monitor a particular folder for a file that the batch request server 48 pulls from the RNS servers 32. The particular folder preferably includes all of the transaction result files assembled from all of the RNS servers 32. Third module 126 preferably includes a Java program to convert the format of the result files into XML formatted data, which may be stored in database 44. Similar to modules 122 and 124, third module 126 can be embodied as a script and invoked as a CRON job that periodically collects the transaction result files using the RSYNC command.

D. Exemplary Embodiment for the Back End

Referring to FIG. 2, communicatively coupled to the front end 14a is a backend sub-system 16a which in one embodiment comprises one or more media-based devices 36 coupled to the front end 14a. In another embodiment, a plurality of media-based devices 36 are coupled to at least one of a plurality of load sharing servers 32, which in turn, communicate with the front end 14a. More details of these embodiments are discussed below.

1. Load Sharing Servers

Referring to FIG. 2, one embodiment is shown of a back end 16a having a plurality of media-based devices 36 each being communicatively coupled to the front end 14a as indicated by control data line 60. This embodiment works suitably well for a limited number of media-based devices. As larger volumes of media-based devices 36 are provided, back end 16a must be modified to accommodate the increased communication traffic and loads.

With another embodiment of back end 16a, a mechanism for undertaking load-balancing of the communication between front end 14a and a plurality of media-based devices 68 will now be discussed in detail still referring to FIG. 2. As shown in FIG. 2, the back end sub-system 16a includes a plurality of media-based devices 36 that are in communication with at least one of a plurality of load sharing servers 32. For convenience and by way of example, reference will be made interchangeably to the load sharing servers 32 as Replay Network Service (RNS) servers 32. As will become evident from the discussion below, one technical benefit of RNS servers 32 is that they enable the system 10A to scale to large volumes of media-based devices 36 while providing flexibility and the expandability required for deploying a diverse set of applications.

With regard to control/data line 34, although each media-based device 36 can be directly coupled to an RNS server 32, a preferred manner is to communicatively couple media-based devices 36 over a network 38 (shown in broken line) to the RNS servers 32. By doing so, back end 16a functions as a distributed sub-system of media-based devices 36. Data communication line 58 indicates that the RNS servers 32 are coupled to the front end 14a through the batch request server 48. It is noted that the present invention works suitably well without servers 32, but as the number of media-based devices 36 increases, servers 32 become beneficial for providing load balancing. That is, as the number of media-based device 36 and DVRs 37 increase, a single RNS server 32 can easily become overloaded, and thereby result in a failure of network communications.

In the same embodiment, back end sub-system 16a can be analogized to a client-server computer model which enables the media-based devices 36 to access the RNS servers 32 over a network 38, which in one implementation may be the Internet. Back end sub-system 16a comprises a distributed set of RNS servers 32, which are load-balanced, for example, by using a load balancing Domain Naming Service (DNS) server. A DNS server is a directory service whose general function is to facilitate a mapping of Internet host names to Internet Protocol (IP) addresses with a complete fault tolerance system, as is known in the art. Furthermore, a plurality of load-balanced DNS servers can be web-hosted at different server farms on the Internet; and DVRs 37 can be directed to the appropriate server farm on the Internet based on a random algorithm which is intended to be replaced with one that is geographically optimized.

As described herein, there are several ways the communication between the RNS servers 32 and the DVRs 37 may be established. The flow of data there between may be categorized based on the pull, push or broadcast models. The pull model is defined to mean that each DVR 37 connects (e.g., dials into) periodically to a RNS server 32 looking to upload requests being transmitted from the front end 14a. The requests received by the DVR 37 may be placed in a "to do" list. Although an exemplary particular implementation of the pull model will be discussed subsequently, the implementation of the pull model at a higher level of abstraction may generally include the following interactions between the DVR 37 and the RNS servers 32: modem negotiation between the DVR 37 and the RNS servers 32 to establish a session; a Peer-to-Peer Point negotiation; a URL request being made by the DVR 37; data transfer; and conclusion of the session. By contrast, the push model is defined to mean that RNS servers 32 initiate contact with the DVR 37 to download requests transmitted from the front end 14a in the nature of recording instructions. For example, using the same PPP connection as in the pull model, when called, the DVR 37 can engage in a session with the RNS server 32, for example, if a caller identification matches a predetermined RNS server 32. Alternatively, broadcast tagged recording instructions may be used. For example, the Vertical Blanking Interval (VBI) can be used to embed instructions into the broadcast datastream. If a DVR 37 detects its tag (e.g., serial number), the DVR 37 stores associated instructions in its "to do" list. In this embodiment, the DVR 37 should preferably be constantly tuned to a specific broadcast channel in order to receive the data broadcast by the RNS servers 32.

There are several ways in which the RNS servers 32 may obtain information from front end 14a or from other online data sources, the information being ultimately provided to the DVRs 37. These alternatives will now be discussed. First, referring to the communication system of FIG. 2, the front end 14a may push data through the batch request server 48 to the RNS servers 32 over data line 58. On a periodic basis, the batch request servers 48 push a database of all of the pending requests to all of the RNS servers 32. In one implementation, the pending requests can be contained in a BerkelyDB file. Additionally, another BerkelyDB file can include a list of all of the users who have registered their corresponding DVR 37 for use over systems 10A and 10B. When a DVR 37 sends an HTTP request with a corresponding serial number embedded therein to an RNS server 32, a determination is made as to whether the DVR 37 has been configured to interoperate with systems 10A and 10B. As described herein, the DVR 37 is capable of instructing the RNS server 32 to provide a list of pending requests by sending a URL to the RNS server 32.

Figure 8:
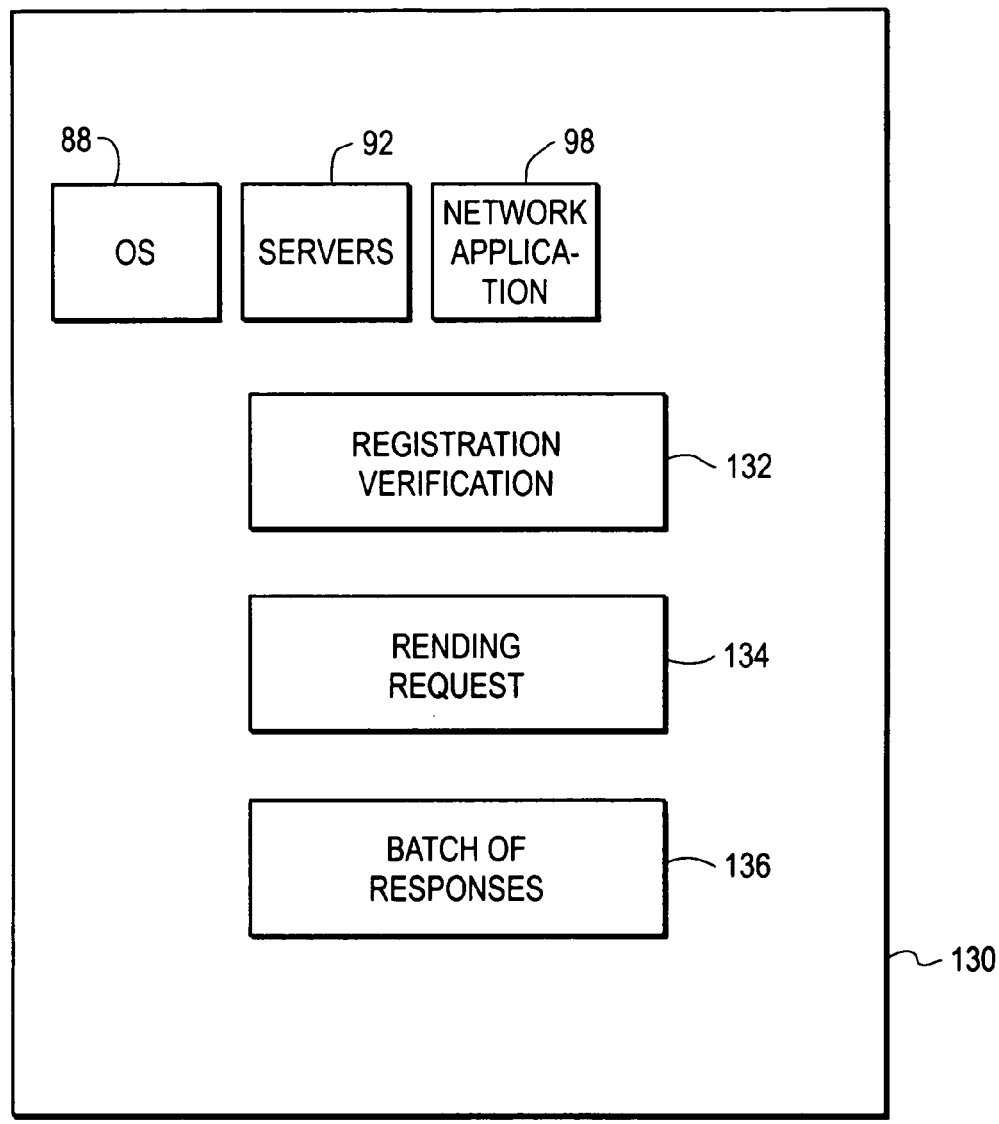
FIG. 8 is a block diagram of the main memory unit of the RNS server.

As will become apparent to those skilled in the art, RNS request server 32 can include similar components in FIG. 3, a description of which has already been described. One particular implementation of a main memory unit 130 for RNS server 32 will now be discussed, by way of example, with reference to FIG. 8. When a DVR 37 first establishes a session with the RNS server 32, a URL is sent from the DVR 37 with the serial number embedded therein to the RNS server 32. As seen in FIG. 8, main memory unit 130 includes a first module 132 providing the functionality of verifying whether the DVR 37 is properly registered to interoperate with the systems 10A and 10B. By way of example, module 132 can be implemented as a CGI written in Perl script that analyzes the BereklyDB file (containing a list of serial numbers for all DVRs that have registered) to match the serial number embedded in the HTTP request therewith.

Additionally, the DVR 37 can send another URL to the RNS server 32 requesting a list of responses. A second module 134 provides the functionality of determining and extracting the pending requests for the particular DVR 37. By way of example, module 134 can be implemented as a CGI written in Perl script that analyzes the BereklyDB file to match the serial number embedded in the HTTP request with a list of pending requests. Upon locating the pending requests, module 134 extracts the relevant information and transmits it to the DVR 37 of interest.

Also, the DVR 37 can send another URL to a particular RNS server 32 indicating a list responses to the requests received from the RNS server 32. When the list of responses is received by the RNS server 32, another module 136 is included to concatenate the responses into a response log file. Third module 136 may also be implemented as a CGI written as a Perl script. It will be appreciated that the response log file concatentates responses from many DVRs 37, and can grow considerably large in as the distributed back end 16a scales upward. Accordingly and periodically, the RNS server 32 pushes the response log file to the database 44 through the batch request server 48. This enables database 44 to be updated with responses, that can include by way of example, a new channel lineup, a new Replay Guide, a list of requests that the particular DVR 37 has successfully processed, and corresponding errors. To implement the push function, by way of example, a standard UNIX command that invokes a CRON job can be included to execute periodically (e.g., every 15 minutes), thereby pushing the concatentated list to the batch request server 48. As is conventionally, known by those familiar with UNIX, a CRON job handles the execution of shell command lines at specified intervals.

Referring to FIG. 5, another embodiment of the communications system 10B is shown. FIG. 5 is similar to FIG. 2, except for the addition of the TMS FTP server 112 coupled to the converter module 116 (referred to interchangeably as the Cruncher module 116) and to the MREPG module 114. The TMS FTP Server 112 is an online data source of programming data which is translated into a localized EPG format. The EPG retrieved from server 112 is transmitted to database 44, while selected portions of the EPG are transmitted to the DVR 37 via the Cruncher module 16 and the RNS server 32.

Figure 9:
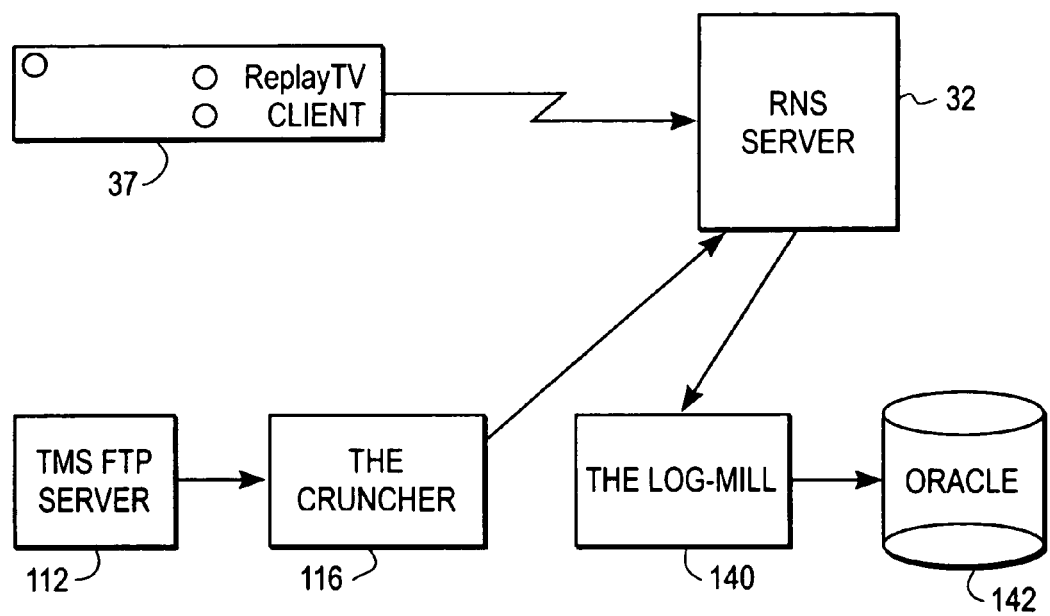
FIG. 9 is a block diagram of one embodiment of the back end enabling the RNS servers to receive EPG data from an online source in accordance with the present invention.

Referring to the block diagram of FIG. 9, the data flow of selected EPG data from the TMS FTP server 112 to DVR 37 is shown, wherein such EPG data is pushed from TMS FPT server 112 towards the RNS server 32 through the Cruncher 116. In one implementation, the Cruncher module 116 periodically collects EPG data from the TMS FTP server 112, constructs the Channel Guide and ReplayZone data, and feeds such information to the RNS servers 32. In the particular implementation, the Cruncher 116 can be designed to run a CRON job that periodically wakes up and downloads TMS data files from server 112. The Cruncher 116 can be implemented using scripts (e.g., Perl scripts) that "crunch" (i.e., decompose) the EPG files into many individual files in a format suitable for the DVR 37. These formatted files can also include SUZUKI data inserted therein. SUZUKI data includes a collection of genre-based shows having identification tags associated therewith. These tags can in turn be used by system 10B to filter certain genres of show for the user to select, referenced for convenience as the Replay Zones feature. Under the control of the Cruncher 116, an RSYNC command known in UNIX can be used to distribute these files to the RNS servers 32. As conventionally known, the RSYNC command allows the transfer of data using a secure channel.

With either the push, pull or broadcast models described herein, the RNS servers 32 are a distributed load-balanced set of servers that receive these files from the Cruncher 116 and receive requests from front end 14a. When an Internet connection is established between the DVRs 37 and the corresponding RNS server 32, the DVRs 37 receive the data stored in the RNS server 32. For example, every show in the Channel Guide is associated with a unique definition specified therewith that is pushed from the front end 14a to DVR 37. The DVR 37 matches this data based on other data it receives from the Cruncher module 116. The DVR 37 includes a list of program data in its Channel Guide, and based upon the matching and the data received from the Cruncher 116, constructs its Channel Guide.

Regarding the upload of EPG data to the database 44, the MREPG module 114 comprises a batched process implemented by software and that extracts data from the TMS FTP server 112 to update database 44. The MREPG module 114 is responsible for providing the TV program guide content to the database 44. Module 114 also provides a search feature allowing users to find shows based on their title, description and/or credits. Furthermore, module 114 also is responsible for maintaining the EPG data in database 44 and keeping such data up-to-date based on the TMS feed. The Channel Guide that is sent to browser 20 is constructed from EPG data from database 44, and that is loaded by the MREPG module 114. The DVR 37 has a Channel Guide that is constructed by the Cruncher module 116 and loaded through the RNS server 32. Accordingly, there are two versions of the Channel Guide, one in database 44 and the other in the DVR 37, albeit both originating from the TMS FTP server 112. The reason for this dual loading of TMS data in database 44 and in the DVR 37 for the Channel Guide is for the purpose of providing only necessary Channel Guide data to the DVR 37 so as to prevent unnecessary memory allocation thereon.

Reference is now made to an implementation shown in FIG. 9, where a Log-Mill module 140 collects all of the logs from the DVRs 37, each of which includes a system log file that accumulates administrative system tasks. As this system log file grows in size, it is archived from the data storage of the DVR 37 to free up memory space. An application can be included on DVR 37 to upload the system log file to the RNS server 32. Once the system log file is uploaded to the RNS server 32, Log-Mill application module 140 can archive it (257, 259 in FIG. 13B) to a database 142. One example of doing so is for the Log-Mill module 140 to execute a CRON job that periodically wakes up to use the RSYNC routine to retrieve the system log files distributed across all RNS servers 32, that coalesces them, and that feeds them to database 142. It will be appreciated that database 142 may be separate from database 44. In one example where database 142 is provided from Oracle, a SQL*Load command is invoked by the Log-Mill module 140 to archive the system log files in the database as entries. Archiving the system log file enables usage tracking, that is, tracking the number of users utilizing certain features of the DVR 37. The Log-Mill is also useful for collecting information used for statistical calculations, billing, establishing projections, and targeting advertising, products, and content.

2. Media-Based Devices and Appliances

The media-based devices and appliances 36 will now be discussed in more detail by referring to a general embodiment of the hardware shown in FIG. 3, by way of example, and occasionally to FIGS. 13A-B. For convenience and ease of understanding the invention, like reference numerals are referenced for similar components previously described regarding FIG. 3, a portion of which are applicable to media-based device and appliances 36. In the embodiment of FIG. 3, media based device 36 includes a control input device 68, a first network controller and interface (I/F) 70, and an I/O device 72, coupled together via bus 74. Optionally, media-based device 36 can optionally be coupled to or include a display device 64, and can optionally include a second network controller and interface (I/F) 73, and a keyboard 66 coupled together via bus 74. It will be appreciated that device 36 can include more or less components than those explicitly described here. Media-based device 36 further includes a control unit 62 having a processor 76, memory unit 78, and a data storage device 80 also coupled to bus 74.

According to one implementation of FIGS. 2 and 5, a first network controller and I/F 70 may facilitate the communicative coupling of the media based device 36 to the batch request server 48 of front end 14*a* over data line 60. Optionally, a second network controller and I/F 73 may be coupled to other network and devices not explicitly shown. The processing unit 76 processes data signals and may comprise various computing architectures as already discussed with respect to clients 18 and servers 28.

Figure 4D:
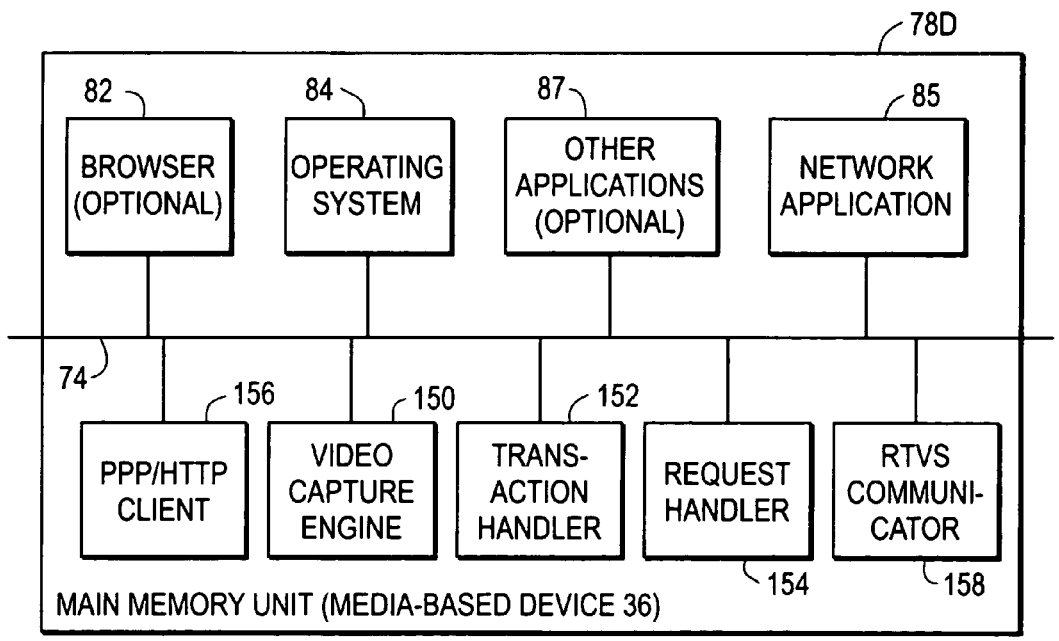
FIG. 4D is a block diagram of the main memory unit of a media-based device and appliance.

Referring now to FIG. 4D, further details of a particular embodiment of a main memory unit 78D for a media-based device 36 are shown. In the embodiment of FIG. 4D, the memory unit 78D preferably comprises an operating system 84, other applications 87, and a network application 85, the functions of which have already been described. Main memory unit 78D further includes a video capture engine 150, a transaction handler (application) program 152, and a request handler (application) program 154 all communicatively coupled together via system bus 74. Optionally, a browser 82 may be included.

As noted above, the main memory unit 78D stores instructions and/or data that may be executed by processing unit 76. The instructions and/or data may comprise code for performing any and/or all of the techniques described herein. These modules 82, 84, 85, 87, 150, 152, and 154, in addition to others not specifically shown, are coupled by system bus 74 to the processing unit 76 for communication and cooperation to provide the functionality of the media-based device 36. Those skilled in the art will recognize that while the present invention will now be described as modules or portions of the memory unit 78D of a computer-based system, the module or portions may also be stored in other media such as permanent data storage and may be distributed across a network having a plurality of different computers such as in a client/server environment.

In general, it is noted that media-based device 36 may include the functionality described with respect to FIG. 4D, or equivalent, as well as additional functionality not explicitly shown. The present invention can be implemented in a wide range of devices and is not limited to the embodiments described herein. Examples of media-based devices 36 can include, but are not limited to home appliances, interactive televisions, portable network televisions, portable networked devices having television functionality, or set-top applications and devices.

Figure 10:
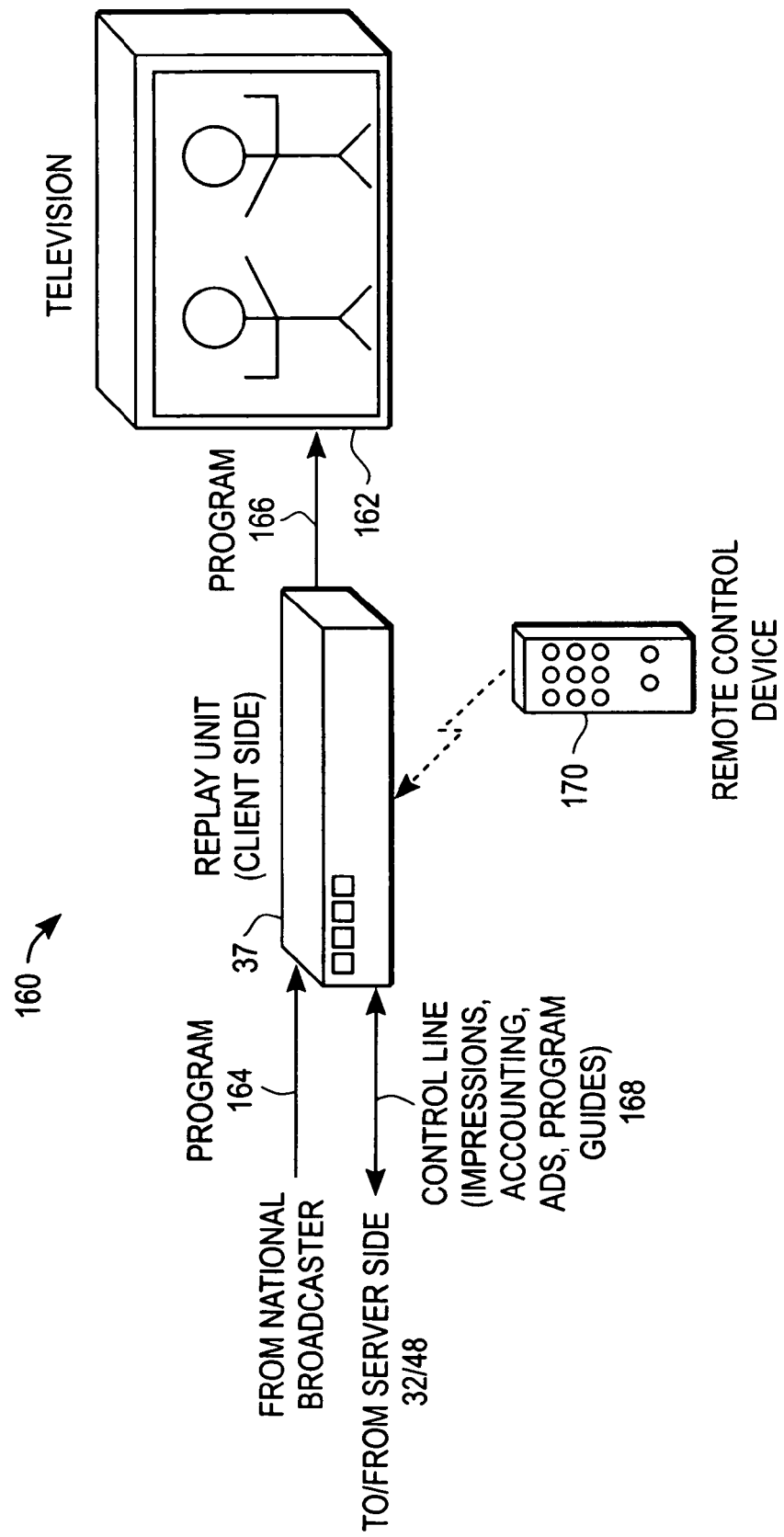
FIG. 10 is a block diagram of an exemplary embodiment for an interactive television sub-system having a digital video recorder in accordance with the present invention.

Referring to FIG. 10, one type of set-top device that is well-suited for use with the present invention is shown and embodied as an interactive television sub-system 160 comprising a Digital Video Recorder (DVR) 37, such as those available from ReplayTV, Inc. of Mountain View, Calif., by way of example. For convenience, the DVR 37 will be interchangeably used with a "video replay system 37." In the example of FIG. 4, the DVR 37 is coupled to television-based display device 162 for viewing broadcast content (i.e., programs) from a broadcast provider 164. Program 166 (e.g., a television program) is received from a national broadcaster 164 and is passed to the display device 162, along with other content, data and control data 168 (e.g., such as ads, programming guides, and control input from a network).

Referring back to FIGS. 3 and 4D, the DVR 37 is a client-based system having similar functionality to that previously described with client 18. For example, DVR 37 includes a data storage device 80, such as a hard drive, which is used to store the incoming program signal 166. The saved signal can then be viewed at a later time or can be viewed immediately from the storage medium 80. The DVR 37 includes a processor 76 and a memory unit 78D (or similar components used to direct the functionality of the unit) and implements the described functions for the particular device 37. Further, DVR 37 can make decisions when disconnected from the initial source of content 166, that is, when functioning as a stand-along device.

In one embodiment in accordance with the present invention, the DVR 37 receives control information 168 over a network as indicated by data line 34 from a network server, which in a particular embodiment is described herein as the load-sharing "RNS" servers 32. Control lines 34 indicate that a communication link is present coupling the DVRs 37 to the respective RNS server 32. Content information 166 can include, but is not limited to, electronic advertisements, electronic program guides, authentication information, control input originating from a client 18, and other types of data from online sources and databases described herein. In response, DVR 37 can transmit control information 168, such as advertisement impressions, accounting information, and updated programming and profile information to the servers 32 and 48. It should be understood that the sub-system 160 can receive various types of programming, including but not limited to cable content, television content, high definition TV content, digital TV content, pay per view content, and content broadcasted over a network, including the Internet. It should also be understood that display device 162 can be any appropriate type of display device, including but not limited to a digital or analog television set, an Internet appliance, a cellular device, or a wireless device. The DVR 37 and the display device 162 may be separate physical devices as shown, integrated together, or broken into even more functional units than shown.

It will be understood that one implementation of the DVR 37 includes a telephone line to implement one or more of control lines 34 and 60. For example, such control lines 34 and 60 can include an RJ-45 (Registered Jack-45) connector, and in other implementations, can include an Ethernet connection or Token Ring Type 3 communications. In the system 10A shown in FIG. 2, the information 168 is passed to and from the DVR 37 on a regular basis (e.g., such as every 24 hours) as will be described in the "batched" mode operation. Other implementations use an Internet connection as data control line 34 and 60 and connect regularly or on a more frequent basis. For example, in the additional embodiment of system 10B shown in FIG. 5, the information 168 is passed between the DVR 37 and the client 18 in a real-time mode, with near instantaneous results. Still, other embodiments of control lines 34 and 60 may be a wireless communication medium as will be known in the art.

FIG. 10 also shows a remote control device 170, which is used to control the sub-system 160. Typically, DVR 37 will also include control input in the form of a touch panel disposed on the housing of the device. As will be described subsequently, one aspect of the present invention comprises the user control of the media-based device 36 being enabled over communication systems 10A and 10B. For example, in a particular embodiment, the sub-system 160 can be controlled over the Internet.

The context in which the described embodiment operates is with an individual user's DVR 37, although the invention is not intended to be limited to interactive-television sub-systems 160. For example, other types of media devices and appliances 36 are shown in FIG. 2. Generally though, with a DVR 37, a user selects program content by replaying previously recorded "taped" content from a hard drive or similar storage medium 80 or by turning on his television (or other content source) and selecting a program or show to watch. As the selected program content is received by the DVR 37, it is first stored on the storage medium 80 and then displayed on a display device 162 such as a television set or monitor 64.

Referring back to FIG. 4D, the various modules representing software applications and programs executing in main memory unit 78D of a DVR 37 will now be discussed in detail with occasional reference to FIG. 10, for ease of understanding the present invention. The DVR 37 receives signals from a national broadcaster 164, such as a television, cable, or pay-per-view broadcaster that broadcasts one or more programs 166 (such as a video broadcast). The broadcast is received by the video capture engine 150 in memory unit 78D. The video capture engine 150 passes the captured programming content to a storage medium 80 as it is received and to a display device 162 upon user selection. Video capture engine 150 can be coupled to a tuner (if needed, but not explicitly shown) to indicate which of the possible broadcast programs 166 the user has selected, i.e., by changing the channel. The user can then choose to either display the program 166 as it is being received or save the program 166 for playback at a later time (or both).

The user at client 18 generally is provided with functions to: add a program listing to the guide; delete a program from the guide; update the program listing on the guide; obtain the guide from the DVR 37; and obtain the channel guide from the DVR 37. In one implementation, and by way of example, these types of control input requests, commands and instructions provided by the user at client 18 can be stored in a transaction file in the front end 14a, and pushed to the back end 16a, ultimately being transmitted to the DVR 37 through the RNS servers 32.

Figure 13A:
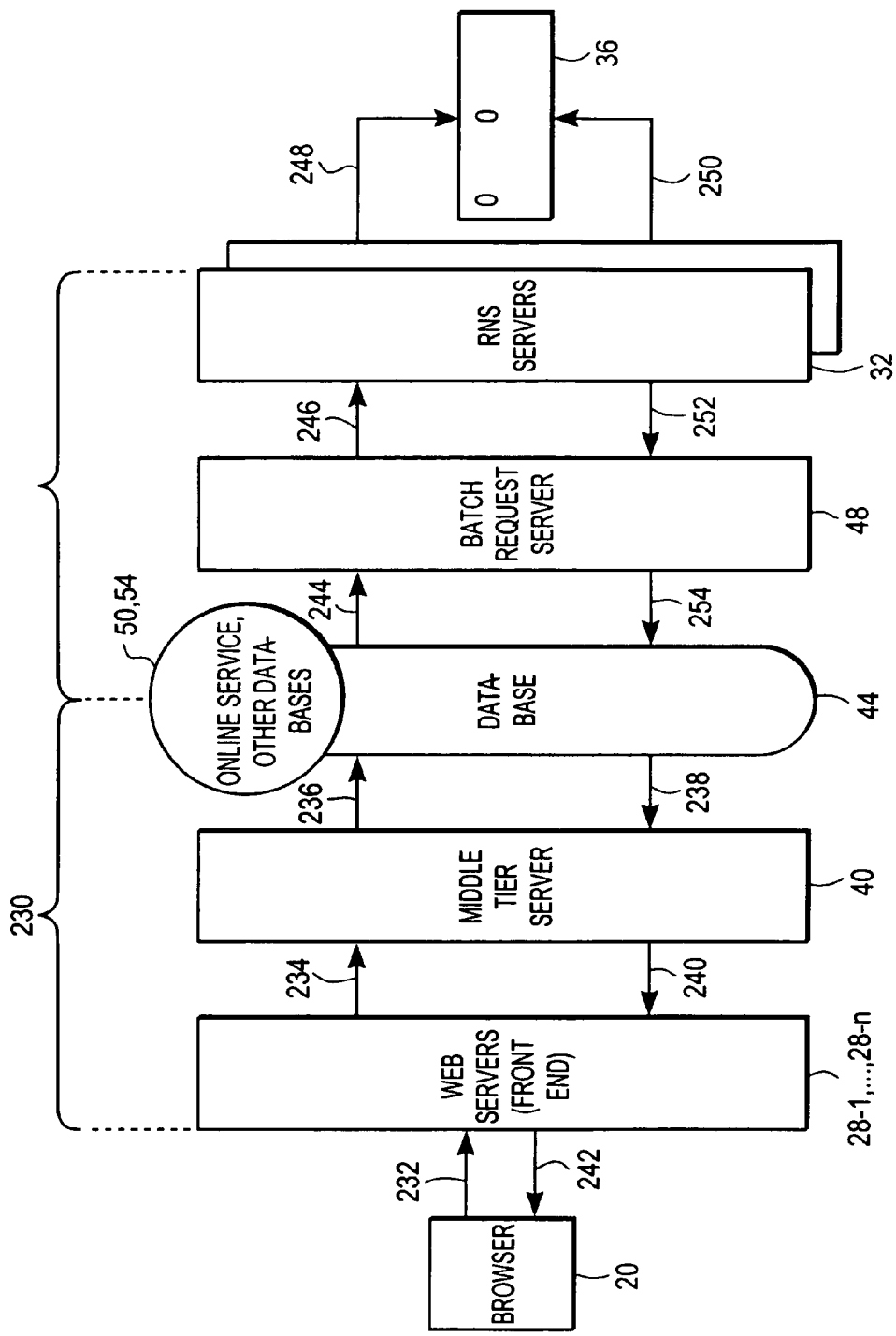
FIG. 13A is a block diagram showing the data flow throughout the computer-based communications system of FIG. 1A.
Figure 13B:
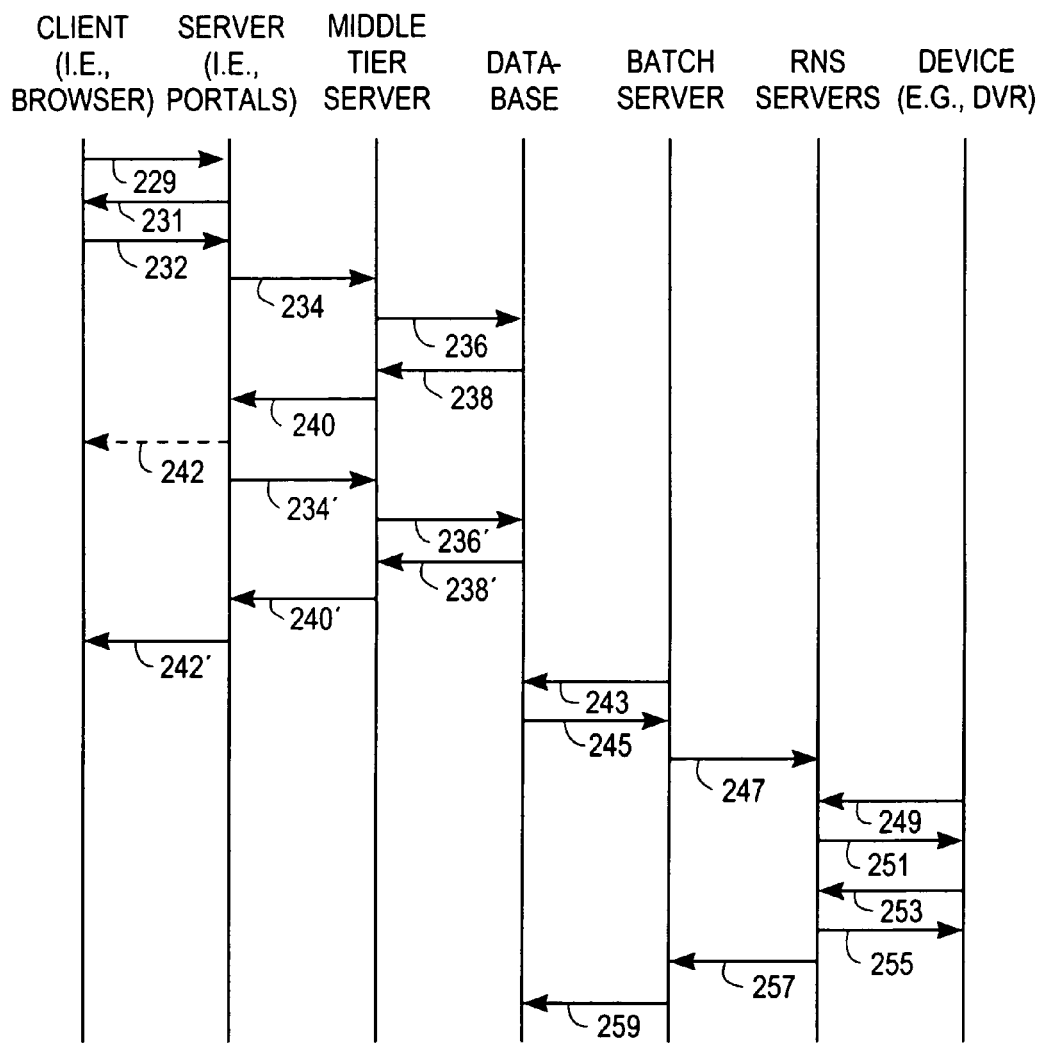
FIG. 13B is a sequence diagram of one implementation for login to the front end and for "batched" communication at the back end of the computer-based communications systems of FIGS. 2 and 5.

Reference will occasionally be made to the sequence diagram of FIGS. 13A-B when describing the "batched" mode implementation. Periodically, the DVR 37 dials 249, 253 into a network (e.g., Internet) to communicate with RNS servers 32, and requests the transaction file to be downloaded 251, 255 to the DVR 37. To facilitate this communication, DVR 37 includes a network application module 85 that generally controls the frequency and time that connections to the RNS servers 32 are made. The network application module 85 also controls what data is transmitted to and received from the RNS servers 32.

In one implementation, the DVR 37 can obtain requests from the RNS servers 32 by parsing a request list and creating a file for each request. The file can be appropriately named according to the contents, and can be formatted in XML. The request handler 154 is notified when new requests have arrived at the DVR 37. To perform these functions, and by way of example, when control line 34 and 60 are interpreted to be a network connection, like communicating with the Internet, DVR 37 can establish a point-to-point protocol (PPP) connection to the Internet to communicate via http commands with the RNS servers 32. DVR 37 includes a HTTP/PPP client module 156 as shown in the main memory module 78D of FIG. 4D, which under the control of the network application module 85, generally enables the DVR 37 to establish a PPP connection with RNS servers 32 by using a communications protocol for enabling dial-up access to the Internet. By doing so, http transmissions 253 may be made from DVR 37 to the RNS servers 32. More specifically, a PPP connection uses an Internet protocol that provides a standard way of transporting datagrams from many other protocols over point-to-point links, as is conventionally known in the art. A PPP connection between the DVR 37 and server 32 allows the connection over a regular telephone line, thereby enabling the DVR 37 to be a network participant. Module 156 can be provided with additional functionality to enable the PPP connection by establishing and terminating a session, in addition to hanging-up and redialing functions with the gateway to the Internet. From the perspective of each DVR 37 functioning as a client, there is one RNS server 32, namely corresponding to the URL rns.replaytv.net, by way of example. One benefit of the PPP connection is that it permits direct file transfers between DVRs 37 and servers 32, as opposed to transferring a file to a dial-up computer and downloading the file into the system. Alternatively, the PPP connection can be implemented on a full-duplex link by dialing into high-speed DS1 and DS3 lines.

The DVR 37 establishes a session 253, 255 with the RNS servers 32 to enable the transaction file to be downloaded to the DVR 37. For example, several exemplary features under the control of the network application module 85 include: (1) downloading the Channel Guide data from the front end 14*a*; (2) downloading the ReplayZone data from the front end 14*a*; (3) downloading new software upgrades from the front end 14*a*; and (4) uploading log file information from the DVR 37 to the front end 14*a*. One manner of implementing these four functions is for the DVR 37 to provide http requests to the RNS server 32, which in response uses a CGI-gateway to invoke Perl scripts that fulfill the requests received from the DVRs 37.

Upon receiving the transaction file, the DVR 37 includes a transaction handler module 152, as seen in FIG. 4D. The transaction handler 152 parses the transaction file into requests and calls a request handler 154 for each request.

The request handler 154 executes the request, checking for a possible conflict and returns a response for each request. Each of these responses can be formatted with XML in the same embodiment. The transaction handler 152 compiles the responses into a transaction response file and returns the file to a RTVS Communicator module 158. The RTVS Communicator module 158 functions to upload the transaction response file to the RNS servers 32 when the network application 85 controls the periodic automatic dial-up to the Internet to communicate with the RNS servers 32.

In a particular implementation, a set of routines may be included in the other applications 87. One such routine gets requests by parsing a request list under the control of the request handler 154 and creates a corresponding file. The information that may be contained in the request file can include a request identifier, the command to execute, and the target interface on which to perform the command. For example, the request file may contain a unique identifier associated with the command "AddReplayChannel" on the Replay Guide interface. When new requests arrive at the DVR 37, the request handler 154 is notified and processes each request and places the results in a "results" file. By way of example, the "results" file can be designed to include an indication of the success of the command for the unique identifier, the particular results generated by performing the command, and a timestamp associated therewith. It will be appreciated, that the described request and results files are merely exemplary and that other implementations would work suitably well with the present invention.

Various features that may be included in the other applications module 87 will now be described. Module 87 can be designed to accommodate a request to add a single show. This module is used to add record events as specified after checking for conflicts or free disk space availability. Table 1 below lists exemplary data that can be helpful in creating a data structure to be used by such a module.

TABLE 1

Start time
Duration (e.g., in minutes)
Encoder Quality Level
Source of Input of Show
Index of channel in Channel Guide
TMS ID used for sanity check
Indicator to force a raw record mode for time-based record requests
Indicator of a guaranteed record
Indicator to record all episodes
Indicator of the number of episodes The application module 87 can further include the capability to add a show-based Replay Channel using the quality and guaranteed status from the show. Based on the number of episodes and duration of the show, the calculation of available memory space 80 should preferably be performed. In addition to the exemplary data listed in Table 1, the following additional data can be included in the data structure: 1) the name of the Replay show to be added; and 2) the name of the Replay Channel to be added. This same combination of exemplary data can be used to accommodate a request received by the DVR 37 to add multiple shows.

When the request received involves adding a theme-based Replay Channel, application module 87 can include functionality to calculate available memory space 80, based upon the duration of the theme-based show, the encoder quality level, and the indicator of guaranteed values. Table 2 below lists exemplary data that is desirable in creating a data structure to be used by such a module.

TABLE 2

Name of Replay Theme
Name of Replay Channel
Duration (e.g., in minutes)
Encoder Quality level
Flag defining what is searched
Source of Input of Show
Indicator to force a raw record mode for time-based record requests
Indicator of a guaranteed record Requests received at the DVR 37 can also be directed to deleting scheduled record requests that are maintained in a record list. Accordingly, application module 87 can include functionality to delete a scheduled show from the record list on the Replay Channel. Table 3 below lists exemplary data that can be helpful in creating a data structure to be used by module 87 to provide this functionality.

TABLE 3

Start time
Index of channel in Channel Guide
Indicator to force a raw record mode for time-based record requests Application 87 can also include functionality to accommodate a request received at DVR 37 directed to deleting a Replay Channel. To enable this functionality, the Replay Channel id corresponding to a show should be provided in the request.

Furthermore, application 87 can include functionality that enables the user to change the parameters of the channel, like for example, the hours guaranteed. Once the parameters are changed, the Replay Channel is updated, including checking for conflicts and available memory space 80, providing notification of the success of the update.

Additionally, application 87 can provide functionality to change a static Replay Channel to a show-based Replay Channel. Exemplary data that can facilitate this function includes: 1) the name of the Replay show; and 2) the name of the Replay Channel.

Other functionality for application 87 includes accommodating requests received to obtain the Replay Guide from the DVR 37, as well as the Channel Guide. Given the described functionality of the application module 87, one technical advantage that will be appreciated by those skilled in the art is that the corresponding requests received at the DVR 37 may be treated as though originating from standard interactions, and incorporated into a "to do" list. Whether the pull, push or broadcast flow of data is used, the DVR 37 does not require added infrastructure, and thus additional custom software is not required.

E. An Exemplary Method for Batched Processing of the Communication System

The process of a preferred method for the user to control the DVR 37 or to access related information is now described. The process begins with user authentication on the Internet initiated by a user requesting a home page such as 180 shown in FIG. 11. Those skilled in the art will readily appreciate that a URL (Uniform Resource Locator) on the world wide web is utilized in order to locate the home page 180. If the user is a new user to systems 10A and 10B, he is provided the opportunity to register through a web server 28-1 . . . 28-n. For the user who has already registered, he may log in by entering personal information (e.g. user name 182 and password 184) from home page 180. More details of the authentication process are described later.

Once the authentication is successfully accomplished, the web server 28-1 . . . 28-n initiates one or more steps through the API to generate the first web page of information representing the user interface of DVR 37 that a user sees after login. An example of this first page of information is shown in FIG. 12A. It will be appreciated by those skilled in the art that this information may be generated based on state information, which may be indicated by a default value, by the system administration, or by the cookie information (i.e. information related to how certain web pages have been used in the particular browser stored in small data files, or cookies, residing locally in the browser computer) embedded in the HTTP request originating from the browser 18. For example, the information that is eventually returned to a user who has just completed the login process could include an EPG (electronic program guide of channels) as seen in FIG. 12A, a Replay Guide, a "find shows" page, and a "manual record" page. The latter are further described below.

FIG. 13A is a data flow diagram illustrating the process 230 of one method for a user to obtain information from and provide instructions to systems 10A and 10B. FIG. 13B is a sequence diagram illustrating further details regarding the data flow of FIG. 13A. Throughout this figure, data flow lines (used interchangeably with "steps") reflect an order in which part of the method is preferably practiced. In the description to follow, occasional reference will also be made to FIGS. 2 and 5. Before the process 230 of obtaining information from and providing instructions to system 10A and 10B begins, a user navigates to 229 a website for one of the servers 28-1, . . . , 28-n, which responds with an appropriate web page 231. The process 230 begins with the user login 232 into system 10A or 10B. A user enters identifying information, as for example, in the user interface 180 of FIG. 11. A user name and password are transmitted from the client browser to the database as indicated by steps 232, 234 and 236 in FIG. 13B. Once the user is authenticated with predetermined information on the database, a first page 190 of information such as an EPG as shown in FIG. 12A is formulated 240 from data received from the database 238, and is forwarded 242 to client browser 20. Such first page 190 of information, as well as subsequent pages, may include drop-down menus such as those illustrated in FIG. 12B, as well as buttons such as the "Go" button 192 seen in FIG. 12A. The user may select a desirable entry within each drop-down menu and/or click on the "Go" button 192 to invoke a command. Upon doing so, the browser 20 sends a HTTP request to an already connected web server such as 28-1, as shown in step 232. Those skilled in the art will recognize that the drop-down menu and button-driven features may be implemented in a variety of ways.

Once the HTTP request is received at server 28-1, the server 28-1 will initiate the appropriate steps, or make the appropriate function calls, within the context of the API on the middle tier server 40, as indicated in flow line 234. The step further involves communication 236 between the middle tier server 40 and the database 44. Flow line 236 illustrates the steps in which the middle tier server 40 obtains the requested information from or stores instructions into the database 44. One manner for doing so is with JDBC (Java DataBase Connectivity, otherwise known as the Java™ database API) wherein raw data is sent from the middle tier server 40 to database 44. The database 44 will return the requested data preferably, although not required, in a raw format to the middle tier server 40 as indicated by flow line 238.

The middle tier server 40 then assembles the retrieved data and updated information into formatted data, which are forwarded 240 to the web server 28-1. It is noted that the API on the middle tier server 40 includes that programmable logic to package (i.e., format) data received in a raw format into a form that is well-suited for flexibly defining data structures. One format that is advantageous is XML because it allows the tagging of data in a manner that is not tightly coupled together, thereby providing more flexibility in defining data structures. Other formats, though, will work suitably well with the described embodiments of the present invention, including HTML. The above step 240 is followed by step 242, whereby the server 28-1 in turn assembles and forwards a presentation, having a format that is well-suited for the client browser 20 (e.g., in HTML, Java, JavaScript), to browser 20. In an alternative embodiment, another format that works well with this presentation is WML (or Wireless Markup Language, an XML language used to specify content and user interface for wireless device such as mobile phone browser), provided that the system 10A and 10B is modified for wireless media client-server access when using WML. It will become readily apparent to those skilled in the art that the process steps shown in FIG. 13A are flexible in the nature of accommodating a variety of contexts related to user requests, e.g., requests for information and for recording specified programs. Steps 234', 236', 238', 240' and 242' indicate further communication between the client 18, server 28, middle tier server 40, and database 44, similar to those steps already described.

The middle tier server 40 enables communication between various web portals 28-1 . . . 28-n and the database 44 through an API, which facilitates the communication of user instructions and operations for controlling the DVR 37 with the front end 14a. One technical advantage of the API is that it allows a portal (e.g., 28-2) to cache information received from the middle tier server 40 locally within the environment of the particular portal such as 28-2 with a frequency based upon when a user is interested in the information. Furthermore, the API of the described embodiment of the present invention is flexible so as to permit a portal 28-2 to present the content of information from the middle tier server 40 in a manner that enables display of information using proprietary types of graphical user interfaces (i.e., GUIs) distinctive to those system administrators operating the particular portal (e.g., 28-2). Business logic (e.g., checking of time conflicts for recording, disk space) may be included in the middle tier server 40 to form a part of the API that provides a standardized mechanism for receiving requests forwarded from the portals 28-1 . . . 28-n, and for sending back a corresponding response.

In order for the web server 28-1, . . . , 28-n such as portal 28-2 to present the interactive television device data at the web browser 20, each web portal is enabled to use, copy, encode, store, archive, distribute, transmit, modify, translate, render into an audible format, publicly display and publicly perform the content received from database 44, in whole or in part in connection with the property of the web portals 28-1, . . . , 28-n. The API enables the web portals to allow users at the browser 20 to download and print or perform the content. This content includes the interactive television device data, like for example, a top watched shows list. The API of the described embodiments of the present invention permits the content to fit the format and look-and-feel of the particular web portal.

As evident from the above discussion, the API plays an important role in the front end of the described embodiments of the present invention. The API includes data structure definitions, functions that facilitate communication between the middle tier server 40 and the portals 28-1, . . . , 28-n, as well as a series of routines that retrieve and manipulate data in the database 44. A routine is defined to mean a callable algorithm or sequence of steps residing in and forming part of the API that can be invoked to perform various tasks involving communication with the database 44. The routines of the API may be invoked by the servers 28-1, . . . , 28-n to operate the DVR 37 or to access related information stored in the database 44. A list of such routines as implemented in the described embodiments of the invention is given in FIG. 14. The corresponding input parameters and output files are listed in FIG. 15. The names of the routines, and of the parameters and files, are designed to be indicative of their respective functions, most of which will become apparent to those skilled in the art. Some less intuitive terms have been previously described with the description of front end 14a.

Figure 16A:
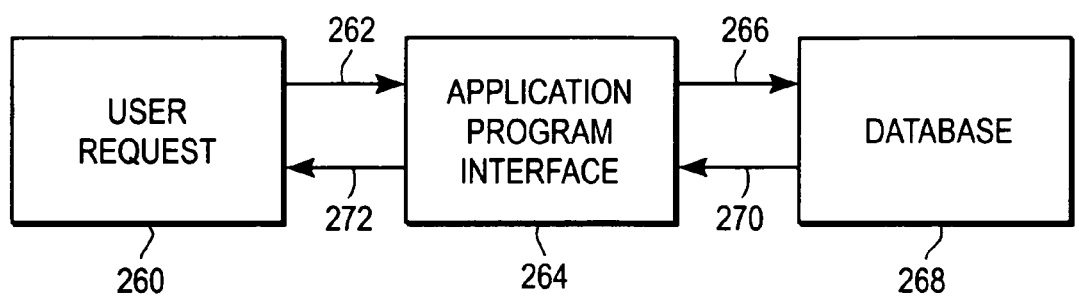
FIG. 16A is a high level illustration of one embodiment of the front end implementation in accordance with the present invention.

One aspect of the present invention is to enable a user to operate a media-based device 36 remotely by communicating with one or more databases through a computer network. Referring to an embodiment of the present invention shown in FIG. 16A, a user request 260 is first received and processed, for example, by a web server such as portal 28-2. The portal 28-2 translates the request into function call 262 to the API 264. The routines embedded in the API 264 are then invoked and the middle tier server 40 on which the API 262 is implemented proceeds accordingly to communicate 266, 270 with at least one database 268. This step 266 involves providing instructions to control the media-based device 36 and/or retrieving 270 related data from the database 268. The database 268 itself may be configured as a hub that is in communication with the media-based device 68 and other sources of information, which have been previously described in FIGS. 2 and 5. After all the routines called by the portal 28-2 are executed, the portal 28-2 responds to the user request by incorporating the results of the execution of the routines residing in the API.

Figure 16B:
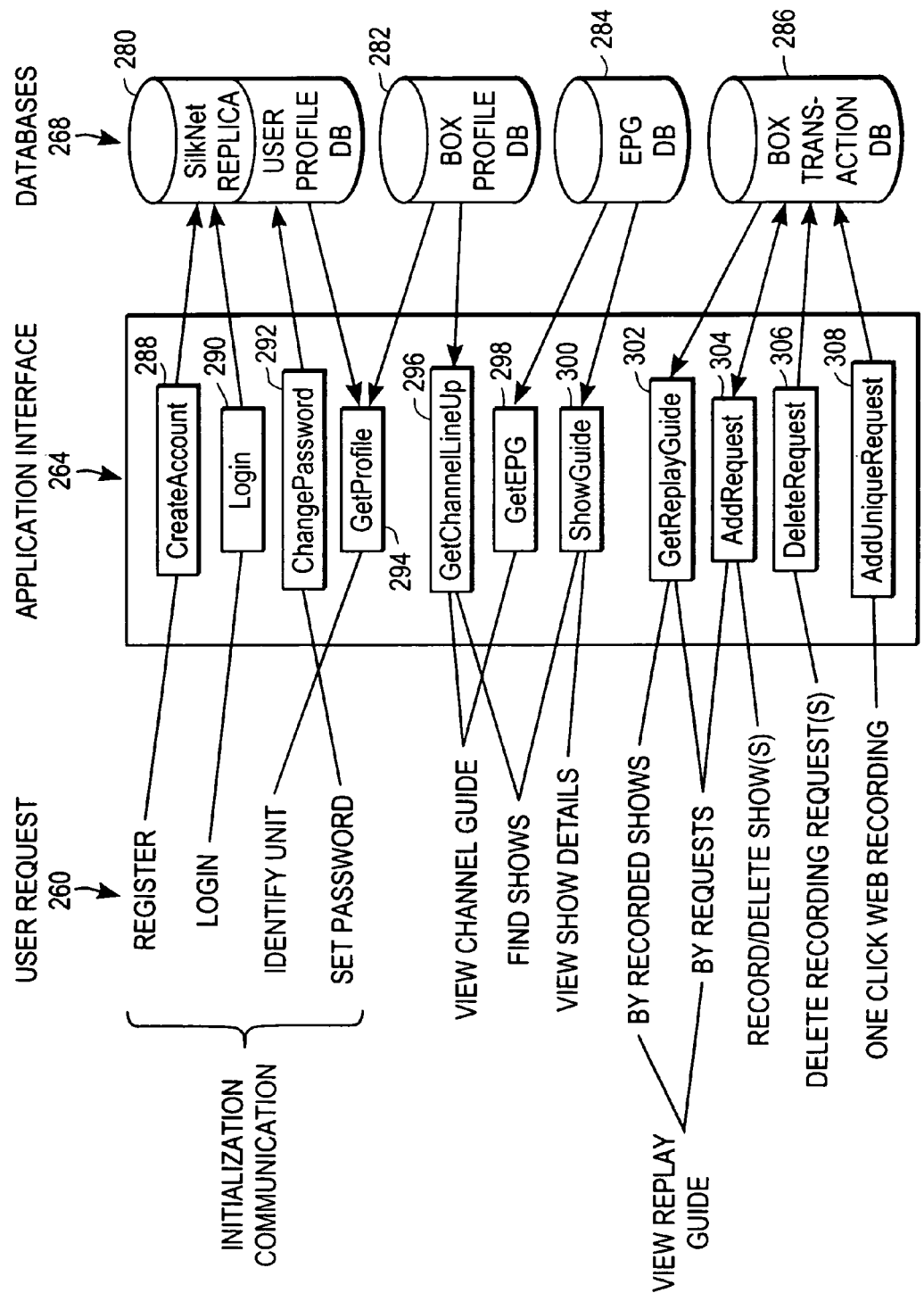
FIG. 16B is a data flow block diagram showing further details of API in the front end of FIG. 16A.

FIG. 16B illustrates on a high level how a web server, e.g., portal 28-2, may utilize the API routines to access and manipulate data in the databases 268 in response to various user requests 260 in accordance with one embodiment of the present invention. Note that database 44 in FIG. 2 and in FIG. 5 is merely illustrative, and that the embodiment shown in FIG. 16B, which illustrates four databases 280, 282, 284 and 286 each of which will be described below, works suitably well. The API routines 264 shown in FIG. 16B are designed to extract data from and to insert instructions into the databases 268. The predominant directions of data flows are indicated in the figure by the directions of the arrows connecting each routine to one or more databases. However, some parameters or exchange of triggering data is presumed to have occurred before any substantial amount of data is transferred to or from the databases 268. The database 280 contains information related to the user and comprises, for example, a replica of a commercial authentication database such as SilkNet™ and additional user profile data. This database is accessed by the API routines CreateAccount 288, Login 290 and GetProfile 292 that together authenticate a user and initialize communication between the user and the systems 10A and 10B, through the server 28-1 and the middle tier server 40. The box profile database 282 archives information related to individual media-based devices, including the respective channel lineups. This database 282 is accessed by GetProfile 294 as well as GetChannelLineUp 296 in response to a user request to view information related particularly to the DVR 37 that the user wants to operate. The EPG database 284 may either be a commercial database such as an online service 54 or a database containing already extracted information from a commercial source. This database 284 is accessed by GetEPG 298 and ShowGuide 300 to retrieve program information. Lastly, the box transaction database 286 includes information related to programs recorded by the DVR 37 and requests for the DVR 37 to record future programs. This database 286 exchanges information with the middle tier server 40 every time a request is made through the AddRequest routine 304, DeleteRequest routine 306, or AddUniqueRequest routine 308. It is also accessed in response to user requests to view related information through GetReplayGuide 302.

The GetEPG routine 298 provides the function of retrieving an EPG that has been customized for a particular user. One particular manner of doing so is for module 298 to accept user input from the instruction received from client 18, and to return a document of the user's EPG. By way of example, the user can include various identifiers, like the user id, the id of the particular DVR, the start time and duration of the EPG being requested, the staring channel, and the number of channels to be displayed.

The GetChannelLineUp routine 296 provides the function of retrieving the channel lineup of a particular DVR 37. This lineup may be retrieved if the user provides, for example, the user id and the id of the particular DVR 37. This information retrieved may depend on the availability of various program channels to the DVR 37 because of the service subscribed (e.g. cable or satellite disk service) and on the preference of the user who may have customize the lineup (e.g. by deleting certain channels). In some embodiments, a call to the GetChannelLineUp routine 296 may be embedded in the GetEPG routine 298 so that a single call to the latter can retrieve an EPG customized for a particular user as well as a particular DVR 37.

The ShowGuide routine 300 provides the function of retrieving the detailed description of a show as available, for example, from a commercial source providing EPG information (e.g. TMS feed), based on the user id, the id of the DVR, the start time, and the level of detail requested. Additionally, the routine 300 can search the detailed information of all available shows to find shows that fit the user's interest as suggested by attributes such as the show title, the actors, the director, etc. In that case, the user can provide the query criteria including attributes and word or phrase to match, and the ShowGuide routine 300 will return a list of shows as the search result. As for the GetEPG routine 298, the ShowGuide routine 300 may include a call to the GetChannelLineUp routine 296, depending on the implementation.

Figure 17:
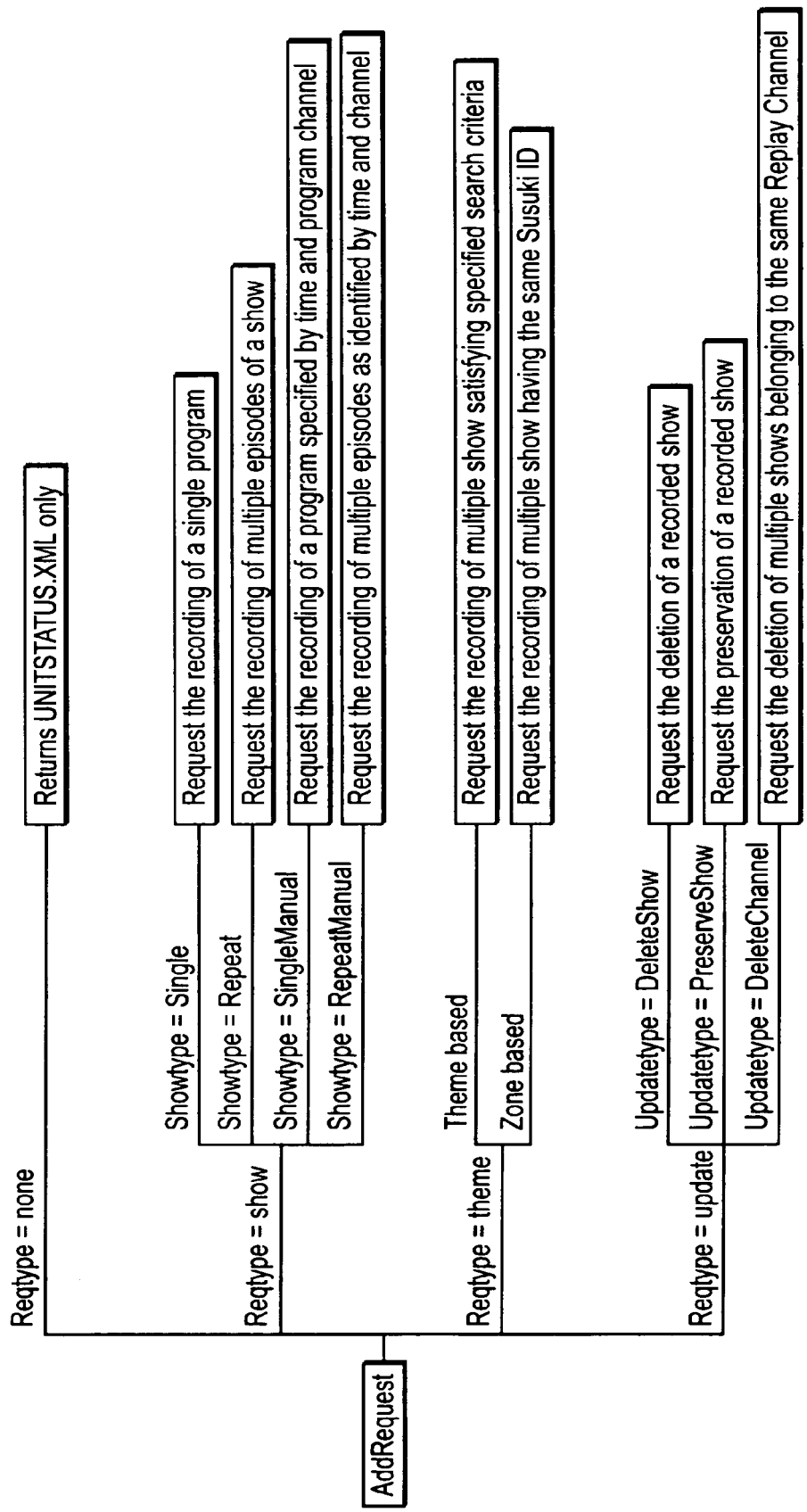
FIG. 17 is a chart illustrating the multiple requests handled by the AddRequest routine implemented as part of an embodiment of the API.

The function and mechanics of most other routines illustrated in FIG. 16B will become apparent to those skilled in the art in light of the description provided in FIGS. 14-15. However, the AddRequest routine 304 is now further described in FIG. 17, and includes a set of routines that allow the user to make different types of requests. As illustrated in FIG. 17, these requests may range from those simple for updating of the status of the DVR 37 (i.e., Reqtype=none) to those for program recording (Reqtype=show or Reqtype=theme) and deletion (Reqtype=update). The recording requests can be specified by show or by time and program channel (i.e. manual recording requests). They can also be based on themes corresponding to specific search criteria or corresponding to ReplayZones, as for example identified by Suzuki identifiers.

The above discussion outlines a basic structure for the front-end 14a operations of an embodiment of the present invention. This structure provides a web server such as portal 28-1 with a series of options for responding to requests made by users. These options are based on the API 264 implemented preferably in the middle tier server 40. In what follows, several exemplary methods to invoke the various routines will be described, taking into account elements of user interface design. For example, reference is made to the Channel Guide, as illustrated in FIG. 12A. A user presented with this page 190 may view the Channel Guide for different time span and different set of channels. He can either jump to the desirable time and channel by selecting the appropriate options in the menu bars 194, 196, and 198, and select the "go" button 192, or he can navigate through the Channel Guide using the buttons 195 and 197. Once the user sees a show of interest to him, he may select that show and access a pull-down menu such as 218 in FIG. 12B to see detailed description of the show or to record the selected show. He may also search for other shows similar to the selected one and/or record them as he wishes.

Figure 18:
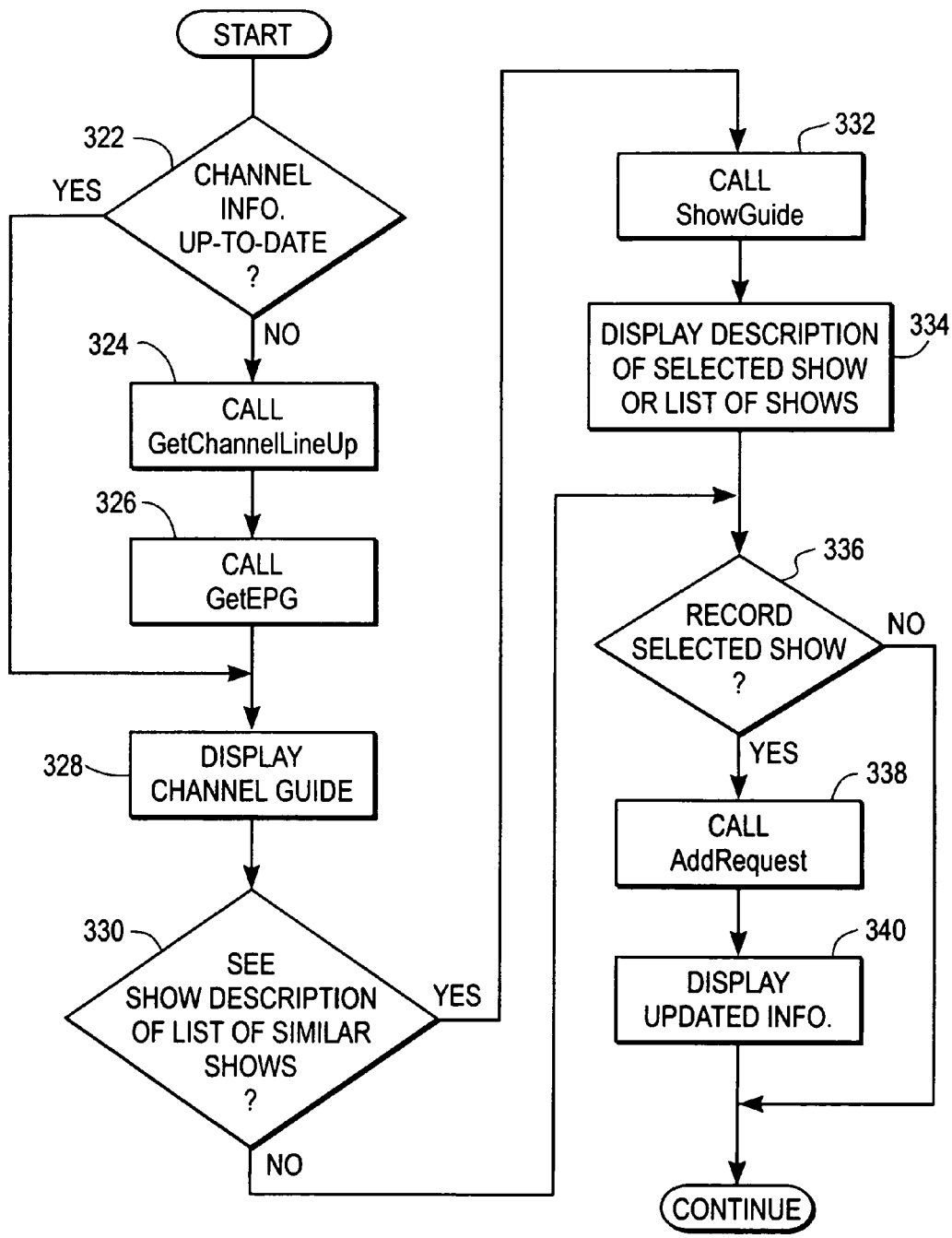
FIG. 18 is a flow chart illustrating one embodiment of a method of implementing the mechanism to respond to user requests based on the user interface of FIG. 12A.

FIG. 18 is a flow chart illustrating an exemplary method 320 for a web server such as 28-1 to respond to user requests with the anticipation that the user may take any of the above-described actions. The web server 28-1 first verifies 322 that the Channel Guide is up-to-date, in which the information displayed is synchronous with information contained in the appropriate databases being accessed that store such information. Note, however, that such information may not be current because, at least in the batched processing mode, the databases only communicate with the DVR 37 at periodic time intervals. If the web server 28-1 determines (YES branch of 322) that it possesses up-to-date channel information, the Channel Guide is displayed 328. If not, the server 28-1 calls 324 the GetChannelLineUp routine 296 and calls 326 the Get EPG routine 298 to update the information before displaying 328 the Channel Guide. The channel lineup is specific to each DVR 37 and is required as a filter for the EPG data, so that information concerning programs not available to the DVR 37 are screened out. The user can navigate the Channel Guide, as described above, until he chooses to do one of several things. For example, if he requests 330 to see detailed description of a show or to find similar shows, the web server in response invokes 332 the ShowGuide routine 300 and displays 334 the information retrieved. If, on the other hand, the user chooses 336 to record selected shows, then the web server 28-1 will call 338 the AddRequest routine 304 and display 340 the updated information, which may indicate, for example, that the request has been processed or that there is no space left in the DVR 37 for such recording. Depending on the implementation, the updated information may be presented in a modified Channel Guide as shown in FIG. 12A, or in a Replay Guide as shown in FIGS. 19A-B.

Figure 12B:
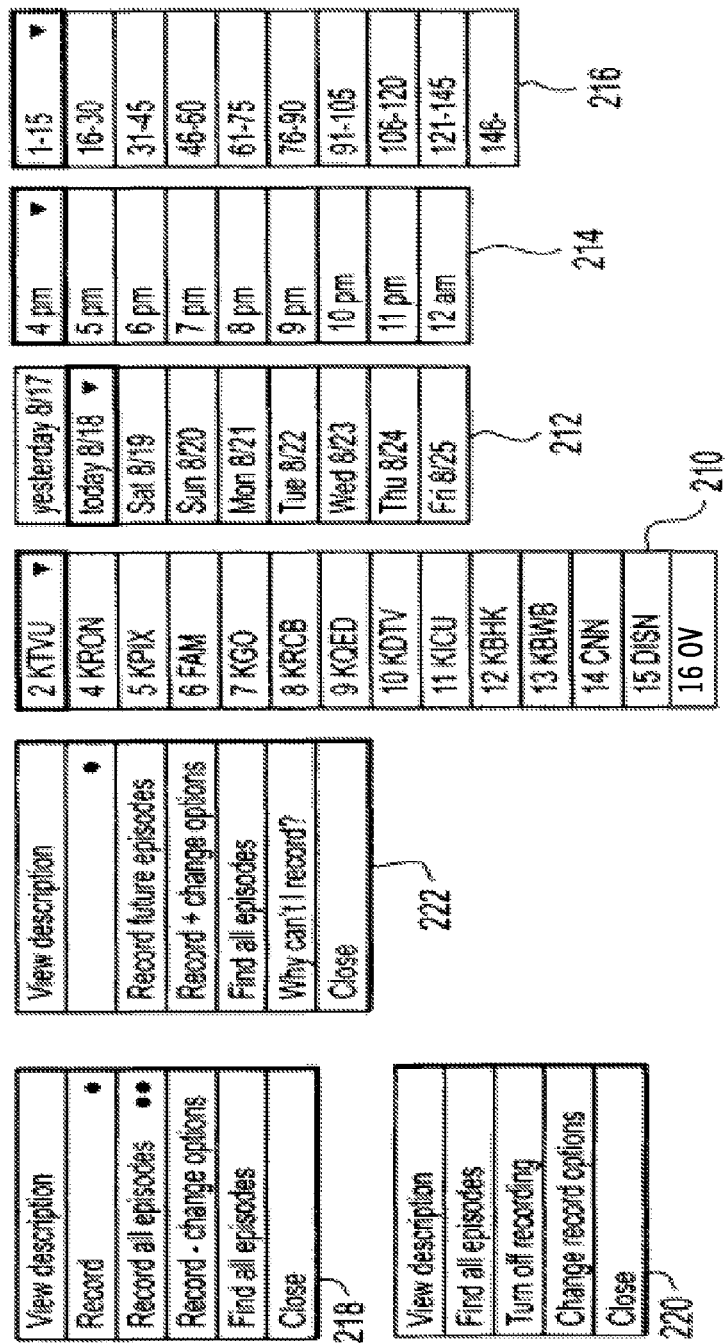
FIG. 12B is an exemplary graphical representation of drop-down menus for the user interface of FIG. 12A.

It must be emphasized that the ways in which the server 28-1 may accommodate the user and the options available to the user depend on the implementation of the user interface. The method in FIG. 18 and the options discussed above, for example, correspond to the channel lineup display implemented according to FIG. 12A, including the drop-down menus as illustrated in FIG. 12B. A different implementation of the user interface will result in other request options available to the user. For example, implementing the drop-down menu 220 or 222 will allow the user to change the recording options in the channel lineup display page. The same dependence on the user interface implementation applies to all the exemplary methods and the corresponding flow charts discussed below.

The Replay Guide shown in FIGS. 19A-B illustrate one method to present the Replay Guide information. The presentation 350 in FIG. 19A shows the information as organized by Replay Channels, which may be based on individual shows or on specific themes, as discussed above. An alternative way to present the Replay Guide information is shown in FIG. 19B, where the recorded shows are displayed in a Replay Show page. In either case, one main option available to the user is to delete one or more shows. In the case of the presentation of FIG. 19B, another option is to delete one or more requests to record future shows. Again, the actual implementation of the Replay Guide determines what options are available to the user.

Figure 20:
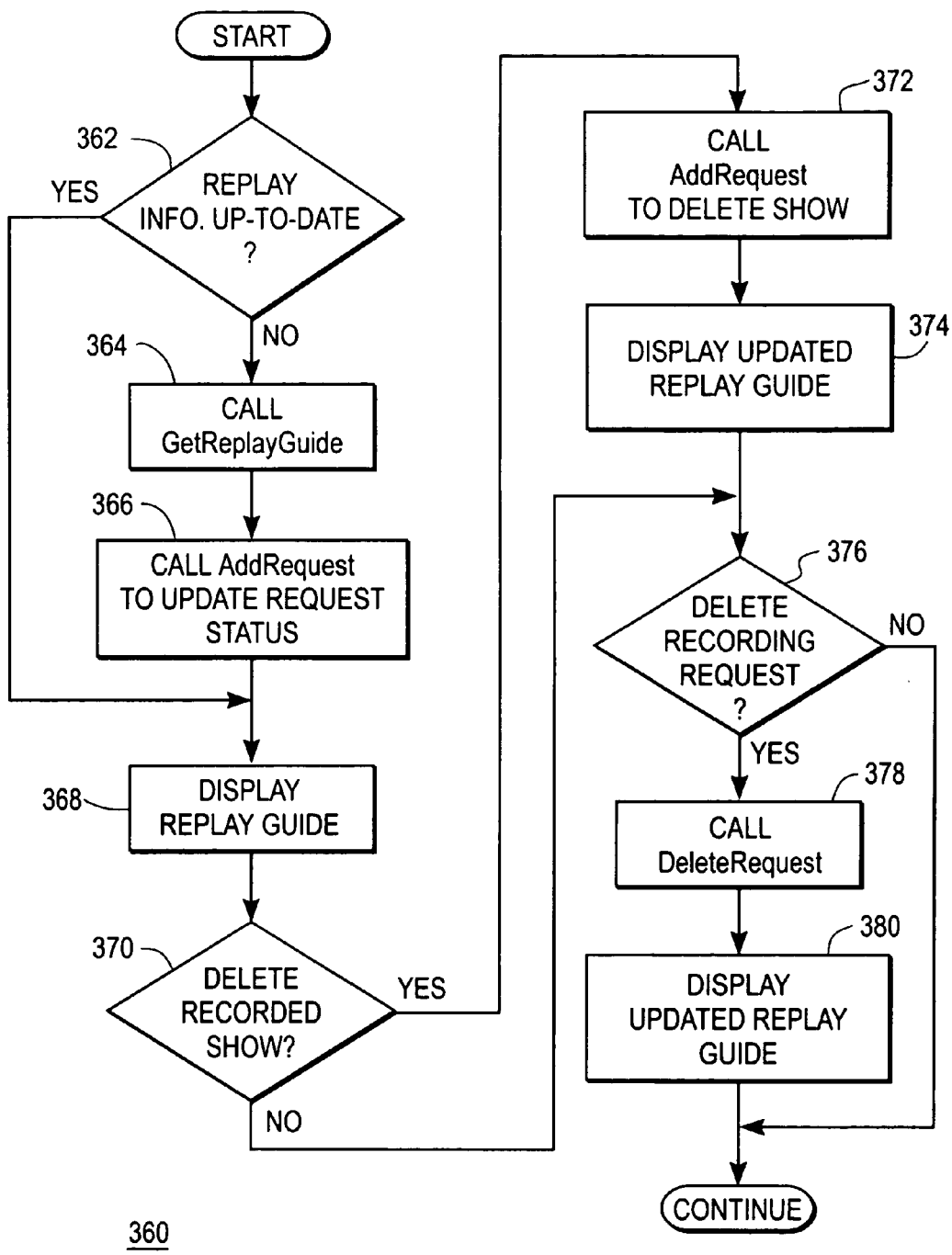
FIG. 20 is a flow chart illustrating one method of implementing the mechanism to respond to user requests based on the user interface illustrated in FIG. 19A.

FIG. 20 is a flow chart illustrating an exemplary method 360 for the web server 28-1 to respond to user requests in correspondence with the presentation of the Replay Guide information as shown in FIGS. 19A-B. The web server 28-1 first determines 362 if it possesses up-to-date Replay Guide information. If not, it invokes the API routines GetReplayGuide 302 in step 364, and AddRequest 304 (with Reqtype=none) in step 366 to update the information. Calling the latter routine is necessary if there are previously pending requests that may or may not have been fulfilled by the time the Replay Guide information is requested. Once the Replay Guide information is displayed 368, the web server 28-1 may entertain requests from the user to delete previously recorded shows or to cancel previous requests to record future shows. If deletion of recorded shows is requested 370, the server 28-1 calls 372 AddRequest 304 (with Reqtype=Update and Updatetype=DeleteShow or DeleteChannel) to forward the request to the box transaction database 286. An updated Replay Guide is then displayed 374. If cancellation of pending requests is requested 376, the server 28-1 calls 378 DeleteRequest 306 to accomplish the cancellation and then displays 380 the updated Replay Guide. In this situation, pending requests are those requests residing in the database 44, and in general, a response from the DVR indicating that the request has been processed has not yet been processed by server 48 nor received by database 44. In each case, the box transaction forwards the request to the DVR 37 in a batched process, for example, in the next pre-set periodic connection session.

Figure 21:
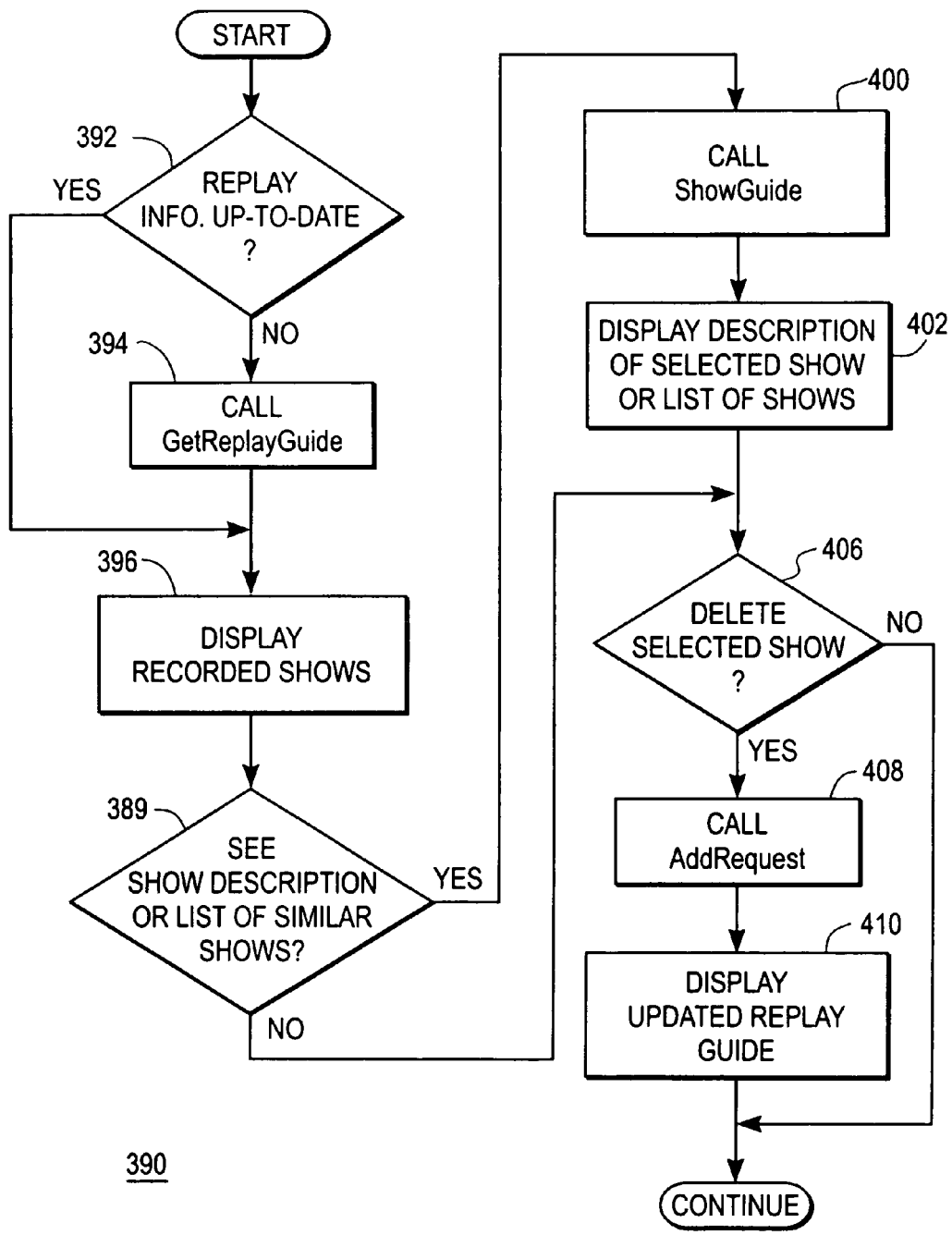
FIG. 21 is a flow chart illustrating one method of implementing the mechanism to respond to user requests based on the user interface illustrated in FIG. 19B.

The flow chart of FIG. 21 corresponds to the case when the Replay Guide information is presented in the Replay Show form illustrated in FIG. 19B. In this case, a method 390 where a user may request the deletion only of recorded shows since he does not have access to the pending requests. First, the web server 28-1 determines 392 whether it possesses up-to-date Replay Guide information. If not, GetReplayGuide 302 is called 394 before the Replay Guide in the form of FIG. 19B is displayed 396. The user may request 398 to see the detailed description of a show listed in the Replay Guide or to see a collection of similar shows. If so, the web server 28-1 calls 400 the API routine ShowGuide 300 to retrieve the information and displays 402 the result. If the user requests 406 the deletion of a selected show from the list of recorded shows, the server 28-1 calls 408 AddRequest 304 (with Reqtype=Update and Updatetype=DeleteShow or DeleteChannel) to forward the request to the DVR 37 through the box transaction database 286.

Figure 23:
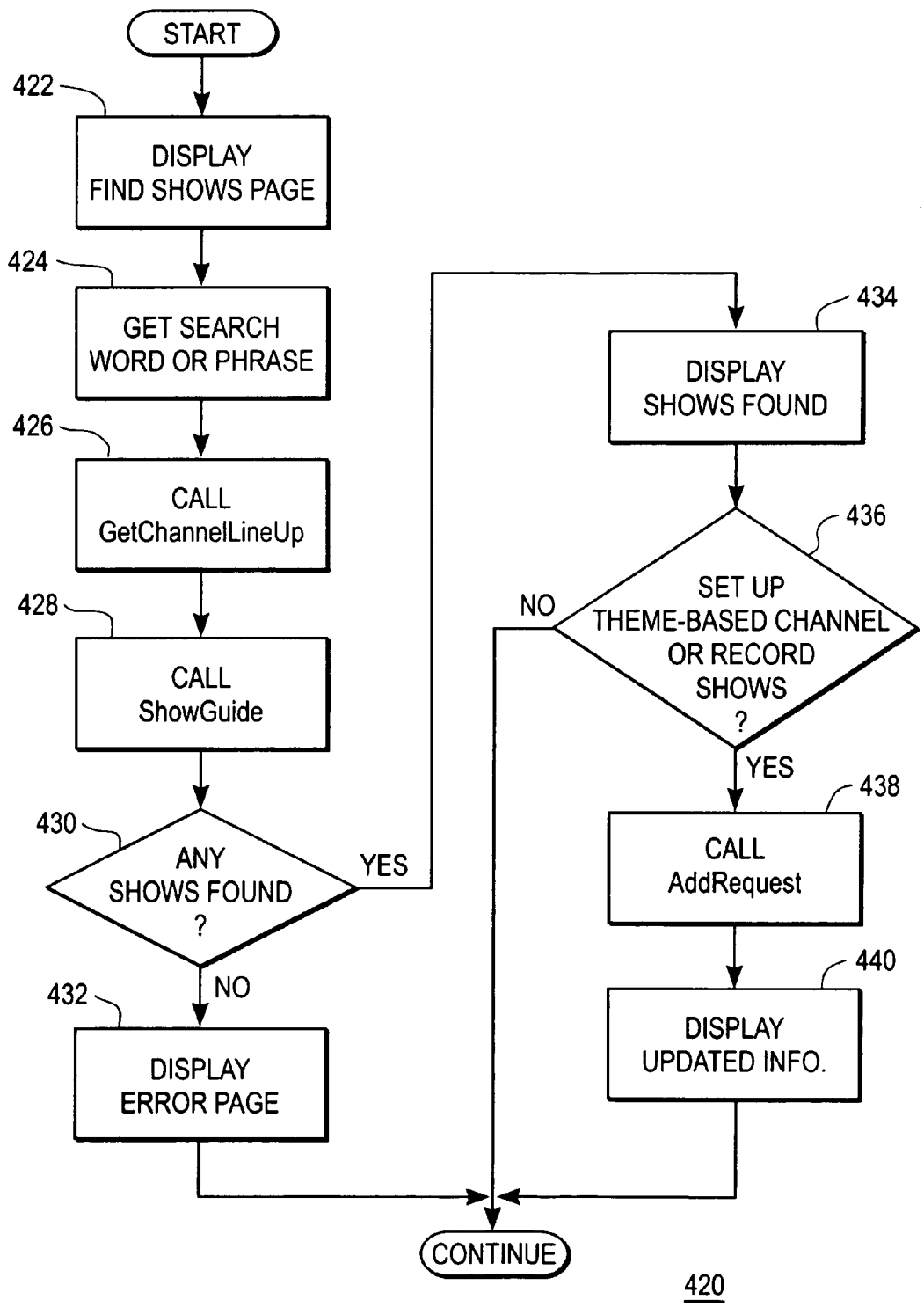
FIG. 23 is a flow chart illustrating one method for implementing the mechanism to respond to user requests based on the user interface illustrated in FIG. 22.

FIG. 22 shows a "find shows" page that allows the user to search for shows based on specified criteria. In the exemplary implementation shown, the user types in a search word or phrase and specifies which fields (e.g., show title and description fields) to search for the word or phrase. FIG. 23 illustrates the corresponding implementation of a method 420 for the web server 28-1 to respond to user requests initiated from this find shows page. After displaying 422 the find shows page and receiving 424 the search word or phrase from the user, the server 28-1 calls 426 the GetChannelLineUp 296 and calls 428 the ShowGuide 300 routine to effect the search. If one or more shows are found 430 that conform to the search criteria, the result is displayed 434 so that the user may request 436 to set up a Replay Channel based on the theme as defined by the search criteria, or to record one of the shows listed in the search result. Once such a request is made, the server 28-1 invokes 438 the AddRequest routine 304 to forward the request to the box transaction database 286 which is in communication with the DVR 37, and displays 440 the updated information. In the case when no show is found 430 to satisfy the search criteria, an error page is displayed 432.

Figure 24A:
FIG. 24A is an exemplary graphical representation of a user interface for indicating a single recording on the manual record page.
Figure 24B:
FIG. 24B is an exemplary graphical representation of a user interface for repeated manual recording.
Figure 25:
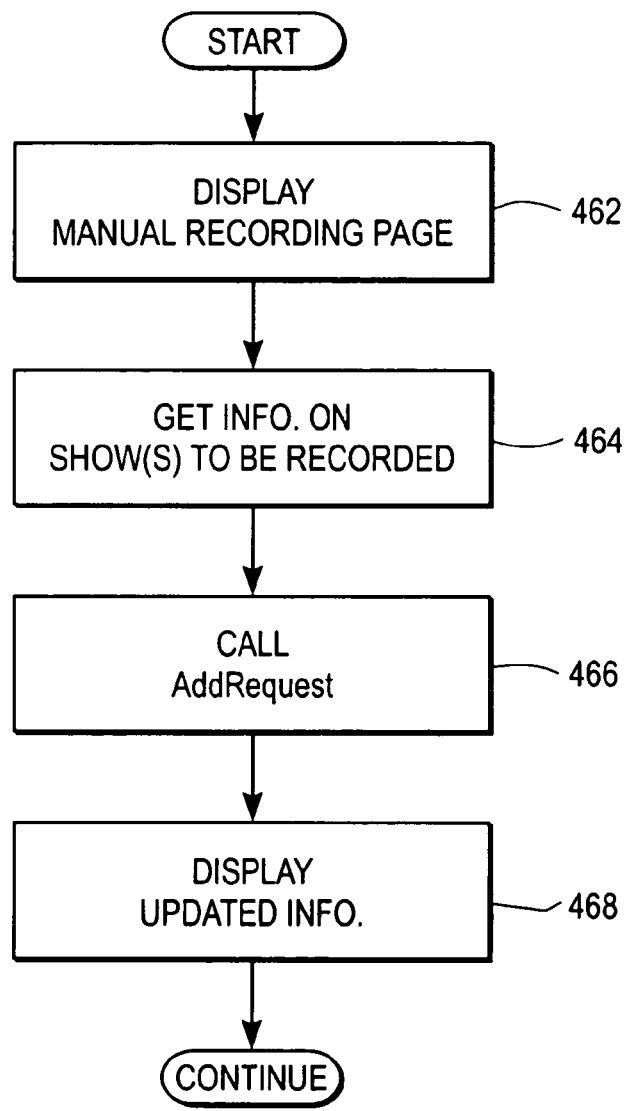
FIG. 25 is a flow chart illustrating one method for implementing the mechanism to respond to user requests based on the user interface illustrated in FIG. 24A.

Next consider the example "manual record" page shown in FIGS. 24A-B. From this page 450 in FIG. 24A, a user can specify the date and time of a future recording session, as well as the program channel from which the DVR 37 should be recording. Although not shown, an alternative implementation of the manual record page 452 in FIG. 24B may allow the request of repeated recordings at a specified time on selected days of the week. As illustrated in FIG. 25, a method 460 for displaying the manual record page is shown. The server 28-1 first displays 462 the manual record page and receives 464 the required information for processing the manual recording requests. Then, it calls 466 the AddRequest routine 304 (with Reqtype=show and Showtype=SingleManual or RepeatManual) to forward the request to the DVR 37 through the box transaction database 286 and returns 468 updated information to the user.

Figure 26:
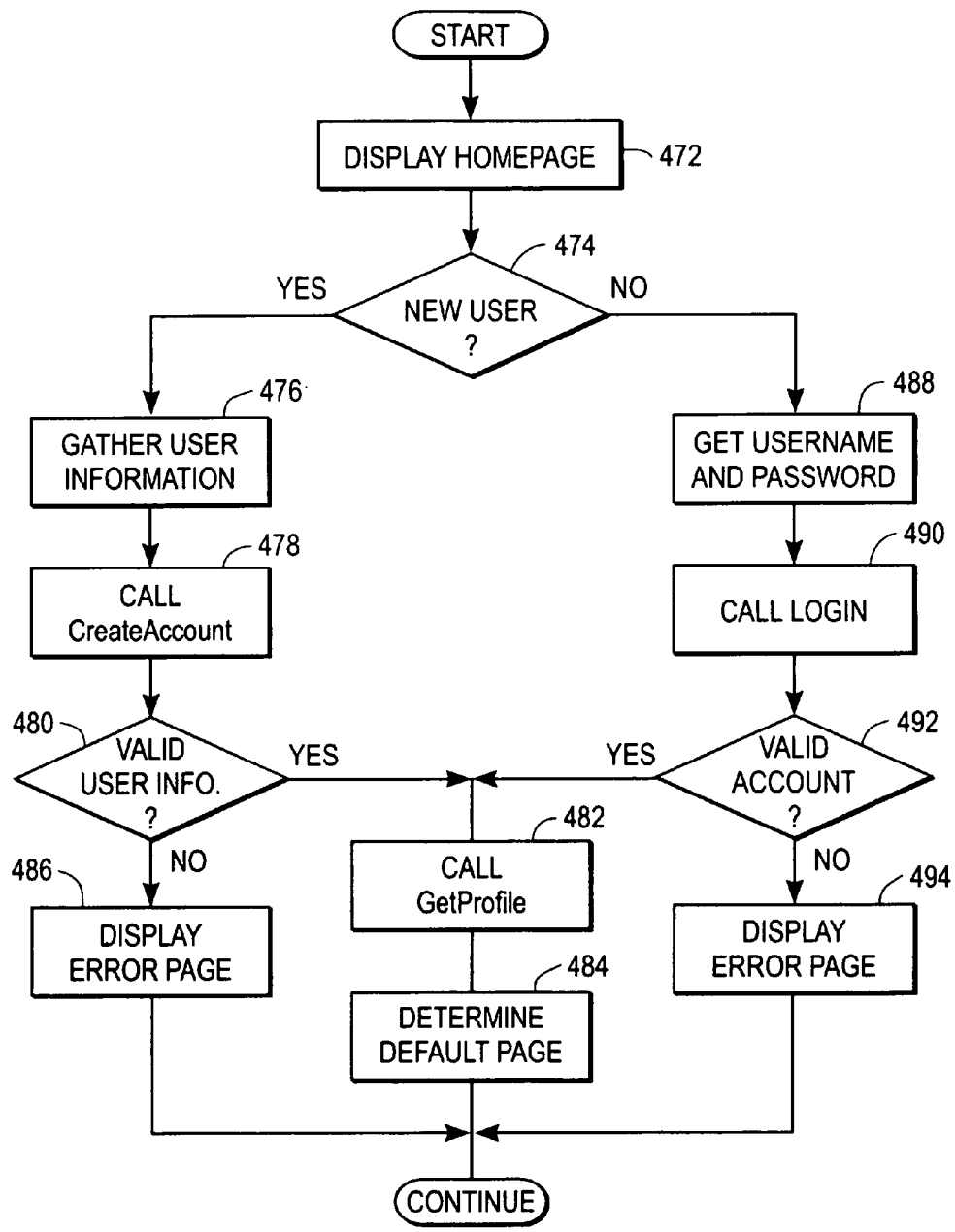
FIG. 26 is a flow chart illustrating one method for implementing the user login process.

Rounding up this discussion of exemplary methods for the web server 28-1 to respond to user requests, a preferred method 470 for implementing the user login to systems 10A and 10B is illustrated in FIG. 26. The flow chart in FIG. 26 represents a method that may be used with any web based services. A homepage is displayed 472, followed by a determination 474 of whether the user is a new user initiating the communication. For information gathered 476 on a new user, the web server 28-1 calls 478 the CreateAccount routine 288. If the user's input information is valid 480, then a call 482 is made to GetProfile 294, from which a default page 484 is determined, otherwise an error page is displayed 486. For information in the nature of a username and password is gathered 488 for an existing user, a call 490 is made to the Login routine 290. Upon authentication 492 of the user information, the server 28-1 determines the default page 484 (e.g., an EPG guide) to display next after calling 482 the GetProfile 294 routine. Otherwise, an error page is displayed 494.

F. An Exemplary Method for One Click Web Records

Figure 33:
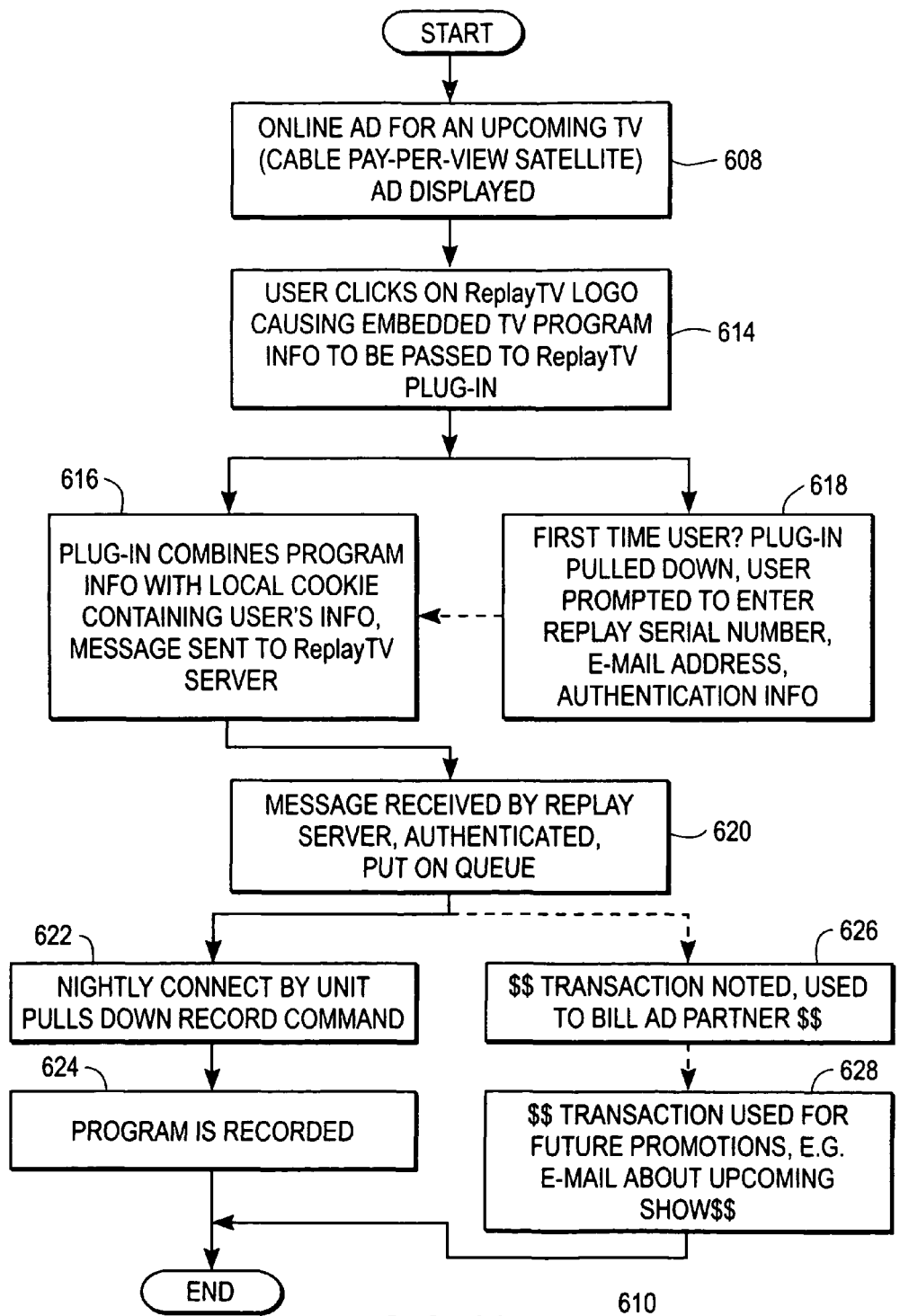
FIG. 33 is a flow chart of one embodiment for performing the process steps of the one click web records function.

Referring to FIGS. 32-33, one embodiment of the process steps 610 for implementing the one click web records feature of the present invention will now be discussed. Client 18 works with communication system 10A to seamlessly access a server 28, and an appropriate web page of interest. FIG. 32 shown a graphical representation of a user interface of a web page 604 that can be generated by one of the web servers 28 in FIG. 2. The web page 604 includes an advertisement 608 of upcoming television programming to-be-aired, along with a hyperlink 600. The hyperlink 600 is embedded in the web page 604 and may include a URL for a service provider of online Internet access to DVRs 37. For example, one such URL can be www.myreplaytv.com. Selecting 614 hyperlink 600 in general causes the DVR 37 to schedule the particular television program to be recorded, as will be described in more detail subsequently. In particular, when a user clicks on hyperlink 600, embedded information about the advertised television program is transmitted to a plug-in, for example, the front end application 94 of FIG. 4B.

Also in response to selecting a hyperlink 600 or hypertext, a message 602 may be generated to confirm that the program of interest is scheduled to be recorded on the user's DVR 37.

Front end application 94 generates 616 an HTTP command combining the information about the advertised television program with user identification information prior sending the HTTP command from server 28 to the middle tier server 40. This combination of information may be implemented in several ways. For example, in one embodiment, a cookie residing on client 18 may contain user information in the nature of a user id and a unit serial number for the DVR 37 associated with the user id. Server 28 may include Java code sent from server 28 to client 20 to determine if the such cookie information exists and to obtain the cookie. It is assumed that the user has previously registered such user information with the service provider of system 10A, and that such user information is stored in a profile on database 44 and deposited on client 20 in a file, such as a cookie. Upon sending the HTTP command from server 28 to the middle tier server 40, the process steps of FIG. 26 may be undertaken to authenticate user login of system 10A.

Figure 11:
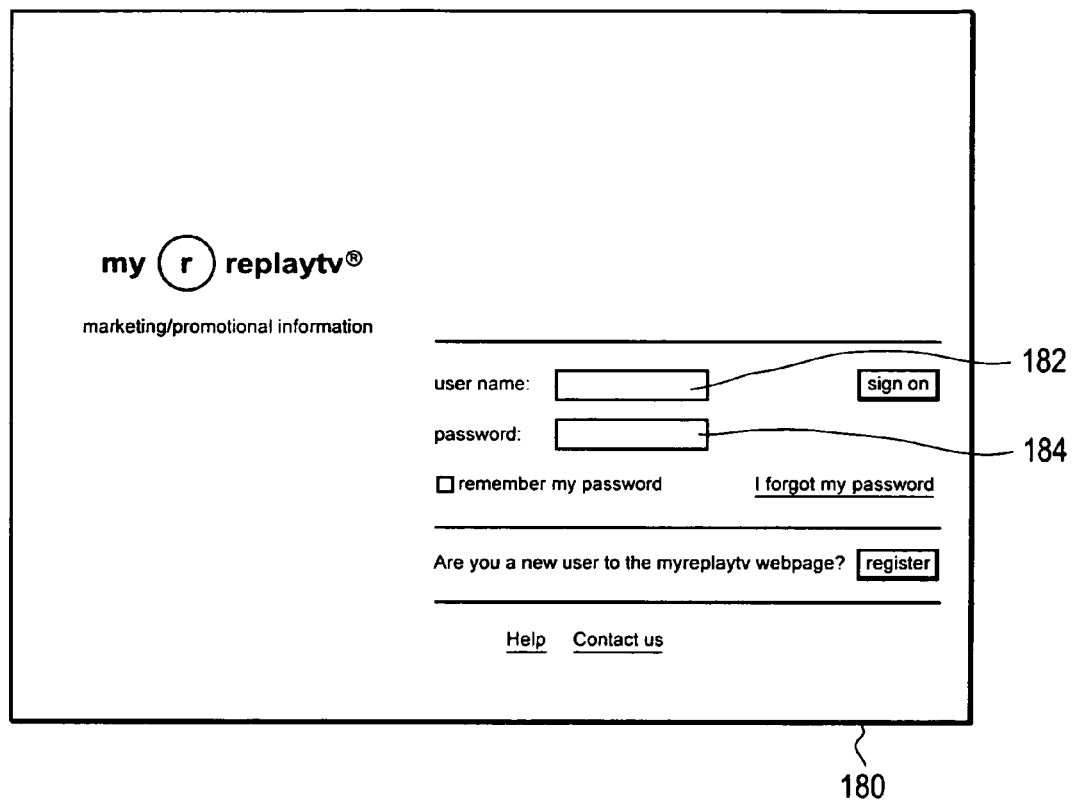
FIG. 11 is an exemplary graphical representation of a user interface for logging into and accessing the computer-based communications system of the present invention.

Alternatively, front end application 94 may automatically navigate the user to a user login screen, similar to that shown in FIG. 11. This alternative is well-suited for the situation where a first time user never used system 10A. Accordingly, system 10A prompts 618 the user for identification information. Referring to FIG. 16B, the CreateAccount routine 288 would thereby be invoked. Upon login using the Login routine 290 and interface 180, server 28 provides the middle tier server 40 with the program information required to record the program of interest. For example, this information preferably includes the date, start time, end time, and channel. This information is generally necessary so that AddRequest routine 304 can be invoked.

In yet another alternative, server 28 includes the user information locally and front end application 94 extracts the user information and combines it with the program information to form the HTTP command sent to middle tier server 40.

In step 620, once the middle tier server 40 has received and authenticated the user (e.g., Login routine 290, and GetProfile routine 294), it proceeds to store the program information on database 44 along with an instruction to record the shown. The methods described herein can be used by systems 10A and B to download the record command from database 40 to DVR 37 in either the batched or real time modes described herein. Steps 622 and 624 represent those steps described herein for database 44 communicating with DVR 37 to record a program through the batch request server 48 and the RNS server 32.

In FIG. 16B, an AddUniqueRequest routine 308 can be provided to detect whether a user has previously instructed the DVR 37 to record the particular program of interest. If so, then future attempts at selecting hyperlink 600 should be voided transactions, and an indicator message might be sent to the client to notify the user that the program of interest is already scheduled to be recorded.

Still referring to FIG. 33, step 626 represents the function of tracking the partners associated with a web site 28 invoking the one click web records function. By way of example, such partners may include online aggregators (e.g., YAHOO, GO, GIST, TVGuide), online broadcaster (e.g., HBO, NBC, and FOX), online program production studios (e.g., MGM), and online video providers (e.g., RealNetworks, Broadcast.com). In step 626, the tracking of such activity may be used to generate revenue from the respective partners, for example, on a per-site (i.e., flat fee) basis, or on a click-through basis. Step 626 includes those administrative steps to periodically bill the partner for use of the one click web record service. These administrative steps may be done via a variety of ways, including transmitting bills electronically and by other conventionally known ways.

Process 610 also includes step 628 where additional revenue opportunities can be derived for both the service providers of the Internet television advertisements and of the Internet access to controlling a DVR 37. For example, the partners may derive revenue as a result of a user using the one click web record feature of a particular website (transaction), such as that shown in the user interface of web page 604, to the extent that this transaction is tracked to the user engaging ancillary services as a result of the transaction. For example, if the website shown in user interface 604 also sells online goods and services, and the user purchases such promotional goods and services offered by the web page 604 on server 28, as a result of advertising 608 and of using the one click web records feature, step 628 represents that a percentage of the sale can be attributed to the service provider offering online Internet access and control of DVR 37.

Figure 1B:
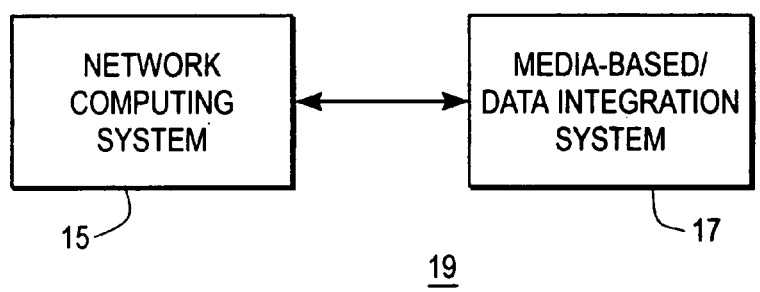
FIG. 1B is a high-level block diagram of an alternate embodiment of the computer-based communications system of FIG. 1A.

2. An Embodiment for Remote Control of Media-Based Devices and Appliances Through on-the-Fly (Real Time) Processing Referring now to the block diagram of FIG. 1B, there is shown another example of a computer-based communications system 19 that enables the remote control of media-based devices and appliances over a communication network in accordance with the present invention. In the example of FIG. 1B, communications system 19 includes a network computing system 15 coupled to a media-based/data integration system 17 (referred to as "integration system 17"). The network computing system 15 enables multiple users to communicate over a communications system 19 in order to access and control the media-based devices and appliances of integration system 17 from a remote location. Integration system 17 enables the media-based devices to be accessed through the communications system 19, thereby further enhancing stand-alone capabilities of the devices and appliances.

Figure 27:
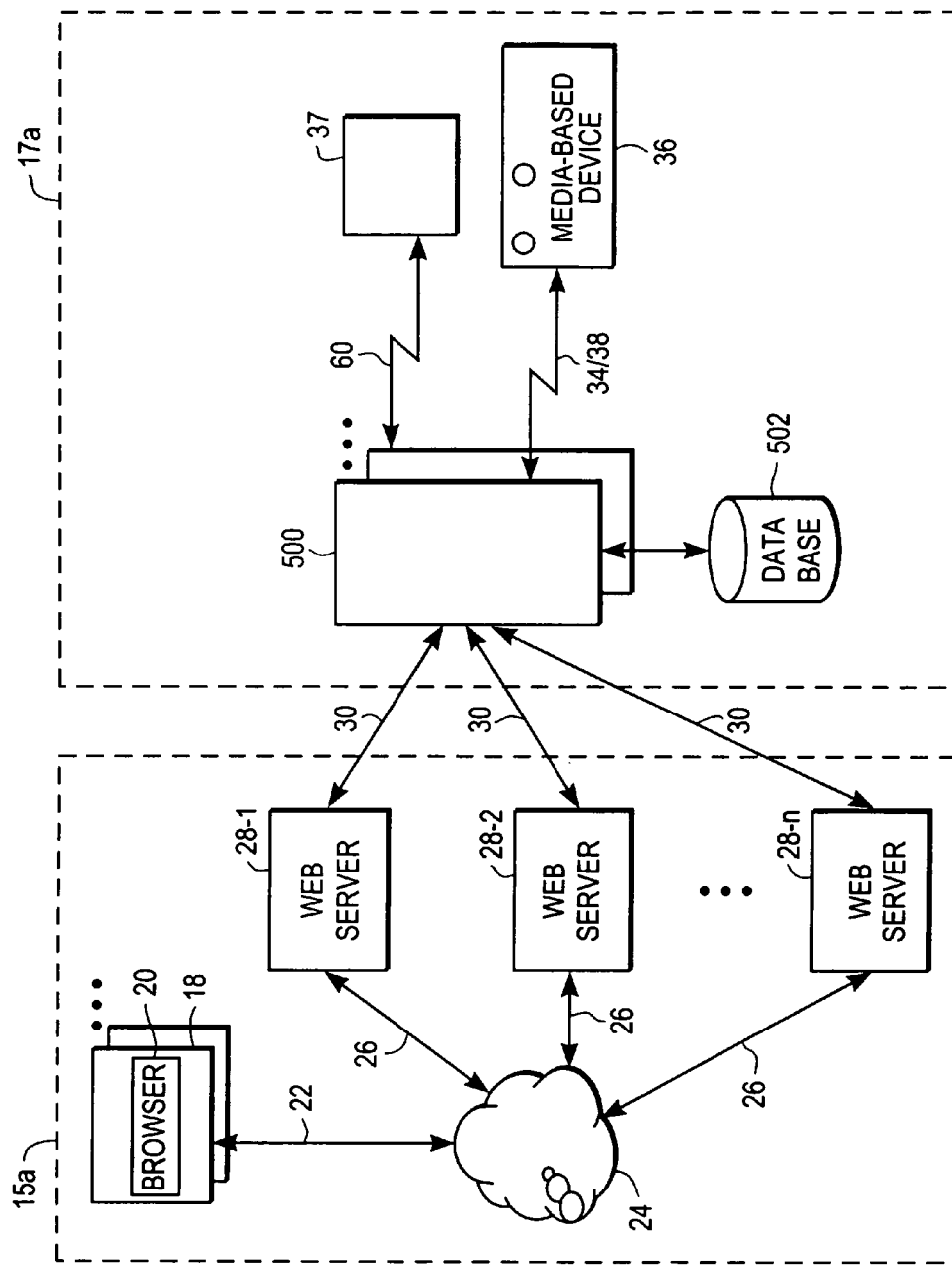
FIG. 27 is a block diagram showing further details of an embodiment of the computer-based communications system of FIG. 1B in accordance with the present invention.

FIG. 27 shows a block diagram of one embodiment of a communications system 19A having further details of the communications system 19 of FIG. 1B. In the embodiment shown in FIG. 27, communications system 19A includes a network computing system 15a coupled to an integration system 17a. In particular, and by way of example, network computing system 15a and integration system 17a are both based on a client-server computer model as will be discussed below.

A. Exemplary Embodiment for the Front End and Back End Sub-Systems

Referring to FIG. 27, an alternative embodiment of a communications system 19A is shown. One technical aspect of this embodiment allows a browser 20 on client 18 to communicate 22 over a network 24, such as the Internet, to a media-based device 36 with near real-time communication response. In this embodiment, the front end subsystem 14a and backend subsystem 16a have been modified to relocate the logic therein into a middle tier server 500 within integration system 17a. By doing so, the network computing system 15a and the integration system 17a can be embodied as two client-server subsystems, which are communicatively coupled together. Network computing system 15a includes one or more client computers 18 preferably having web browser 20 running thereon. System 15a further includes one or more server computers 28-1, . . . , 28-n, which are in communication with network 24, as indicated by lines 26. For convenience and ease of understanding the invention, like reference numerals of FIGS. 2 and 5 have been used in FIG. 27.

Integration system 17a includes media-based devices 36 and DVRs 37, which are communicatively coupled to one of a plurality of middle tier servers 500 via a communications link 60, 34 and 38. DVR 37 and media-based devices 36 and servers 500 operate in a client-server relationship. The servers 28-1, . . . , 28-n are in communication with the servers 500 as indicated by data flow lines 30. One or more databases 502 are coupled to servers 500. Database 502 is similar to database 44 in the nature of storing a compilation of data from various online and web hosted sources similar to sources 44, 50, and 54, although this is not shown explicitly in FIG. 27. Furthermore, client computers 18, servers 28-1 through 28-n, and media-based device 36 (and DVR 37) include similar exemplary hardware as described previously with regard to FIGS. 4A-D. Accordingly, a detailed discussion of each of these devices is not provided so as to focus on other aspects of system 19A.

Figure 28:
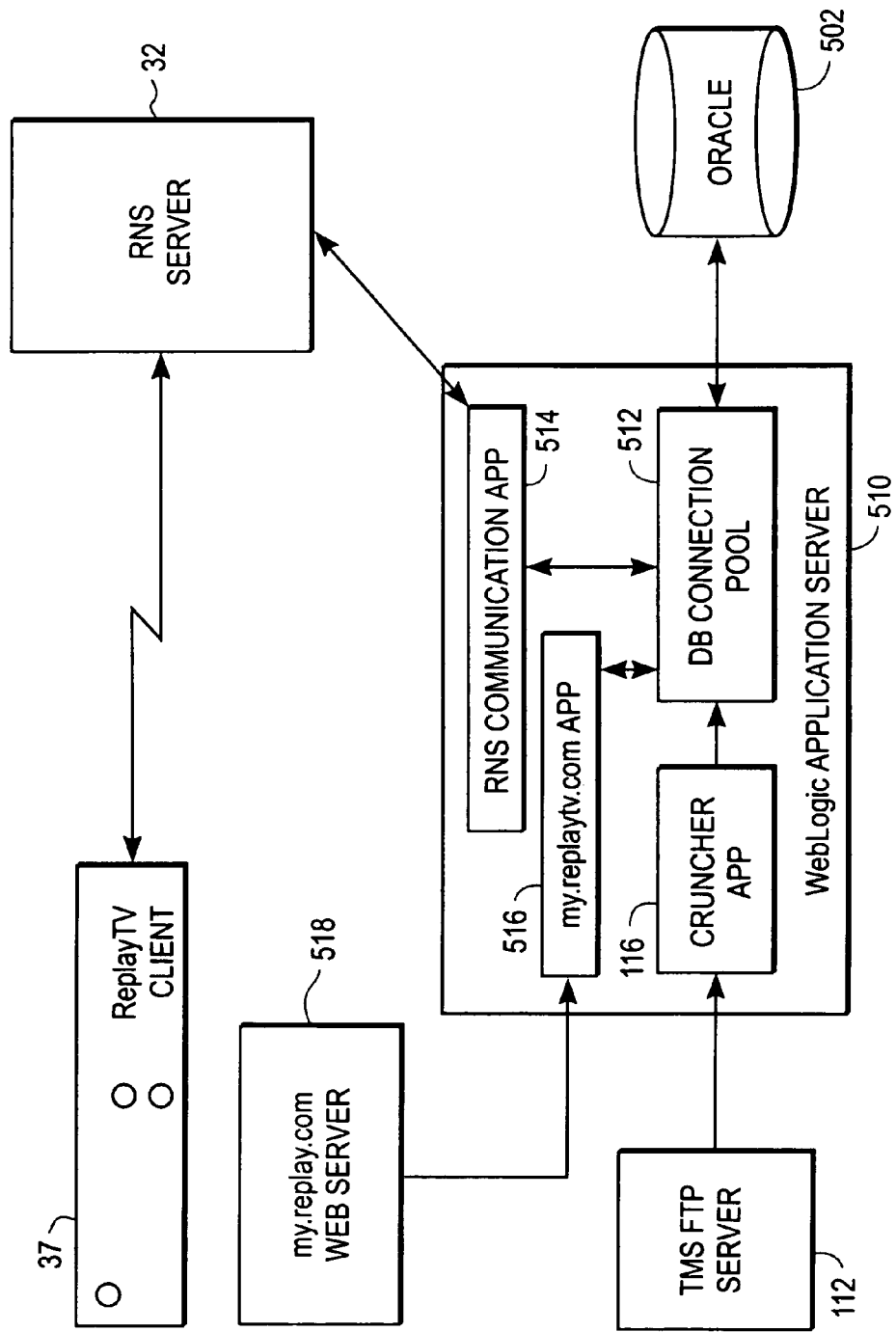
FIG. 28 is a block diagram of an alternate embodiment of the computer-based communication system of FIG. 1B.

Referring to FIG. 28, an alternative embodiment of FIG. 27 is shown, by way of example, to include a load-balanced replicated set of databases 502 and an application server. The Cruncher and Log-Mill modules are rewritten as application server modules, not standalone modules as in FIG. 9, to enable the rapid development and deployment of diverse applications. One particular implementation that is well-suited for load-balancing includes a WebLogic Application server 510 provided by BEA Systems, and which may be used for server 500 in FIG. 27.

As shown in FIG. 28, the WebLogic Application server 510 includes a Cruncher application 116 for extracting data from the TMS FTS server 112 and converting the extracted data into a localized format. The Cruncher application 116 is no longer a standalone module as in FIG. 9, although it functions to transmit the TMS data to a module for aggregating data into a pool 512 for storage in database 502. Furthermore, server 510 includes an application module 514 enabling communication with the RNS servers 32. Another application module 516 enables server 510 to communicate with a web servers 518. Both modules 514 and 516 are coupled to DB Connection pool 512 to provide and receive data to and from database 502.

Figure 29:
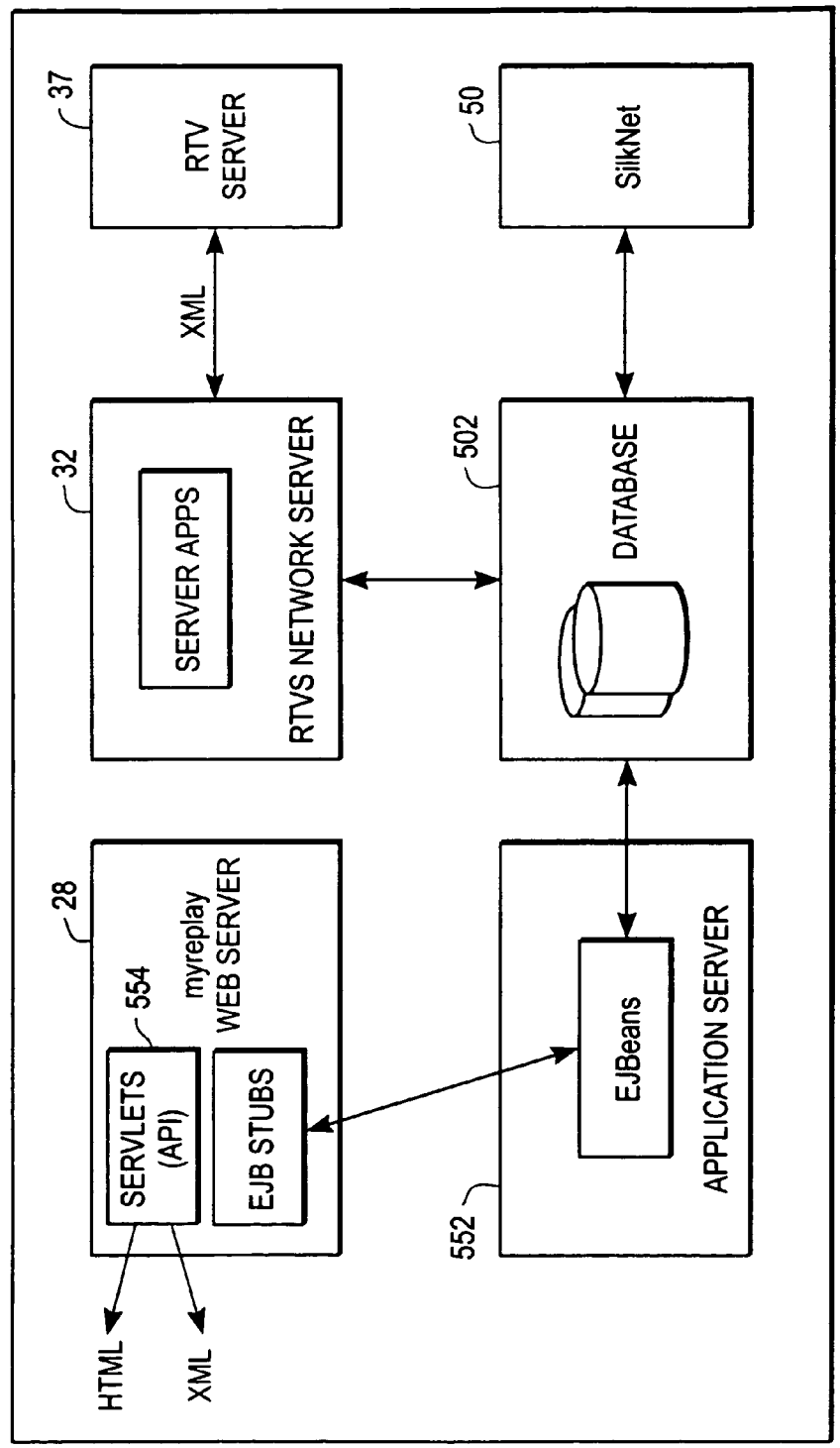
FIG. 29 is a block diagram of an alternate embodiment of the computer-based communications systems.

Reference is now made to FIG. 29 to describe another embodiment of the communications system 550, that uses the WebLogic application server 552 but in a manner different than that shown in FIG. 28. In the embodiment of FIG. 29, the WebLogic application server 552 is coupled to database 502, which in turn, is coupled to a Silknet database 50 already described herein. A portion of the network computing system 15a includes web servers 28, which are coupled to server 552. The RNS server 32 is communicatively coupled to database 502 in FIG. 29, unlike the embodiment of FIG. 28. In this embodiment of FIG. 29, communications is staged through database 502. In general, this configuration uses less server resources due to servicing only one means of accessing the database 502. In this embodiment, the database 502 is tuned to perform database functions, as opposed to processing many transactions over numerous protocols. The application server 552 effectively shields the database server from such transactional tasks. According to the particular implementation, server 552 generally includes an Enterprise Java Bean container, which facilitates the development of client and server components in an easy manner. Also, an Apache Xerces and SAX Java class libraries 554 can be used for parsing XML documents received at web servers 28.

Figure 30:
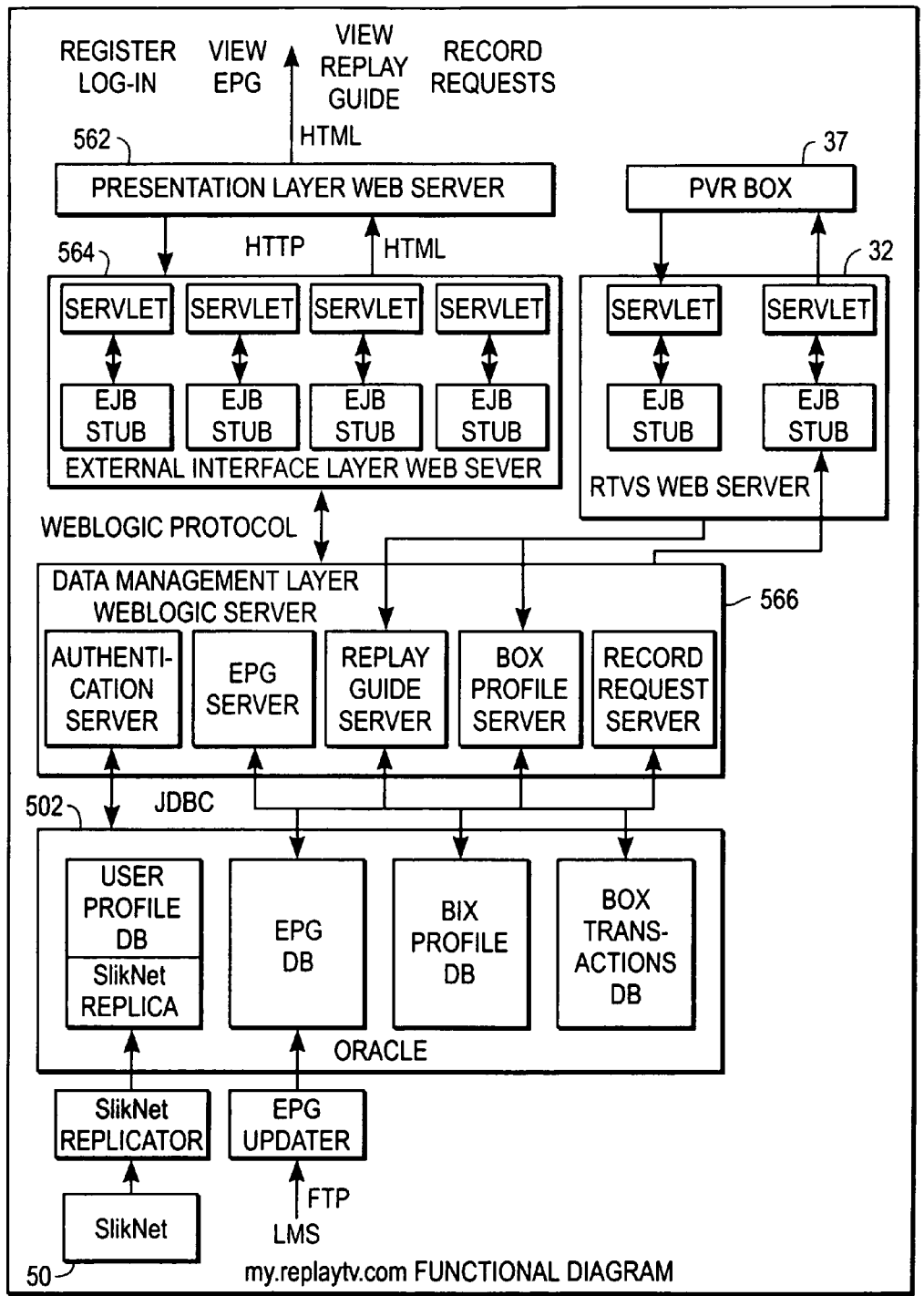
FIG. 30 is a detailed block diagram of the computer-based communications system of FIG. 28.

Turning to FIG. 30, another embodiment of the communications system 560 will now be discussed. In the embodiment of FIG. 30, a series of layers are depicted, where each layer performs a particular function in the data pipeline. Components shown in each layer communicate with its neighboring layers through well-defined interfaces. A first layer 562, referred to interchangeably as the "presentation layer 562," produces the HTML pages viewed by the user. Layer 562 receives data in XML format from a second layer 564. Layer 564 is referred to interchangeably as the "external interface layer 564." The external interface layer 564 presents an externally accessible interface to those web portals 28. To this end, layer 564 serves as an intermediary between the presentation layer 562 and a third layer 566, which is referred to interchangeably as the "data management layer 566." The data management layer 566 encapsulates all data access and management functionality. Using the Enterprise Java Beans services of the WebLogic application server, layer 566 handles the connection pools to databases 502, 50, manages transactions, manages server component lifecycles, and provides another layer of load-balancing, if necessary.

Figure 31:
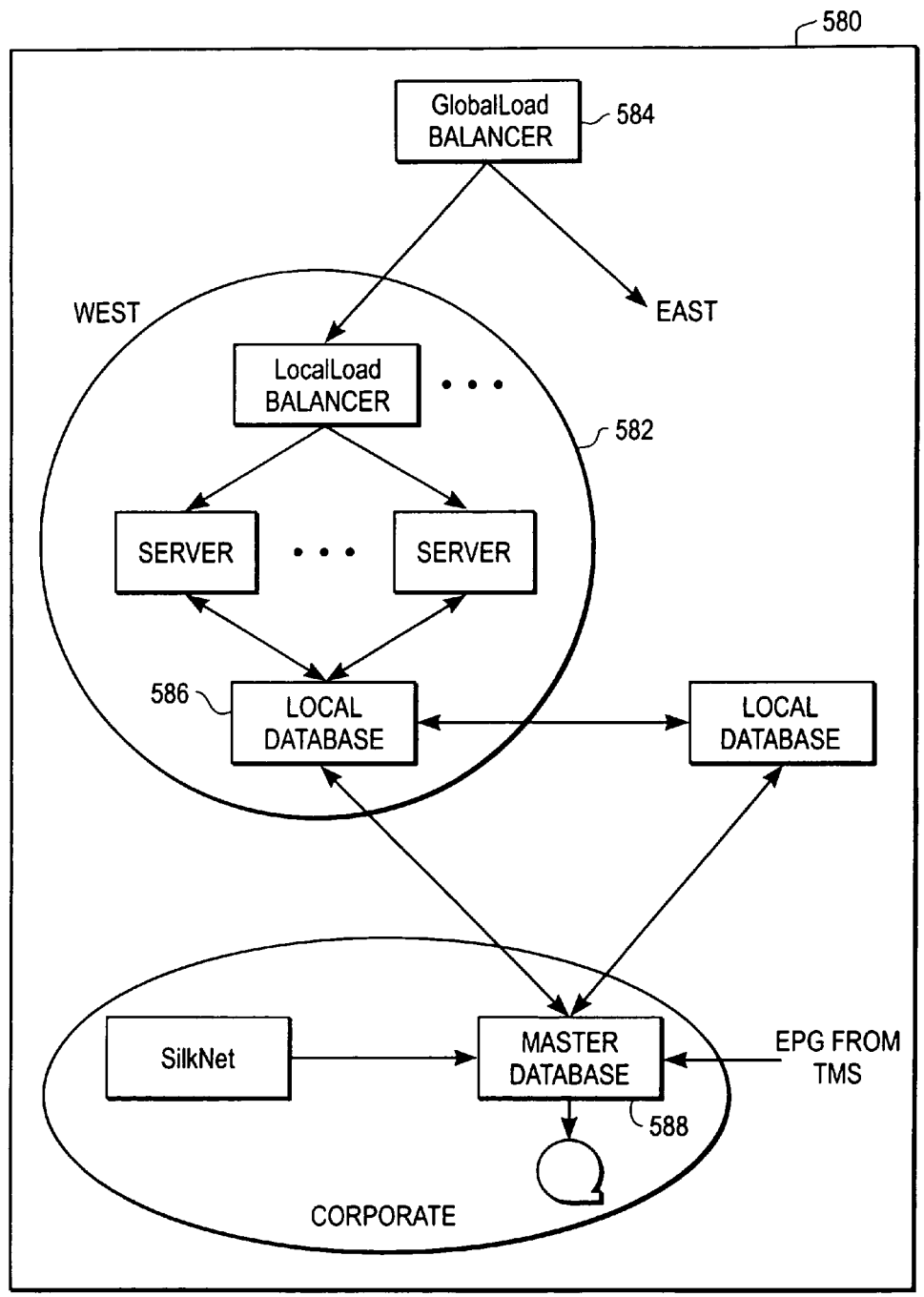
FIG. 31 is high-level block diagram of a distributed architecture for a load-balanced computer-based communications system.

Referring to FIG. 31, the computer-based communication systems described herein can be designed to provide a high degree of fault tolerance and scalability. As shown in FIG. 31, a network infrastructure 580 operates with multiple network centers (or pods) 582 and a global load balancer 584, which directs traffic to the pods. Although only one pod 582 (e.g., associated with the West Coast) is shown, it will be appreciated that other pods (e.g., on the East Coast, or elsewhere in the world) can be included, under the management and control of the global load balancer 584. To provide data management to support database needs, a local database 586 can be included in each pod. Additionally, a main database 588 (e.g., databases 120 and 126 of FIG. 2) can be located at the corporate office of the enterprise. The databases may be kept synchronized by using built-in facilities of the databases, and by local caching techniques. The main database 588 is used for archiving purposes and for communicating with external data sources like TMS, and internal data sources like SilkNet.

B. An Exemplary Method for Real-Time Processing of the Communication System

Referring back to FIG. 27, by coupling two client-server systems 15a and 17a back-to-back, communication between the client browser 20 and the media-based device 36 may be accomplished in near real-time fashion because the device 36 is no longer communicating in a periodic manner (i.e., batched) with middle tier server 500 and database 502, but is enabled to send and receive commands (e.g., HTTP) to and from servers 500, and 28-1 through 28-n.

As shown in FIG. 27, media-based device 36 communicates with the middle tier server 500, which also handles requests from external devices 28-1 through 28-n. By doing so, a request made from browser 20 would be transmitted directly to the middle tier server 500 through web servers 28, and would be provided to the media-based devices 36 on-the-fly with near real-time response.

One benefit of middle tier server 500 is that it provides real-time access to database 502 without exposing the schema in the database, along with the provision of conflict checking and other data manipulation functions. Web servers 28 do not need to directly access the database 502, but through a set of APIs on middle tier server 500. This is advantageous because the architecture of system 19A is not dependent on the schema nor the database 502. As such, the database 502 and schema may be changed while not necessarily impacting the rest of system 19A. Additional functionality, such as conflict checking, can be easily added to system 19A. For example, the additional functionality can be programmed with Java code. Media-based device 36 can also communicate directly with the database 502 through an API, and no longer have to communicate with servers 32 and 48 as in FIGS. 2 and 5. This aspect of media-based devices 36 being able to engage in real-time communications also enables them to communicate with one another. For example, devices 36 and 37 may communicate with each other through middle tier server 500. In one implementation, device 36 may want to establish an online "chat session" with or send an email to DVR 37. In general, there will be two parts of the middle tier server 576. The first part of the middle tier server 576 handles external requests (i.e., to web servers 28), and the second part of the middle tier server 500 handles requests from the media-based devices 36 and DVR 37.

Referring to the particular embodiment of FIG. 28, several technical advantages of the WebLogic application server 510 are now discussed. Server 510 is capable of providing a single method of accessing a database 502 through an API for a diverse set of clients, and that it is a mechanism for achieving high scalability for millions of clients. For convenience, like reference numerals have been used for similar components appearing in FIGS. 9 and 28. In FIG. 28, for ease of understanding the present invention, a single server 510 being representative of an Enterprise Application server is shown to be communicatively coupled to a single database 502. However, it will be appreciated by those skilled in the art that the implementation of FIG. 28 supports multiple load-balanced application servers 510 providing access to multiple mirrored databases 502.

The exemplary API routines discussed previously in detail work suitably well with this alternate embodiment with minor changes. The most important difference in this case is that the API routines are no longer required to access one or more databases, in this case database 502. Rather, the routines should be programmed to recognize the additional option of accessing the DVR 37, preferably through the RNS server 32. For example, in one implementation, the database may be configured with an "insert trigger" which notifies a networked DVR of a new request when the request is inserted. Upon receiving a function call from a web server 518, the application server 510 decides whether communication should be established with the database 502, or the DVR 37, or neither of the two if the information requested is already under storage in some storage module within the application server. Any changes required in the API routines, however, do not affect the general logical schemes according to which the routines enable the remote control of the media-based device.

Other advantages to using server 510 are discussed as follows. First, no software change is required for the media-based device 36 and DVR 37. Second, communication between the external web servers 518 and the and server 510 may be facilitated through HTTP requests, Java servlets, or Java applications employing the application modules 514 and 516. Accordingly, the RNS servers 32 will either redirect HTTP requests directly to server 510 or will utilize Java servlets to perform the required communication with server 518. Third, the RNS servers 32 no longer need to maintain the large collection of files which are mirrored across the RNS servers 32 as in the embodiment of FIGS. 2 and 5. Instead, with the alternate embodiment shown in FIG. 28, all of the data requested and provided by the device 36 and DVR 37 are brokered by the RNS servers 32 to the server 510. Fourth, since all data is stored on database 502, the Cruncher application 116 running on server 510 no longer needs to process and to distribute the files amongst the RNS servers 32. With the embodiment of FIG. 28, the Cruncher application 116 retrieves EPG data from the TMS server 112, constructs the Channel Guide using the retrieved EPG data and stores the constructed Channel Guide in database 502. Fifth, multiple applications can be developed to access the data stored in database 502, using server 510 as a single point of access thereto. This not only improves scalability and security, but also the ability to easily and rapidly develop new applications for the media-based devices 36 and DVR 37.

By contrast with the embodiment shown in FIGS. 2 and 5, the web servers 518 no longer need to communicate with the Tomcat server, but to a WebLogic server 510 in order to load-balance the API. Additionally, these embodiments are beneficial for providing system redundancy, that is, in the event that one or more servers becomes inoperative or that congestion arises with a particular server. Accordingly, HTTP requests from web servers 518 and from media-based devices 36 would be directed to the WebLogic server 510, which would then disperse the request accordingly.

Although the invention has been described in considerable detail with reference to certain embodiments, other embodiments are possible. As will be understood by those of skill in the art, the invention may be embodied in other specific forms without departing from the essential characteristics thereof. Accordingly, the present invention is intended to embrace all such alternatives, modifications and variations as fall within the spirit and scope of the appended claims and equivalents.

What is claimed is:

1. A method of programming a media-based device over a network, the method comprising:
   receiving, at a data integration system, a first request for information about a first broadcast program and a second request for recording a second broadcast program at a media-based device;
   sending a first response to the first request from the data integration system, the first response comprising the information for the first broadcast program;
   in response to the second request, storing the second request in a database of the data integration system;
   receiving a query for pending transactions for a plurality of media-based devices at the database, wherein the plurality of media-based devices includes the media-based device, wherein the query is part of a series of queries sent to the data base, and wherein at least some queries in the series of queries are sent at regular intervals in time; and
   in response to the query for pending transactions, sending a list of pending transactions that includes the second request from the database to at least program the media-based device to record the second broadcast program.

2. The method according to claim 1, wherein the second request comprises a unit serial number for the media-based device.

3. The method according to claim 1, wherein receiving the first request for information about the first broadcast program and the second request for recording the second broadcast program comprises receiving the second request in response to selection of a link, and wherein the selection of the link utilizes one click on the link.

4. The method according to claim 3, further comprising:
   allowing a second website to monitor a count of a number of times the link is selected; and
   enabling periodically collection of revenue based on the count.

5. The method according to claim 4, wherein the revenue comprises a percentage of advertising revenue associated with the information about the broadcast program.

6. The method according to claim 1, wherein the media-based device comprises a video replay system.

7. The method according to claim 1, wherein receiving the first request for information about the first broadcast program and the second request for recording the second broadcast program comprises:
   identifying a user associated with the first request and the second request; and authenticating the user.

8. The method according to claim 7, wherein identifying the user associated with the first request and the second request comprises:
   identifying a cookie associated with the user; and
   enabling the cookie to be forwarded to the media-based device.

9. The method according to claim 8, wherein the cookie is extracted from a client.

10. The method according to claim 8, wherein the cookie is extracted from a computer hosting a first website.

11. The method according to claim 7, wherein identifying the user associated with the first request and the second request comprises:
    prompting for identification data.

12. The method according to claim 7, wherein identifying the user associated with the first request and the second request comprises:
    enabling determination of partner identification information.

13. The method according to claim 1, further comprising:
    processing the second request so to record the second broadcast program.

14. The method according to claim 13, wherein processing the second request so to record the second broadcast program further comprises:
    detecting whether a previous request corresponding to the second request had been made.

15. The method according to claim 1, wherein the information about the first broadcast program comprises program guide information about the first broadcast program.

16. The method according to claim 15, wherein the first broadcast program comprises a television program.

17. The method according to claim 15, wherein the first broadcast program comprises a cable program.

18. The method according to claim 15, wherein the first broadcast program comprises a pay-per-view program.

19. The method according to claim 15, wherein the first broadcast program comprises a satellite-based program.

20. The method of claim 1, wherein in response to the query for pending transactions, at least one pending transaction is converted to an eXtended Markup Language (XML) format.

21. A data integration system comprising a database,
    wherein the data integration system is configured for:
    receiving a first request for information about a first broadcast program and a second request for recording a second broadcast program at a media-based device;
    sending a first response to the first request, the first response comprising the information for the first broadcast program;
    in response to the second request, storing the second request in the database of the data integration system;

receiving a query for pending transactions for a plurality of media-based devices at the database, wherein the plurality of media-based devices includes the media-based device, wherein the query is part of a series of queries sent to the data base, and wherein at least some queries in the series of queries are sent at regular intervals in time; and in response to the query for pending transactions, sending a list of pending transactions that includes the second request from the database to at least program the media-based device to record the second broadcast program.

22. The data integration system of claim 21, wherein the second request comprises a unit serial number for the media-based device.

23. The data integration system of claim 21, wherein receiving the first request for information about the first broadcast program and the second request for recording the second broadcast program comprises receiving the second request in response to selection of a link, and wherein the selection of the link utilizes one click on the link.

24. The data integration system of claim 23, wherein the data integration system is further configured for:

allowing a second website to monitor a count of a number of times the link is selected; and enabling periodically collection of revenue based on the count.

25. The data integration system of claim 24, wherein the revenue comprises a percentage of advertising revenue associated with the information about the broadcast program.

26. The data integration system of claim 21, wherein receiving the first request for information about the first broadcast program and the second request for recording the second broadcast program comprises:

identifying a user associated with the first request and the second request; and authenticating the user.

27. The data integration system of claim 26, wherein identifying the user associated with the first request and the second request comprises:

identifying a cookie associated with the user; and enabling the cookie to be forwarded to the media-based device.

28. The data integration system of claim 27, wherein the cookie is extracted from a client.

29. The data integration system of claim 27, wherein the cookie is extracted from a computer hosting a first website.

30. The data integration system of claim 26, wherein identifying the user associated with the first request and the second request comprises:

prompting for identification data.

31. The data integration system of claim 26, wherein identifying the user associated with the first request and the second request comprises:

enabling determination of partner identification information.

32. The data integration system of claim 21, wherein the data integration system is further configured for:

processing the second request so to record the second broadcast program.

33. The data integration system of claim 32, wherein processing the second request so to record the second broadcast program further comprises:

detecting whether a previous request corresponding to the second request had been made.

34. The data integration system of claim 21, wherein the information about the first broadcast program comprises program guide information about the first broadcast program.

35. The data integration system of claim 34, wherein the first broadcast program comprises a television program.

36. The data integration system of claim 34, wherein the first broadcast program comprises a cable program.

37. The data integration system of claim 34, wherein the first broadcast program comprises a pay-per-view program.

38. The data integration system of claim 34, wherein the first broadcast program comprises a satellite-based program.

39. The data integration system of claim 21, wherein in response to the query for pending transactions, at least one pending transaction is converted to an eXtended Markup Language (XML) format.

40. An apparatus, comprising:

a processor, and a non-transitory computer readable medium storing at least a program product that activates the apparatus to perform operations comprising:

receiving a first request for information about a first broadcast program and a second request for recording a second broadcast program at a media-based device;

sending a first response to the first request from the data integration system, the first response comprising the information for the first broadcast program; in response to the second request, storing the second request;

receiving a query for pending transactions for a plurality of media-based devices at the database, wherein the plurality of media-based devices includes the media-based device, wherein the query is part of a series of queries sent to the data base, and wherein at least some queries in the series of queries are sent at regular intervals in time; and in response to the query for pending transactions, sending a list of pending transactions that includes the second request to at least program the media-based device to record the second broadcast program.

41. The apparatus of claim 40, wherein in response to the query for pending transactions, at least one pending transaction is converted to an eXtended Markup Language (XML) format.

42. The apparatus of claim 40, wherein the media-based device comprises a digital video recorder.

43. The apparatus of claim 40, wherein the second request comprises a unit serial number for the media-based device.

44. The apparatus of claim 40, wherein receiving the first request for information about the first broadcast program and the second request for recording the second broadcast program comprises receiving the second request in response to selection of a link, and wherein the selection of the link utilizes one click on the link.

\* \* \* \* \*